US012568621B2

(12) United States Patent
Kim et al.

(10) Patent No.: US 12,568,621 B2
(45) Date of Patent: Mar. 3, 2026

(54) MEMORY APPARATUS AND METHODS INCLUDING MERGED PROCESS FOR MEMORY CELL PILLAR AND SOURCE STRUCTURE

(71) Applicant: Micron Technology, Inc., Boise, ID (US)

(72) Inventors: Byeung Chul Kim, Boise, ID (US); Joshua Wolanyk, Boise, ID (US); Richard J. Hill, Boise, ID (US); Damir Fazil, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 775 days.

(21) Appl. No.: 17/726,968

(22) Filed: Apr. 22, 2022

(65) Prior Publication Data

US 2023/0345722 A1     Oct. 26, 2023

(51) Int. Cl.
| | |
|---|---|
| *H10B 43/27* | (2023.01) |
| *H01L 23/535* | (2006.01) |
| *H10B 41/27* | (2023.01) |
| *H10B 41/41* | (2023.01) |
| *H10B 43/40* | (2023.01) |

(52) U.S. Cl.
CPC .......... *H10B 43/27* (2023.02); *H01L 23/535* (2013.01); *H10B 41/27* (2023.02); *H10B 41/41* (2023.02); *H10B 43/40* (2023.02)

(58) Field of Classification Search
None
See application file for complete search history.

(56) References Cited

U.S. PATENT DOCUMENTS

| | | | | |
|---|---|---|---|---|
| 10,290,650 B1 * | 5/2019 | Iwai | ................... | H10D 30/0413 |
| 2017/0062454 A1 * | 3/2017 | Lu | ........................ | H01L 29/7926 |
| 2018/0374866 A1 * | 12/2018 | Makala | .................. | H10B 43/27 |
| 2022/0246636 A1 * | 8/2022 | Tobioka | ................ | H10B 43/35 |

* cited by examiner

*Primary Examiner* — Yara B Green
*Assistant Examiner* — Fakeha Sehar
(74) *Attorney, Agent, or Firm* — Schwegman Lundberg & Woessner, P.A.

(57) ABSTRACT

Some embodiments include apparatuses and methods of forming the apparatuses. One of the methods includes forming levels of materials one over another; forming a first opening and a second opening in the levels of materials; forming at least one dielectric material in the first and second openings; forming tiers of materials over the levels of materials and over the dielectric material in the first and second openings; forming a first pillar of a memory cell string, the first pillar extending through the tiers of materials and extending partially into a location of the first opening; and forming a second pillar of a contact structure, the second pillar extending through the tiers of materials and through a location of the second opening.

15 Claims, 39 Drawing Sheets

200

200

200

200

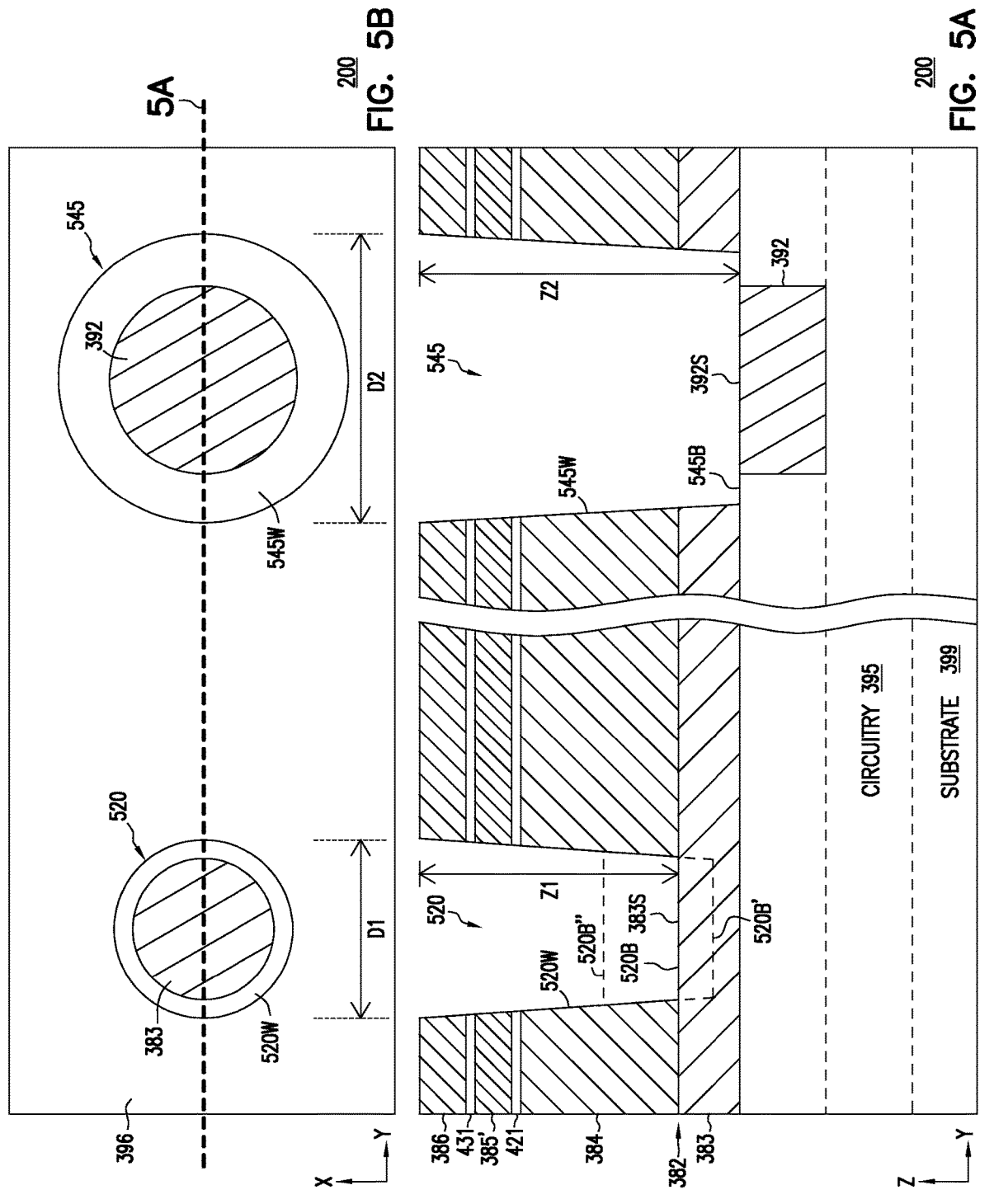

MEMORY APPARATUS AND METHODS INCLUDING MERGED PROCESS FOR MEMORY CELL PILLAR AND SOURCE STRUCTURE

FIELD

Embodiments described herein relate to memory devices including memory cell pillars, contact pillars, source line structure, and connection between the source line structure and the memory cell pillars.

BACKGROUND

Some conventional memory devices (e.g., 3-D NAND memory devices) have memory cells arranged vertically in respective memory cell strings. The memory cell strings have respective memory cell pillars for electrical communication between memory cells of the memory cell strings and other circuitry of the memory device including a conductive structure (e.g., source line structure) underlying the memory cell strings. Some of these conventional memory devices also have contact pillars, which are part of conductive paths between circuitry and other components of the memory device. In some conventional processes, different process steps are used to form part of the memory cell pillars, the contact pillars, and connections between the memory cell pillars and the underlying conductive structure. However, such conventional processes can impact the structure of the memory cell pillars and increase manufacturing cost.

BRIEF DESCRIPTION OF THE DRAWINGS

FIG. 4A through FIG. 22C show different views of structures during processes of forming the memory device of FIG. 2 through FIG. 3I, according to some embodiments described herein.

DETAILED DESCRIPTION

The techniques described herein involve a memory device having memory cell pillars, contact pillars, and an underlying conductive structure (e.g., source structure). As mentioned above and discussed in more detail below, some conventional processes may use different process steps (at different times) to form part of the memory cell pillars, contact pillars, and connections between the memory cell pillars and the underlying conductive structure. Such conventional processes can impact the etch profile for the structure of the memory cell pillar and increase manufacturing cost. As described in more detail below, the processes described herein include merging (e.g., combining) some of the process steps for formed structures at different locations in the source structure. For example, some processes can be performed to concurrently (e.g., simultaneously) form some structures at different locations (e.g., at memory array region and peripheral region) in the source structure where memory cell pillars and contact pillars, respectively, are subsequently formed. The described processes can improve the structure of part of the memory device including the etch profile and the structure of the described memory cell pillars. The described processes can also reduce manufacturing cost. Other improvements and benefits of the described processes and memory devices are further discussed below with reference to FIG. 1 through FIG. 30.

Figure 1:
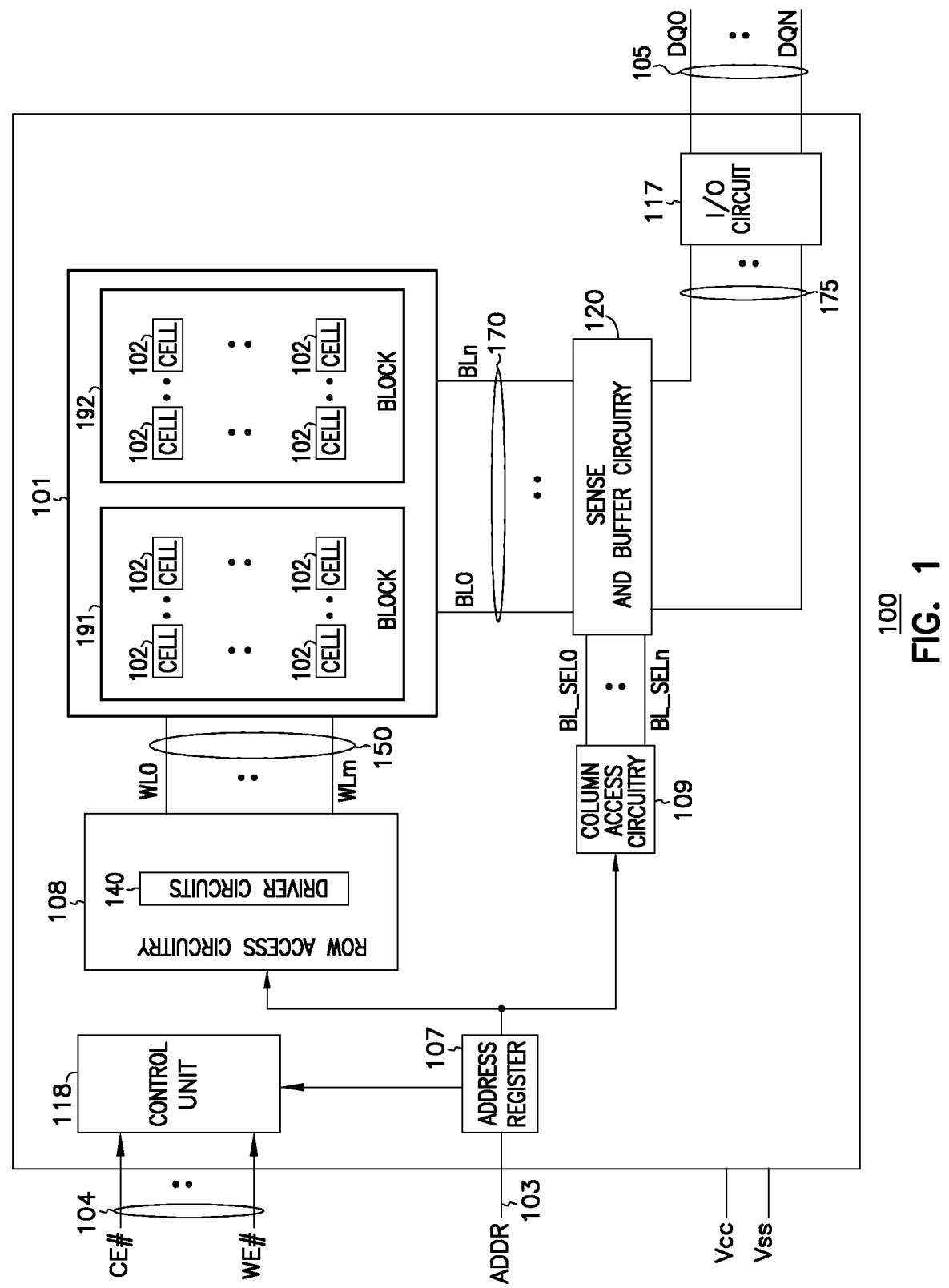
FIG. 1 shows an apparatus in the form of a memory device, according to some embodiments described herein.

FIG. 1 shows an apparatus in the form of a memory device 100, according to some embodiments described herein. Memory device 100 can include a memory array (or multiple memory arrays) 101 containing memory cells 102 arranged in blocks (blocks of memory cells), such as blocks 191 and 192. In the physical structure of memory device 100, memory cells 102 can be arranged vertically (e.g., stacked one over another) over a substrate (e.g., a semiconductor substrate) of memory device 100. FIG. 1 shows memory device 100 having two blocks 191 and 192 as an example. Memory device 100 can have more than two blocks.

As shown in FIG. 1, memory device 100 can include access lines 150 and data lines 170. Access lines 150 can include word lines, which can include global word lines and local word lines (e.g., control gates). Data lines 170 can include bit lines (e.g., local bit lines). Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 of blocks 191 and 192 and data lines 170 to selectively exchange information (e.g., data) with memory cells 102.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which blocks 191 and 192 are to be accessed during a memory operation. Memory device 100 can include drivers (driver circuits) 140, which can be part of row access circuitry 108. Drivers 140 can operate (e.g., operate as switches) to form (or not to form) conductive paths (e.g., current paths) between nodes providing voltages and respective access lines 150 during operations of memory device 100.

Memory device 100 can perform a read operation to read (e.g., sense) information (e.g., previously stored information) from memory cells 102 of blocks 191 and 192, or a write (e.g., programming) operation to store (e.g., program) information in memory cells 102 of blocks 191 and 192. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks 191 and 192.

Memory device 100 can include a control unit 118 that can be configured to control memory operations of memory device 100 based on control signals on lines 104. Examples of the control signals on lines 104 include one or more clock signals and other signals (e.g., a chip-enable signal CE #, a write-enable signal WE #) to indicate which operation (e.g., read, write, or erase operation) memory device 100 can perform. Other devices external to memory device 100 (e.g., a memory controller or a processor) may control the values of the control signals on lines 104. Specific values of a combination of the signals on lines 104 may produce a command (e.g., read, write, or erase command) that may cause memory device 100 to perform a corresponding memory operation (e.g., read, write, or erase operation).

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks 191 and 192 and provide the value of the information to lines 175, which can include global data lines (e.g., global bit lines). Sense and buffer circuitry 120 can also be configured to use signals on lines 175 to determine the value of information to be stored (e.g., programmed) in memory cells 102 of blocks 190 and 191 (e.g., during a write operation) based on the values (e.g., voltage values) of signals on lines 175 (e.g., during a write operation).

Memory device 100 can include input/output (I/O) circuitry 117 to exchange information between memory cells 102 of blocks 191 and 192 and lines (e.g., I/O lines) 105. Signals DQ0 through DQN on lines 105 can represent information read from or stored in memory cells 102 of blocks 191 and 192. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3-dimensional (3-D) NAND) or a NOR flash memory device, or another kind of memory device, such as a variable resistance memory device (e.g., a phase change memory device or a resistive Random-Access Memory (RAM) device.

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 28.

Figure 2:
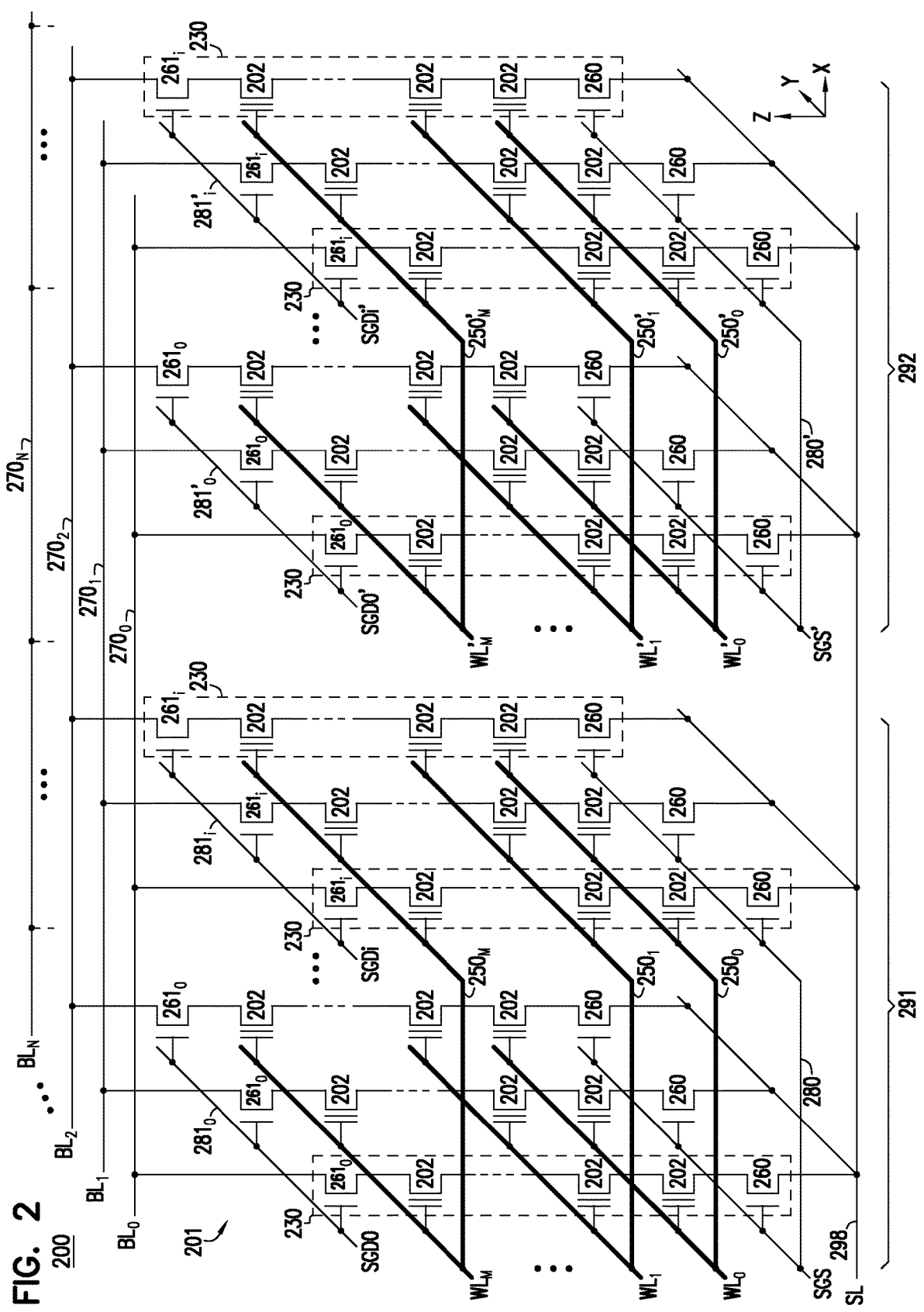
FIG. 2 shows a schematic of an apparatus in the form a memory device having a memory array and memory cell blocks, according to some embodiments described herein.

FIG. 2 shows a schematic of an apparatus in the form of a memory device 200 having a memory array 201 and blocks (e.g., memory cell blocks) 291 and 292, according to some embodiments described herein. Memory device 200 can include a non-volatile (e.g., NAND flash memory device) or other types of memory devices. Memory device 200 can correspond to memory device 100. For example, memory array (or multiple memory arrays) 201 and blocks 291 and 292 can correspond to memory array 101 and blocks 191 and 192, respectively, of memory device 100 of FIG. 1.

As shown in FIG. 2, memory device 200 can include memory cells 202, data lines $270_0$ through $270_N$ ($270_0$-$270_N$), control gates $250_0$ through $250_M$ in block 291, and control gates $250'_0$ through $250'_M$ in block 292. Data lines $270_0$-$270_N$ can correspond to part of data lines 170 of memory device 100 of FIG. 1. In FIG. 2, label "N" (index N) next to a number (e.g., $270_N$) represents the number of data lines of memory device 200. For example, if memory device 200 includes 16 data lines, then N is 15 (data lines $270_0$ through $270_{15}$). In FIG. 2, label "M" (index M) next to a number (e.g., $250_M$) represents the number of control gates of memory device 200. For example, if memory device 200 includes 128 control gates, then M is 127 (control gates $250_0$ through $250_{127}$). Memory device 200 can have the same number of control gates (e.g., M−1 control gates) among the blocks (e.g., blocks 291 and 292) of memory device 200.

In FIG. 2, data lines $270_0$-$270_N$ can include (or can be part of) bit lines (e.g., local bit lines) of memory device 200. As shown in FIG. 2, data lines $270_0$-$270_N$ can carry signals (e.g., bit line signals) $BL_0$ through $BL_N$, respectively. In the physical structure of memory device 200, data lines $270_0$-$270_N$ can be structured as conductive lines and have respective lengths extending in the Y-direction (e.g., a direction from one memory block to another).

As shown in FIG. 2, memory cells 202 can be organized into separate blocks (memory blocks or blocks of memory cells) such as blocks 291 and 292. FIG. 2 shows memory device 200 including two blocks 291 and 292 as an example.

However, memory device 200 can include numerous blocks. The blocks (e.g., blocks 291 and 292) of memory device 200 can share data lines (e.g., data lines $270_0$-$270_N$) to carry information (in the form of signals) read from or to be stored in memory cells of selected memory cells (e.g., selected memory cells in block 291 or 292) of memory device 200.

Control gates $250_0$-$250_M$ in block 291 can be part of local word lines, which can be part of (or can be coupled to) access lines (e.g., global word lines) of memory device 200 that can correspond to access lines 150 of memory device 100 of FIG. 1. Control gates $250'_0$-$250'_M$ in block 292 can be another part of other local word lines, which can be part of access lines (e.g., global word lines) of memory device 200. Control gates $250_0$-$250_M$ can be electrically separated from control gates $250'_0$-$250'_M$. Thus, blocks 291 and 292 can be accessed separately (e.g., accessed one at a time). For example, block 291 can be accessed at one time using control gates $250_0$-$250_M$, and block 292 can be accessed at another time using control gates $250'_0$-$250'_M$ at another time.

FIG. 2 shows directions X, Y, and Z that can be relative to the physical directions (e.g., dimensions) of the structure of memory device 200. For example, the Z-direction can be a direction perpendicular to (e.g., vertical direction with respect to) a substrate of memory device 200 (e.g., a substrate 399 shown in FIG. 3C). The Z-direction is perpendicular to the X-direction and Y-direction (e.g., the Z-direction is perpendicular to an X-Y plane of memory device 200). In the physical structure of memory device 200, control gates $250_0$-$250_M$ can be formed on different levels (e.g., layers) of memory device 200 in the Z-direction. In this example, the levels (e.g., layers) of control gates $250_0$-$250_M$ can be formed (e.g., stacked) one level (one layer of material) over another (another layer of material) in the Z-direction.

As shown in FIG. 2, memory cells 202 can be included in respective memory cell strings 230 in each of the blocks (e.g., blocks 291 and 292) of memory device 200. Each of memory cell strings 230 can have series-connected memory cells (e.g., M+1 (e.g., 128) series-connected memory cells) in the Z-direction. In a physical structure of memory device 200, memory cells 202 in each of memory cell strings 230 can be formed (e.g., stacked vertically one over another) in different levels (e.g., M+1 (e.g., 128) layers in the example of FIG. 2) in the Z-direction of memory device 200. The number of memory cells in each of memory cell strings 230 can be equal to the number of levels (e.g., layers) of control gates (e.g., control gates $250_0$-$250_M$) of memory device 200. For example, if each memory cell string 230 has 128 (e.g., M=127) memory cells 202, then there are 128 corresponding levels of control gates $250_0$-$250_M$ for the 128 memory cells.

As shown in FIG. 2, control gates $250_0$-$250_M$ can carry corresponding signals $WL_0$-$WL_M$. As mentioned above, control gates $250_0$-$250_M$ can include (or can be parts of) access lines (e.g., word lines) of memory device 200. Each of control gates $250_0$-$250_M$ can be part of a structure (e.g., a level) of a conductive material (e.g., a layer of conductive material) located in a level of memory device 200. Memory device 200 can use signals $WL_0$-$WL_M$ to selectively control access to memory cells 202 of block 291 during an operation (e.g., read, write, or erase operation). For example, during a read operation, memory device 200 can use signals $WL_0$-$WL_M$ to control access to memory cells 202 of block 291 to read (e.g., sense) information (e.g., previously stored information) from memory cells 202 of block 291. In another example, during a write operation, memory device 200 can use signals $WL_0$-$WL_M$ to control access to memory cells 202 of block 291 to store information in memory cells 202 of block 291.

Like control gates $250_0$-$250_M$ in block 291, control gates $250'_0$-$250'_M$ in block 292 can carry corresponding signals $WL'_0$-$WL'_M$. Each of control gates $250'_0$-$250'_M$ can be part of a structure (e.g., a level) of a conductive material (e.g., a layer of conductive material) located in a single level of memory device 200. Control gates $250'_0$-$250'_M$ can be located in the same levels (in the Z-direction) as control gates $250_0$-$250_M$, respectively. As mentioned above, control gates $250'_0$-$250'_M$ (e.g., local word lines) can be electrically separated from control gates $250_0$-$250_M$ (e.g., other local word lines).

Memory device 200 can use signals $WL'_0$-$WL'_M$ to control access to memory cells 202, respectively, of block 292 during an operation (e.g., read, write, or erase operation). For example, during a read operation, memory device 200 can use signals $WL'_0$-$WL'_M$ to control access to memory cells 202 of block 292 to read (e.g., sense) information (e.g., previously stored information) from memory cells 202 of block 292. In another example, during a write operation, memory device 200 can use signals $WL'_0$-$WL'_M$ to control access to memory cells 202 of block 292 to store information in memory cells 202 block 292.

As shown in FIG. 2, memory cells in different memory cell strings in the same block can share (e.g., can be controlled by) the same control gate in that block. For example, in block 291, memory cells 202 coupled to control gate $250_0$ can share (can be controlled by) control gate $250_0$. In another example, memory cells 202 coupled to control gate $250_1$ can share (can be controlled by) control gate $250_1$. In another example, in block 292, memory cells 202 coupled to control gate $250'_0$ can share (can be controlled by) control gate $250'_0$. In another example, memory cells 202 coupled to control gate $250'_1$ can share (can be controlled by) control gate $250'_1$.

Memory device 200 can include a source (e.g., a source line, a source plate, or a source region) 298 that can carry a signal (e.g., a source line signal) SL. Source 298 can include (e.g., can be formed from) a conductive structure (e.g., conductive region) of memory device 200. The conductive structure (details shown in FIG. 3C and FIG. 3D) of source 298 can include multiple levels (e.g., layers) of conductive materials stacked one over another over a substrate of memory device 200. Source 298 can be common conductive structure (e.g., common source plate or common source region) of block 291 and 292. Source 298 can be coupled to a ground connection (e.g., ground plate) of memory device 200. Alternatively, source 298 can be coupled to a connection (e.g., a conductive region) that is different from a ground connection.

As shown in FIG. 2, memory device 200 can include select transistors (e.g., drain select transistors) $261_0$ through $261_i$ ($261_0$-$261_i$) and select gates (e.g., drain select gates) $281_0$ through $281_i$ in block 291. Transistors $261_0$ can share the same select gate $281_0$. Transistors $261_i$ can share the same select gate $281_i$. Select gates $281_0$-$281_i$ can carry signals SGD0 through SGDi, respectively.

Transistors $261_0$-$261_i$ can be controlled (e.g., turned on or turned off) by signals SGD0-SGDi, respectively. During a memory operation (e.g., a read or write operation) of memory device 200, transistors $261_0$ and transistors $261_i$ can be turned on one group (e.g., either the group of transistors $261_0$ or the group of transistors $261_i$) at a time. Transistors $261_0$ can be turned on (e.g., by activating respective signals SGD0) to couple memory cell strings 230 of block 291 to respective data lines $270_0$-$270_N$. Transistors $261_i$ can be turned on (e.g., by activating respective signals SGDi) to couple memory cell strings 230 of block 291 to respective data lines $270_0$-$270_N$. Transistors $261_0$-$261_i$ can be turned off (e.g., by deactivating respective signals SGD0-SGDi) to decouple the memory cell strings 230 of block 291 from respective data lines $270_0$-$270_N$.

Memory device 200 can include transistors (e.g., source select transistors) 260 in block 291, each of which can be coupled between source 298 and memory cells 202 in a respective memory cell string (one of memory cell strings 230) of block 291. Memory device 200 can include a select gate (e.g., source select gate) 280. Transistors 260 in block 291 can share select gate 280. Transistors 260 in block 291 can be controlled (e.g., turned on or turned off) by the same signal, such as SGS signal (e.g., source select gate signal) provided on select gate 280. During a memory operation (e.g., a read or write operation) of memory device 200, transistors 260 in block 291 can be turned on (e.g., by activating an SGS signal) to couple the memory cell strings of block 291 to source 298. Transistors 260 in block 291 can be turned off (e.g., by deactivating the SGS signal) to decouple the memory cell strings of block 291 from source 298.

Memory device 200 can include similar elements among the blocks (e.g., blocks 291 and 292). For example, in block 292, memory device 200 can include select gates (e.g., drain select gates) $281'_0$ through $281'_i$, and transistors (e.g., drain select transistors) $261_0$-$261_i$. Transistors $261_0$ of block 292 can share the same select gate $281'_0$. Transistors $261_i$ of block 292 can share the same select gate $281'_i$. Select gates $281'_0$ through $281'_i$ can carry signals SGD0' through SGDi', respectively. Transistors $261_0$-$261_i$ of block 292 can be controlled (e.g., turned on or turned off) by signals SGD0' through SGDi', respectively. During a memory operation (e.g., a read or write operation) of memory device 200, the group of transistors $261_0$ and the group of transistors $261_i$ of block 292 can be turned on (e.g., by activating respective signals SGD0' through SGDi') one group at a time to couple respective memory cell strings of block 292 to data lines $270_0$-$270_N$. Transistors $261_0$-$261_i$ of block 292 can be turned off (e.g., by deactivating respective signals SGD0' through SGDi') to decouple the memory cell strings of block 292 from respective sets of data lines $270_0$-$270_N$.

Memory device 200 can include transistors (e.g., source select transistors) 260 in block 292, each of which can be coupled between source 298 and the memory cells in a respective memory cell string of block 292. Transistors 260 of block 292 can share the same select gate (e.g., source select gate) 280' of memory device 200. Transistors 260 of block 292 can be controlled (e.g., turned on or turned off) by the same signal, such as SGS' signal (e.g., source select gate signal) provided on select gate 280'. During a memory operation (e.g., a read or write operation) of memory device 200, transistors 260 of block 292 can be turned on (e.g., by activating an SGS' signal) to couple the memory cell strings of block 292 to source 298. Transistors 260 of block 292 can be turned off (e.g., by deactivating the SGS' signal) to decouple the memory cell strings of block 292 from source 298. FIG. 2 shows select gates 280 and 280' being electrically separated from each other as an example. Alternatively, select gates 280 and 280' can be electrically coupled to each other.

Memory device 200 includes other components, which are not shown in FIG. 2 so as not to obscure the example embodiments described herein. Some of the structures of memory device 200 are described below with reference to FIG. 3A through FIG. 28. For simplicity, detailed description of the same element among the drawings (FIG. 1 through FIG. 28) is not repeated.

Figure 3A:
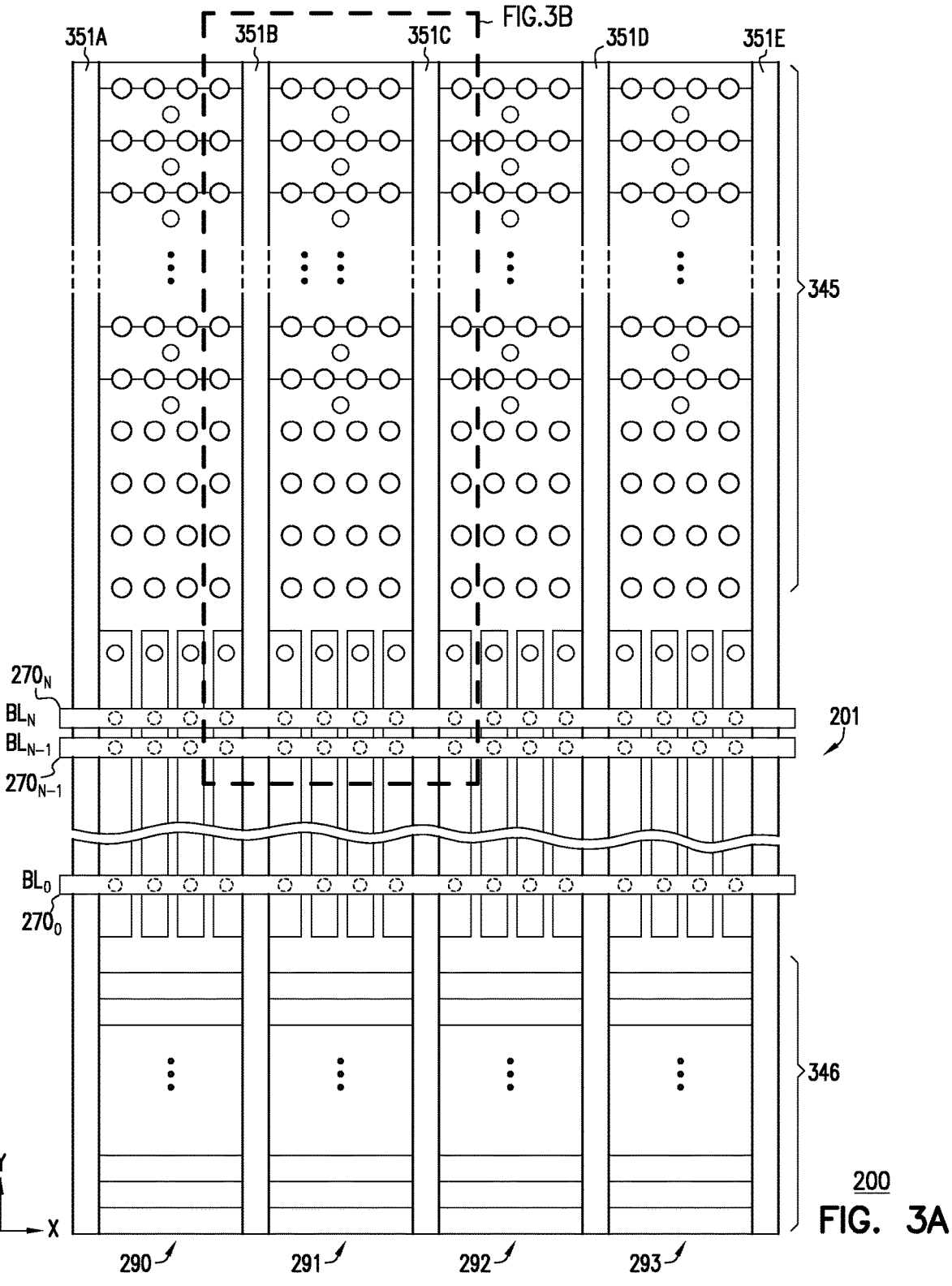
FIG. 3A shows a top view of a structure of the memory device of FIG. 2 including a memory array, staircase regions, and dielectric structures between memory cell blocks of the memory device, according to some embodiments described herein.

FIG. 3A shows a top view of a structure of memory device 200 including a memory array 201, staircase regions 345 and 346, and dielectric structures (e.g., block dividers) 351A, 351B, 351C, 351D, and 351E between respective blocks 290, 291, 292, and 293, according to some embodiments described herein. In the figures (drawings) herein, similar or the same elements of memory device 200 of FIG. 2 and other figures (e.g., FIG. 3A through FIG. 28) are given the same labels. Detailed descriptions of similar or the same elements may not be repeated from one figure to another figure. For simplicity, cross-sectional lines (e.g., hatch lines) are omitted from some or all of the elements shown in the drawings described herein. Some elements of memory device 200 may be omitted from a particular figure of the drawings so as not to obscure the view or the description of the element (or elements) being described in that particular figure. Further, the dimensions (e.g., physical structures) of the elements shown in the drawings described herein are not scaled.

As shown in FIG. 3A, blocks (blocks of memory cells) 290, 291, 292, and 293 (290-293) of memory device 200 can be located side-by-side from one block to another in the X-direction. Four blocks 290-293 are shown as an example. Memory device 200 can include numerous blocks. Blocks 291 and 292 of FIG. 3A are schematically shown and described above with reference to FIG. 2. Other blocks (e.g., block 290 and 293) of memory device 200 in FIG. 3A are not shown in FIG. 2.

In FIG. 3A, dielectric structures 351A, 351B, 351C, 351D, and 351E can be formed to divide (e.g., organize) memory device 200 into physical blocks (e.g., blocks 290-293). Dielectric structures 351A, 351B, 351C, 351D, and 351E can have lengths extending in the Y-direction. Each of dielectric structures 351A, 351B, 351C, 351D, and 351E can include (or can be formed in) a slit (not labeled) between two adjacent blocks. The slit can include (or can be) a trench having a depth in the Z-direction. The slit can have sidewalls (e.g., edges) opposing each other in the X-direction and adjacent to respective blocks. For example, dielectric structure 351B can be formed (e.g., located) in a slit between blocks 290 and 291, in which the slit can have opposing sidewalls (e.g., edges) adjacent respective blocks 290 and 291. Dielectric structure 351C can be formed in a slit between blocks 291 and 292, in which the slit can have opposing sidewalls adjacent respective blocks 291 and 292. Other dielectric structures 351A, 351D, and 315E can be located adjacent respective blocks shown in FIG. 3A.

Each of dielectric structures 351A, 351B, 351C, 351D, and 351E can include a dielectric material (or dielectric materials) formed in (e.g., filling) a respective slit. Dielectric structures 351A, 351B, 351C, 351D, and 351E can separate (e.g., physically and electrically separate) one block from another. For example, as shown in FIG. 3A, dielectric structure 351B can separate block 291 from block 290. Dielectric structure 351C can separate block 291 from block 292.

As shown in FIG. 3A, data lines $270_0$ through $270_N$ (associated with signals $BL_0$ through $BL_N$) of memory device 200 can be located over blocks 290-293 (with respect to the Z-direction). Data lines $270_0$ through $270_N$ can have respective lengths extending in the X-direction. Data lines $270_0$ through $270_N$ can extend over (e.g., on top of) and across (in the X-direction) blocks 290-293 and can be shared by blocks 290-293.

Staircase regions 345 and 346 of memory device 200 can be located on respective sides (in the Y-direction) of memory array 201 (which is located in a memory array area). Staircase regions 345 and 346 are part of memory device 200 where conductive contacts (labeled in FIG. 3B, e.g., conductive contacts $365_{SGS}$, $365_0$, $365_1$, $365_M$, $365_{M-1}$, $365_{SGD0}$, and $365_{SGDi}$) can be formed to provide electrical connections (e.g., signals) to respective select gates and control gates (e.g., shown in FIG. 2 as select gates 280, 281$_0$ and 281$_i$ and control gates 250$_0$ through 250$_M$ in block 291) in respective blocks 290, 291, 292, and 293 of memory device 200. Staircase regions 345 and 346 can be included in (or can include) peripheral region of memory device 200 that can also include other structures (e.g., contact structures 344, described below).

In FIG. 3A, staircase regions 345 and 346 can include similar structures. However, for simplicity, details of staircase region 346 are omitted from the description herein. In an alternative structure of memory device 200, staircase region 346 can be omitted from memory device 200, such that only staircase region 345 (and not both staircase regions 345 and 346) is included in memory device 200. A portion labeled "FIG. 3B" in FIG. 3A is shown in detail in FIG. 3B.

Figure 3B:
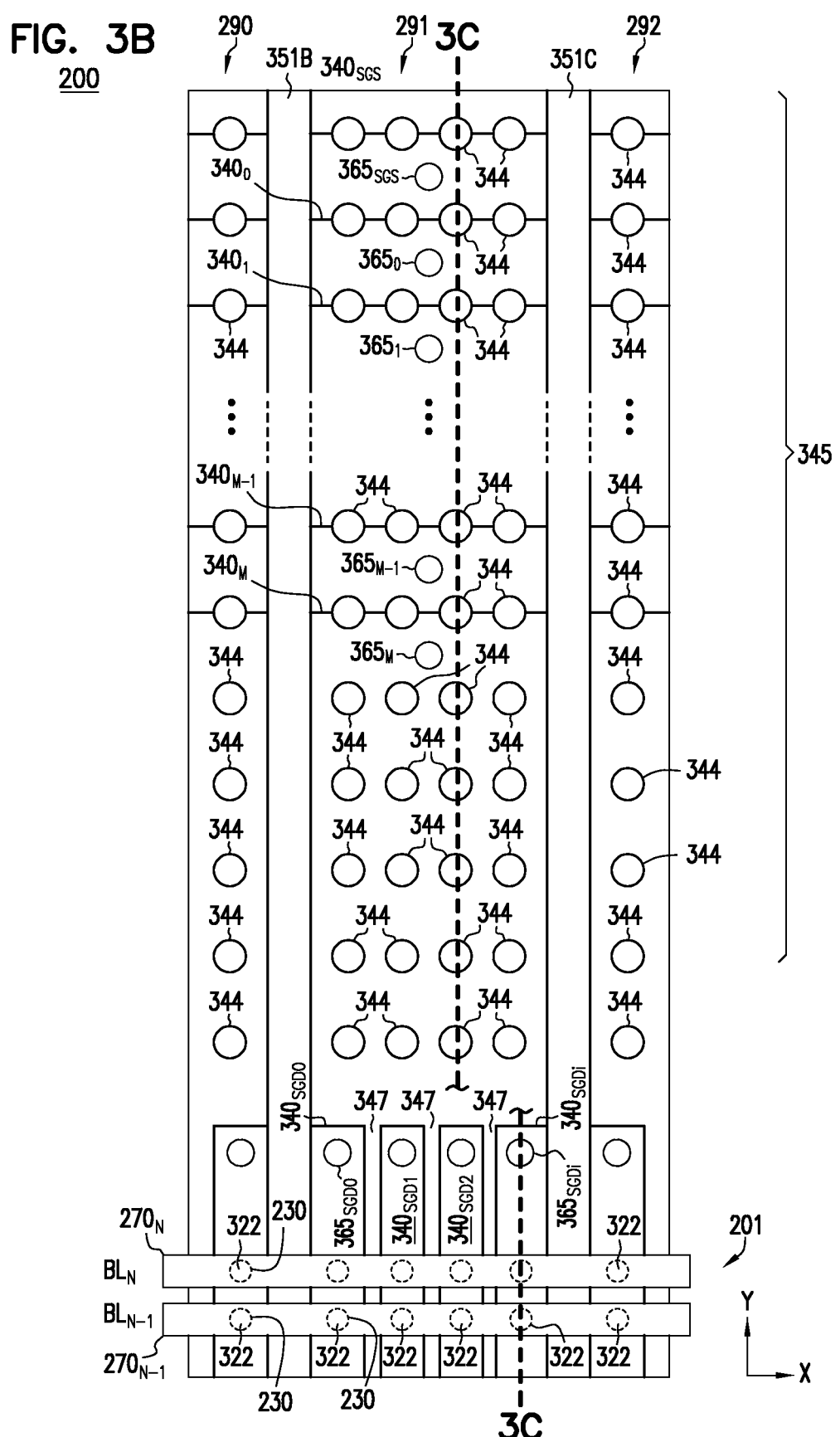
FIG. 3B shows a top view of a portion of the memory device of FIG. 3A, according to some embodiments described herein.

As shown in FIG. 3B, memory device 200 can include pillars 322 (shown in top view) in each of the blocks (e.g., block 290, 291, and 292 shown in FIG. 3B) of memory device 200. Pillars 322 are memory cell pillars, which are different from pillars of contact structures 344 of memory device 200. Pillars 322 are part of respective memory cell strings 230 (also schematically shown in FIG. 2) of memory device 200.

As shown in FIG. 3B, pillars (memory cell pillars) 322 can be located under (below) and coupled to respective data lines (only data lines $270_{N-1}$ and $270_N$ are shown). Memory cells 202 of a memory cell string can be located (e.g., can be formed vertically) long the length (shown in FIG. 3C) of a corresponding pillar 322. Pillars 322 (and associated memory cell strings) of blocks 290-293 can share data lines $270_0$ through $270_N$.

As shown in FIG. 3A and FIG. 3B, data lines $270_0$ through $270_N$ (associated with signals $BL_0$ through $BL_N$) of memory device 200 can be located over (above) pillars 322 (and over associated memory cell strings) in memory array 201. Data lines $270_0$ through $270_N$ can be coupled to respective pillars 322 (which are located under data lines $270_0$ through $270_N$ in the Z-direction).

As mentioned above, memory device 200 can include contact structures 344. As shown in FIG. 3B, contact structures 344 can be adjacent respective conductive contacts $365_{SGS}$, $365_0$, $365_1$, $365_M$, $365_{M-1}$, $365_{SGD0}$, and $365_{SGDi}$. For simplicity, FIG. 3B does not give labels for all contact structures 344 and contact structures 344 of the blocks (e.g., blocks 290, 291, and 292) in FIG. 3B. As shown in FIG. 3B (e.g., which is a top view in a direction perpendicular to the X-Y plan), conductive contacts $365_{SGS}$, $365_0$, $365_1$, $365_M$, $365_{M-1}$, $365_{SGD0}$, and $365_{SGDi}$ can have a circular shape (e.g., the boundary (e.g., cross-section) of a contact structure 344 has a circular boundary when viewed from a direction perpendicular to the X-Y plan). Contact structures 344 can also have a circular shape (e.g., the boundary (e.g., cross-section) of a contact structure has a circular boundary when viewed from a direction perpendicular to the X-Y plan).

As mentioned above, conductive contacts $365_{SGS}$, $365_0$, $365_1$, $365_M$, $365_{M-1}$, $365_{SGD0}$, and $365_{SGDi}$ in FIG. 3B can be formed to provide electrical connections (e.g., signals) to respective select gates and control gates (e.g., select gates

280, 281$_0$ and 281$_i$ and control gates 250$_0$ through 250$_M$ of FIG. 2) of memory device 200.

Contact structures 344 in FIG. 3B can be formed to provide electrical connections (e.g., to form part of respective conductive paths) between circuitry (e.g., circuitry 395 in FIG. 3C) of memory device 200 and other elements of memory device 200. For example, some of contact structures 344 can be part of conductive paths (not shown) between data lines $270_0$ through $270_N$ and circuitry 395).

As shown in FIG. 3B, memory device 200 can include conductive materials $340_{SGS}$, $340_0$, $340_1$, $340_{M-1}$, $340_M$, $340_{SGD0}$, $340_{SGD1}$ and $340_{SGD2}$ and $340_{SGDi}$ in block 291 that can form (e.g., can be materials included in) respective select gate (e.g., source select gate) 280, control gates $250_0$ through $250_M$, and select gates (e.g., drain select gates) $280_0$ and $280_i$ (FIG. 2). In FIG. 3B, conductive materials $340_{SGD0}$ and $340_{SGDi}$ can form two of the four drain select gates of block 291. Conductive materials $340_{SGD1}$ and $340_{SGD2}$ (adjacent conductive materials $340_{SGD0}$ and $340_{SGDi}$) can form the other two of the four drain select gates of block 291. The drain select gates formed by conductive materials $340_{SGD1}$ and $340_{SGD2}$ in FIG. 3B are not shown in FIG. 2.

As shown in FIG. 3B, conductive materials $340_{SGD0}$, $340_{SGD1}$, $340_{SGD2}$, and $340_{SGDi}$ (FIG. 3B) can be electrically separated from each other by a gap 347 (which can be filled with a dielectric material (or materials)). For simplicity, FIG. 3B does not give labels for other conductive materials that form respective select gates and control gates of blocks 290 and 292. Line 3C-3C in FIG. 3B shows a location of a portion (e.g., a side view (e.g., a cross-section)) of memory device 200 shown in FIG. 3C.

Figure 3C:
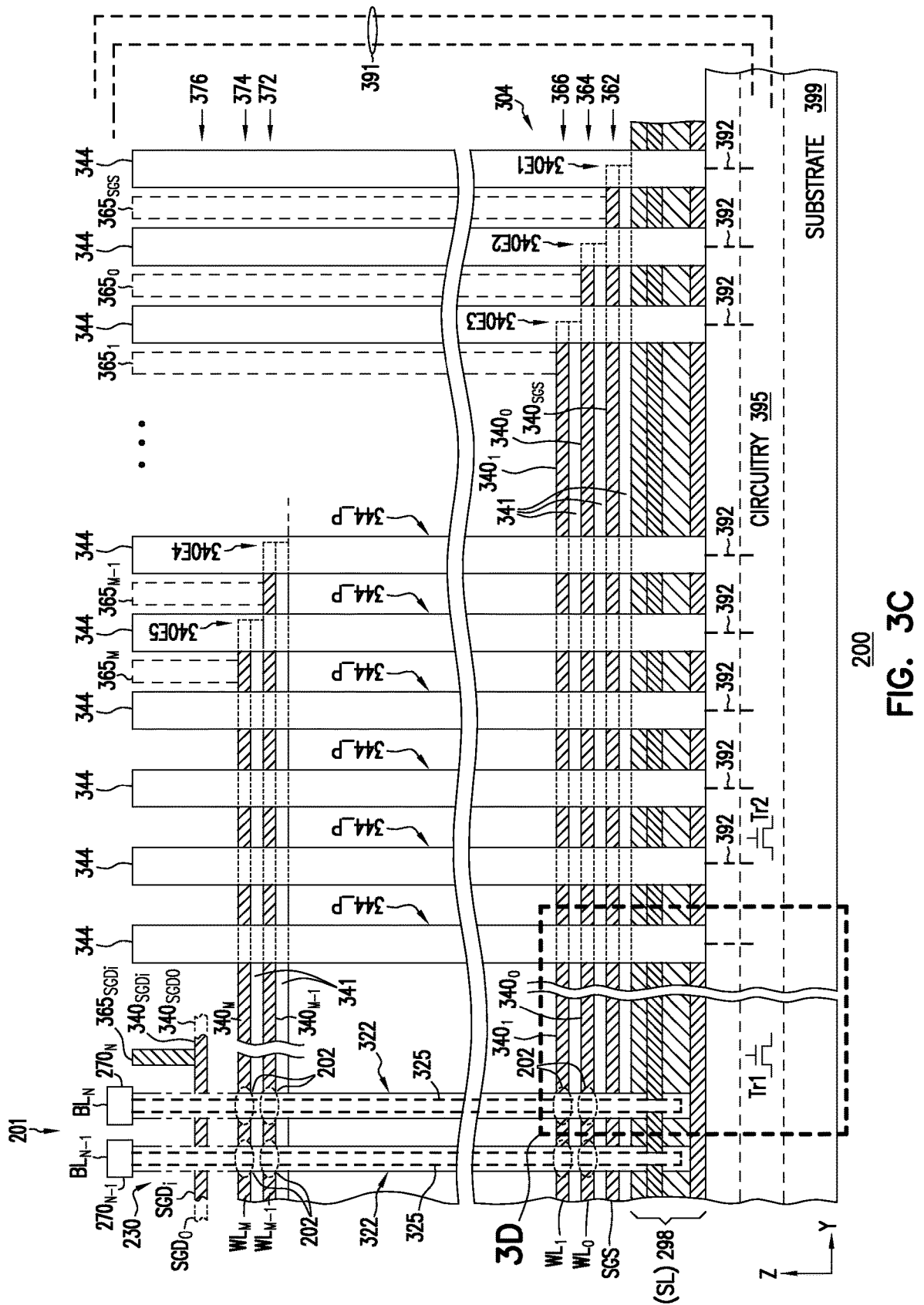
FIG. 3C shows a portion (e.g., a side view) of the memory device of FIG. 3B, according to some embodiments described herein.

As shown in FIG. 3C, memory device 200 can include levels 362, 364, 366, 372, 374, and 376 that are physical layers (e.g., portions) in the Z-direction of memory device 200. Conductive materials $340_{SGS}$, $340_0$, $340_1$, $340_{M-1}$, $340_M$, and $340_{SGDi}$ can be located (e.g., stacked) one level (e.g., one layer) over another in respective levels 362, 364, 366, 372, 374, and 376 in the Z-direction. Conductive materials $340_{SGS}$, $340_0$, $340_1$, $340_{M-1}$, $340_M$, and $340_{SGDi}$ can also be called levels of conductive materials $340_{SGS}$, $340_0$, $340_1$, $340_{M-1}$, $340_M$, and $340_{SGDi}$. As shown in FIG. 3C, conductive materials $340_{SGD0}$, $340_{SGD1}$, $340_{SGD2}$, and $340_{SGDi}$ ($340_{SGD1}$ and $340_{SGD2}$ are not shown) can be located on the same level (e.g., level 376).

As shown in FIG. 3C, conductive materials $340_{SGS}$, $340_0$, $340_1$, $340_{M-1}$, $340_M$, and $340_{SGDi}$ can interleave with dielectric materials 341 in the Z-direction. Conductive materials $340_{SGS}$, $340_0$, $340_1$, $340_{M-1}$, $340_M$, and $340_{SGDi}$ can include metal (e.g., tungsten, or other metal), other conductive materials, or a combination of conductive materials. Dielectric materials 341 can include silicon dioxide.

Signals SGS, $WL_0$, $WL_1$, $WL_{M-1}$, $WL_M$, $SGD_0$, and $SGD_i$ in FIG. 3C associated with respective conductive materials in FIG. 3C are the same signals shown in FIG. 2. Conductive material $340_{SGS}$ can form select gate 280 (associated with signal SGS) of FIG. 2. Conductive materials $340_0$, $340_1$, $340_{M-1}$, and $340_M$ can form control gates $250_0$ through $250_M$ (associated with signals $WL_0$, $WL_1$, $WL_{M-1}$, and $WL_M$, respectively) of FIG. 2. Conductive material $340_{SGD0}$ and $340_{SGDi}$ (associated with signals $SGD_0$, and $SGD_i$) can form select gates $281_0$ and $281_i$, respectively, of FIG. 2.

FIG. 3C shows an example of memory device 200 including one level of conductive materials $340_{SGS}$ that forms a select gate (e.g., source select gate associated with signal SGS). However, memory device 200 can include multiple levels (similar to level 362) of conductive materials (e.g., multiple levels of conductive material $340_{SGS}$) located under (in the Z-direction) the level of conductive materials $340_1$ (e.g., below level 364) to form multiple source select gates of memory device 200.

FIG. 3C shows an example of memory device 200 including one level (e.g., level 376) of multiple drain select gates (on the same level, formed by respective conductive materials $340_{SGD0}$ through $SGD_i$). However, memory device 200 can include multiple levels (similar to level 376) in which each of such multiple levels can include multiple drain select gates (e.g., four drain select gates in each of the multiple levels).

As shown in FIG. 3C, memory device 200 can include staircase structure 304 located in staircase region 345 (FIG. 3B shows a top view of staircase region 345). For simplicity, only a portion of staircase structure 304 is shown in FIG. 3C (e.g., a middle portion of staircase structure 304 is omitted from FIG. 3C). As shown in FIG. 3C, respective portions (e.g., end portions) of conductive materials $340_{SGS}$, $340_0$, $340_1$, $340_{M-1}$, $340_M$, and $340_{SGD1}$ and their respective edges (e.g., steps (or risers)) 340E1, 340E2, and 340E3, 340E4, and 340E5) can collectively form staircase structure 304. As shown in FIG. 3C, dielectric materials 341 can also include edges (not labeled) adjacent (e.g., aligned in the Z-direction with) respective edges 340E1 through 340E5. Thus, staircase structure 304 can also be formed in part by portions and edges of dielectric materials 341.

FIG. 3C also shows tiers of memory device 200. A tier of memory device 200 can include a level of conductive material (e.g., conductive material $340_1$) and an adjacent level of dielectric material 341 (e.g., dielectric material 341 between conductive materials $340_0$ and $340_1$). As shown in FIG. 3C, the tiers can be located (e.g., stacked) one over another in the Z-direction over substrate 399. Each tier can have respective memory cells 202 (which are located on the same level (same tier) with respect to the Z-direction) and control gates (e.g., word lines formed by conductive materials $340_0$, $340_1$, $340_{M-1}$, and $340_M$). FIG. 3C shows a few tiers of memory device 200 for simplicity. However, memory device 200 can include up to (or more than) one hundred tiers.

Other blocks (e.g., blocks 290, 292, and 293 in FIG. 3B) of memory device 200 can also have their own tiers of memory cells 202 and respective control gates (e.g., respective word lines) for the memory cells, and staircase structures similar to staircase structure 304 in block 291 in FIG. 3C. For simplicity, details of staircase structures of the other blocks (e.g., blocks 290, 292, and 293) of memory device 200 are omitted from the description herein.

As shown in FIG. 3C, memory device 200 can include a substrate 399, which can include a semiconductor (e.g., silicon) substrate. Substrate 399 can also include circuitry 395 located under other components (e.g., under memory cells 202 and source 298) of memory device 200 that are formed over substrate 399. Circuitry 395 can include circuit elements (e.g., transistors Tr1 and Tr2 shown in FIG. 3C) coupled to circuit elements outside substrate 399. For example, the circuit elements outside substrate 399 can include data lines $270_0$ through $270_N$ (shown in FIG. 3A); conductive contacts $365_{SGS}$, $365_0$, $365_1$, $365_M$, $365_{M-1}$, $365_{SGD0}$, and $365_{SGDi}$ (FIG. 3B); part of conductive paths 391 and other (not shown) conductive connections; and other circuit elements of memory device 200. The circuit elements (e.g., transistors Tr1 and Tr2) of circuitry 395 can be configured to perform part of a function of memory device 200. For example, transistors Tr1 and Tr2 can be part of decoder circuits, driver circuits, buffers, sense amplifiers, charge pumps, and other circuitry of memory device 200.

As shown in FIG. 3C, conductive paths (e.g., conductive routings) 391 can include portions extending in the Z-direction (e.g., extending vertically). Conductive paths 391 can include (e.g., can be coupled to) some of the conductive contacts (e.g., conductive contacts $365_{SGS}$, $365_1$, $365_M$, $365_{M-1}$, $365_{SGD0}$, and $365_{SGDi}$ in FIG. 3B) or all of the conductive contacts of memory device 200. As shown in FIG. 3C, conductive paths 391 can be coupled to circuitry 395. For example, at least one of conductive paths 391 can be coupled to at least of one of transistors Tr1 and Tr2 of circuitry 395.

Conductive paths 391 can provide electrical connections between elements of memory device 200. For example, conductive paths 391 can be coupled to conductive contacts $365_{SGS}$, $365_1$, $365_M$, and $365_{M-1}$ (and $365_{SGD0}$, and $365_{SGDi}$, not shown in FIG. 3C) and circuit elements (e.g., word line drivers and word line decoders, not shown) of circuitry 395 to provide electrical connections (e.g., in the form of signals SGS, $WL_0$, $WL_1$, $WL_{M-1}$, $WL_M$, $SGD_0$, and $SGD_i$) from circuit elements (e.g., word line drivers, word line decoders, and charge pumps, not shown) in circuitry 395 to conductive contacts $365_{SGS}$, $365_0$, $365_1$, $365_M$, $365_{M-1}$, $365_{SGDi}$, and $365_{SGD0}$, respectively.

As shown in FIG. 3C, conductive contacts $365_{SGS}$, $365_0$, $365_1$, $365_M$, and $365_{M-1}$ can include pillars (conductive pillars) that can have different lengths extending in the Z-direction (e.g., extending vertically (e.g., outward) from substrate 399). Each of conductive contacts $365_{SGS}$, $365_0$, $365_1$, $365_M$, and $365_{M-1}$ (including a respective pillar) can contact (e.g., land on) a respective level of a particular conductive material among conductive materials $340_{SGS}$, $340_0$, $340_1$, $340_{M-1}$, and $340_M$ to form an electrical contact with that particular conductive material. Thus, conductive contacts $365_{SGS}$, $365_0$, $365_1$, $365_M$, and $365_{M-1}$ (and $365_{SGD0}$ and $365_{SGDi}$ shown in FIG. 3B) can be part of conductive paths (e.g., part of conductive paths 391) to carry electrical signals to the select gate (e.g., source select gate associated with signal SGS), the control gates (e.g., control gates associated with signals $WL_M$ and $WL_{M-1}$) and other select gates (e.g., drain select gates associated with signals $SGD_0$ through $SGD_i$), respectively.

As shown in FIG. 3C, conductive contact $365_{SGS}$ is electrically in contact with conductive materials $340_{SGS}$ and electrically separated from the rest of conductive materials (e.g., conductive materials $340_0$, $340_1$, $340_{M-1}$, $340_M$, and $340_{SGDi}$). Conductive contact $365_0$ is electrically in contact with conductive materials $340_0$ and electrically separated from the rest of conductive materials (e.g., conductive materials $340_{SGS}$, $340_1$, $340_{M-1}$, $340_M$, and $340_{SGDi}$). Thus, a conductive contact (e.g., conductive contact $365_0$) can be electrically in contact with only one of the conductive materials among the conductive materials (e.g., conductive materials $340_{SGS}$, $340_0$, $340_1$, $340_{M-1}$, $340_M$, $340_{SGD0}$, and $340_{SGDi}$ in FIG. 3C) of memory device 200.

As shown in FIG. 3C, source 298 can include a conductive structure having (e.g., formed from) multiple levels (e.g., layers) of conductive materials stacked one over another over substrate 399. A portion 3D (in dashed line) of memory device 200 is shown in detail in FIG. 3D. As shown in FIG. 3C, portion 3D includes part of substrate 399, source 298, part of a pillar (memory cell pillar) 322 of memory cell string 230, and part of contact structure 344.

Contact structures 344 can include respective pillars (contact pillars) 344_P having lengths extending in the Z-direction (e.g., extending vertically (e.g., outward) from substrate 399). Contact structures 344 (including pillars 344_P) can have the same length. Contact structures 344 can go through a respective portion of (e.g., go through respective holes in tiers of) conductive materials $340_{SGS}$, $340_0$, $340_1$, $340_{M-1}$, and $340_M$ and dielectric materials 341. Thus, pillars 344_P of contact structures 344 can be formed in holes in the tiers of memory device 200. Contact structures 344 are electrically separated from conductive materials $340_{SGS}$, $340_0$, $340_1$, $340_{M-1}$, and $340_M$. Contact structures 344 (which include pillars 344_P) are also electrically separated from source 298.

Contact structures 344 can be coupled to (e.g., electrically coupled to) elements (e.g., transistors Tr1 and Tr2) of circuitry 395 through respective conductive portions (e.g., conductive regions) 392. For simplicity, conductive regions 392 are symbolically shown in FIG. 3C as dashed lines. However, each conductive region 392 can include a conductive material (e.g., a conductive region (e.g., tungsten or other metals)). Conductive region 392 can be coupled to (or can be part of) conductive paths 391.

Figure 3D:
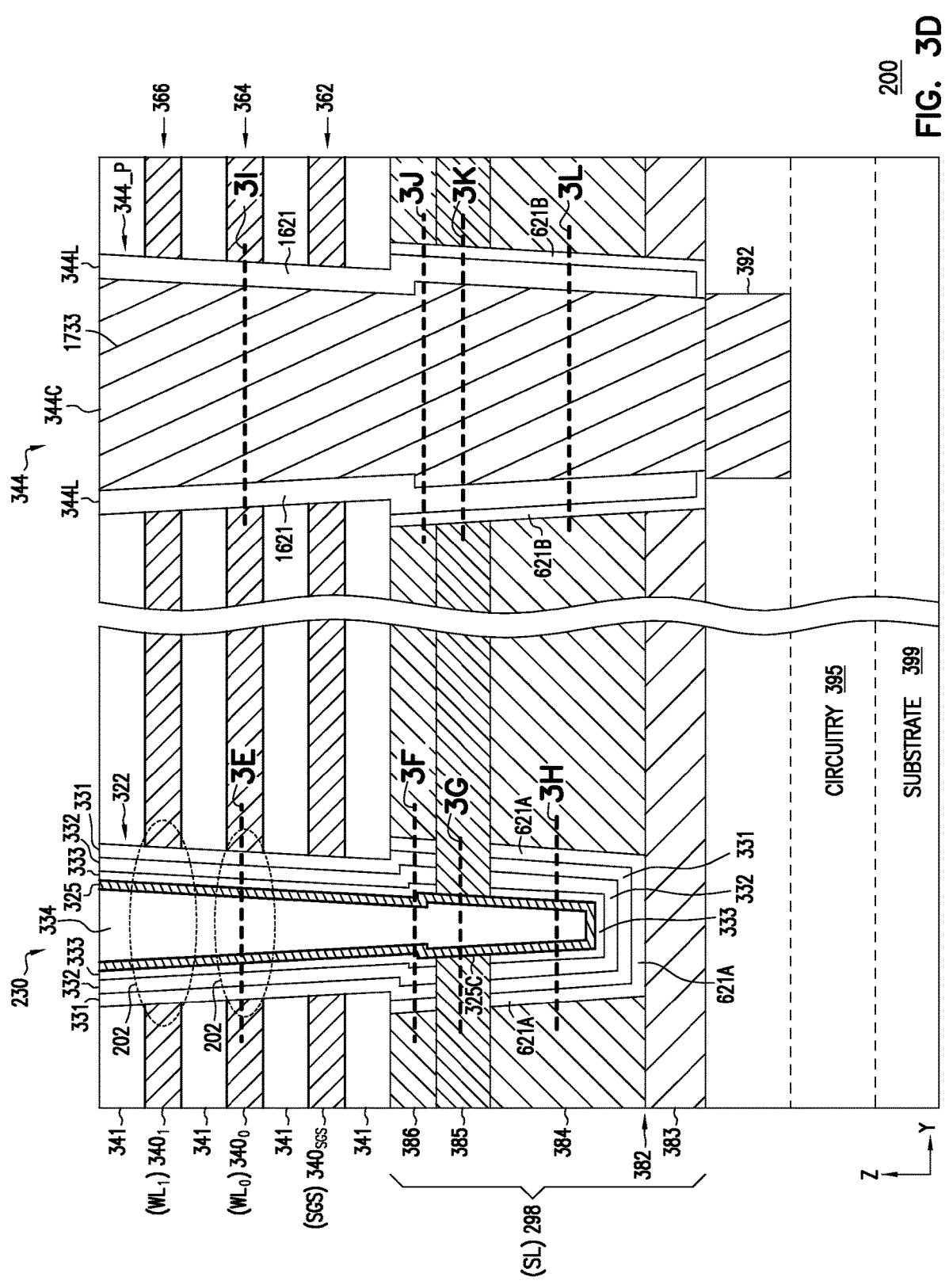
FIG. 3D show detail of a portion of the memory device of FIG. 3C, according to some embodiments described herein.

FIG. 3D shows detail of portion 3D of memory device 200 of FIG. 3C. As shown in FIG. 3D, source 298 can include a conductive structure, which includes conductive materials 383, 384, 385, and 386, which are levels (e.g., layers) of conductive materials stacked one over another over substrate 399. As shown in FIG. 3D, source 298 (which includes conductive materials 383, 384, 385, and 386) is an underlying conductive structure located under memory cells 202.

Conductive material 383 can include metals, alloys, or other conductive material. For example, conductive material 383 can include tungsten or a combination of tungsten with one additional element or with more than one additional element. As an example, conductive material 383 can include tungsten silicide ($WSi_x$). Conductive material 383 can contact (e.g., interface with) conductive material 384 at an interface 382 between conductive materials 383 and 384.

Each of conductive materials 384, 385, and 386 can include polysilicon (e.g., conductively doped polysilicon). The thickness (in the Z-direction) of conductive materials 384, 385, and 386 can be different from each other (unequal thicknesses). As an example, conductive material 384 can have a thickness that is greater than the thickness of each of conductive materials 385 and 386. In an alternative structure, at least one (one or two or all) of conductive materials 384, 385, and 386 can include a material that is different from polysilicon.

FIG. 3D shows an example where source 298 includes specific levels (e.g., layers) of materials that include conductive materials 383, 384, 385, and 386. However, source 298 can include fewer or more levels (e.g., layers). For example, in some structures, conductive material 386 may be omitted.

As shown in FIG. 3D, pillar 322 can include a conductive channel portion 325 along the length (in the Z-direction) of pillar 322. Pillar 322 can also include a dielectric portion 331, a charge storage portion 332, and a dielectric portion 333 adjacent each other and located along the length of pillar 322. As shown in FIG. 3D, dielectric portion 333 can be adjacent (e.g., can contact) conductive channel portion 325.

Pillar 322 can extend at least partially into the conductive structure of source 298. For example, pillar 322 can include a bottom portion (including part of conductive channel portion 325, part of dielectric portion 331, part of charge storage portion 332, and part of dielectric portion 333) that can extend at least partially into conductive material 384.

As shown in FIG. 3D, conductive channel portion 325 is electrically coupled to conductive material 385 of source 298. Conductive channel portion 325 can be part of a conductive path between a respective data line (e.g., data line $270_N$ in FIG. 3C) and source 298 to carry current (e.g., current between data line $270_N$ and source 298) during an operation (e.g., read, write, or erase) of memory device 200.

FIG. 3D shows an example where pillar 322 includes dielectric portion 331, charge storage portion 332, and dielectric portion 333 (e.g., three layers) between conductive channel portion 325 and respective control gates (associated with signals $WL_0$ and $WL_1$). However, dielectric portion 331, charge storage portion 332, and dielectric portion 333 can be part of a TANOS (TaN, $Al_2O_3$, $Si_3N_4$, $SiO_2$, Si) structure of pillar 322 (or a structure similar to a TANOS structure) in which the TANOS structure can have a different number of layers (e.g., more than three layers) of materials. In the TANOS structure, dielectric portion 331 (e.g., interpoly dielectric portions) can include a charge blocking material or materials (e.g., a dielectric material including TaN and $Al_2O_3$) that are capable of blocking a tunneling of a charge. Charge storage portion 332 can include a charge storage element (e.g., charge storage material or materials, e.g., $Si_3N_4$) that can provide a charge storage function (e.g., trap charge) to represent a value of information stored in memory cells 202. Dielectric portion 333 can include a tunnel dielectric material or materials (e.g., $SiO_2$) that are capable of allowing tunneling of a charge (e.g., electrons). As an example, dielectric portion 333 can allow tunneling of electrons from conductive channel portion 325 to charge storage portion 332 during a write operation and tunneling of electrons from charge storage portion 332 to conductive channel portion 325 during an erase operation of memory device 200. Moreover, dielectric portion 333 can allow tunneling of holes from conductive channel portion 325, compensating the trapped electron recombination during an erase operation of memory device 200. In an alternative structure of memory device 200, dielectric portion 331, charge storage portion 332, and dielectric portion 333 can be part of a SONOS (Si, $SiO_2$, $Si_3N_4$, $SiO_2$, Si) structure.

In another alternative structure of memory device 200, dielectric portion 331, charge storage portion 332, and dielectric portion 333 can be part of a floating gate structure. For example, charge storage portion 332 can include polysilicon (or other material) where charge storage portion 332 can be part of a floating gate of a respective memory cell 202.

As shown in FIG. 3D, memory device 200 can include a dielectric liner 621A between each of conductive materials 383, 384, and 386 and pillar 322. Dielectric liner 621A can include a bottom portion (e.g., horizontal portion) 621A' contacting conductive material 383. Conductive materials 383, 384, and 386 are electrically separated from conductive channel portion 325 of pillar 322 by a portion of pillar 322 (e.g., by part of dielectric portion 331, charge storage portion 332, and the bottom portion of pillar 322).

Conductive material 385 is not electrically separated from conductive channel portion 325 of pillar 322. Conductive material 385 can contact (e.g., electrically in contact with) conductive channel portion 325 of pillar 322 at a region 325C of channel portion 325. As shown in FIG. 3D, conductive material 385 can extend (e.g., laterally extend in the Y-direction) through dielectric liner 621A and through part of pillar 322 (e.g., through part of dielectric portion 331, charge storage portion 332, and dielectric portion 333) and region 325C of conductive channel portion 325 of pillar 322. Thus, conductive channel portion 325 can be electrically coupled to the conductive structure of source 298 through conductive material 385.

As shown in FIG. 3D, pillar 344_P can include a dielectric portion 344L and a core portion 344C. Pillar 344_P can extend through the conductive structure (e.g., conductive materials 383, 384, 385, and 386) of source 298. Core portion 344C is a conductive portion. Core portion 344C can include a conductive material 1733 coupled to (e.g., in electrical contact with) conductive region 392. Memory device 200 can include a dielectric liner 621B separating pillar 344_P (e.g., separating the bottom portion of pillar 344_P) from conductive materials 383, 384, 385, and 386 of the conductive structure of source 298.

As shown in FIG. 3D, dielectric portion 344L and a core portion 344C can be adjacent each other and located along the length of pillar 344_P. Dielectric portion 344L can include a dielectric material (e.g., a single layer of dielectric material of silicon dioxide) or multiple dielectric materials (e.g., multiple layers of dielectric materials). Conductive material 1733 of core portion 344C can contact (e.g., directly coupled to) conductive region 392. Conductive material 1733 of core portion 344C can include metal (e.g., tungsten, tungsten-based material) or other conductive materials.

Figures 3E, 3F, 3G, 3H:
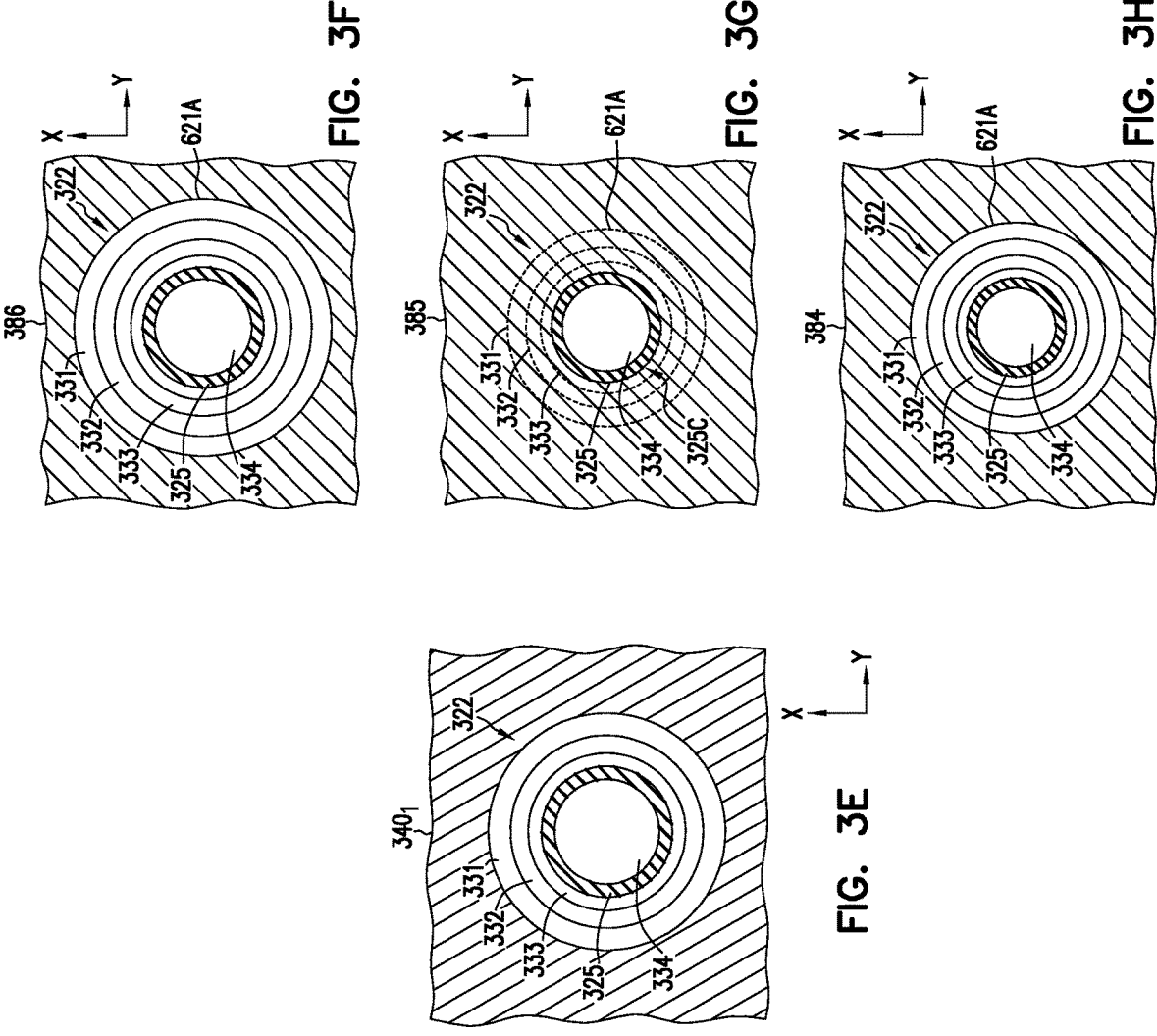
FIG. 3E, FIG. 3F, FIG. 3G, and FIG. 3H show top views of the memory device of FIG. 3D including portions of a pillar of a memory cell string according to some embodiments described herein.
Figures 3I, 3J, 3K, 3L:
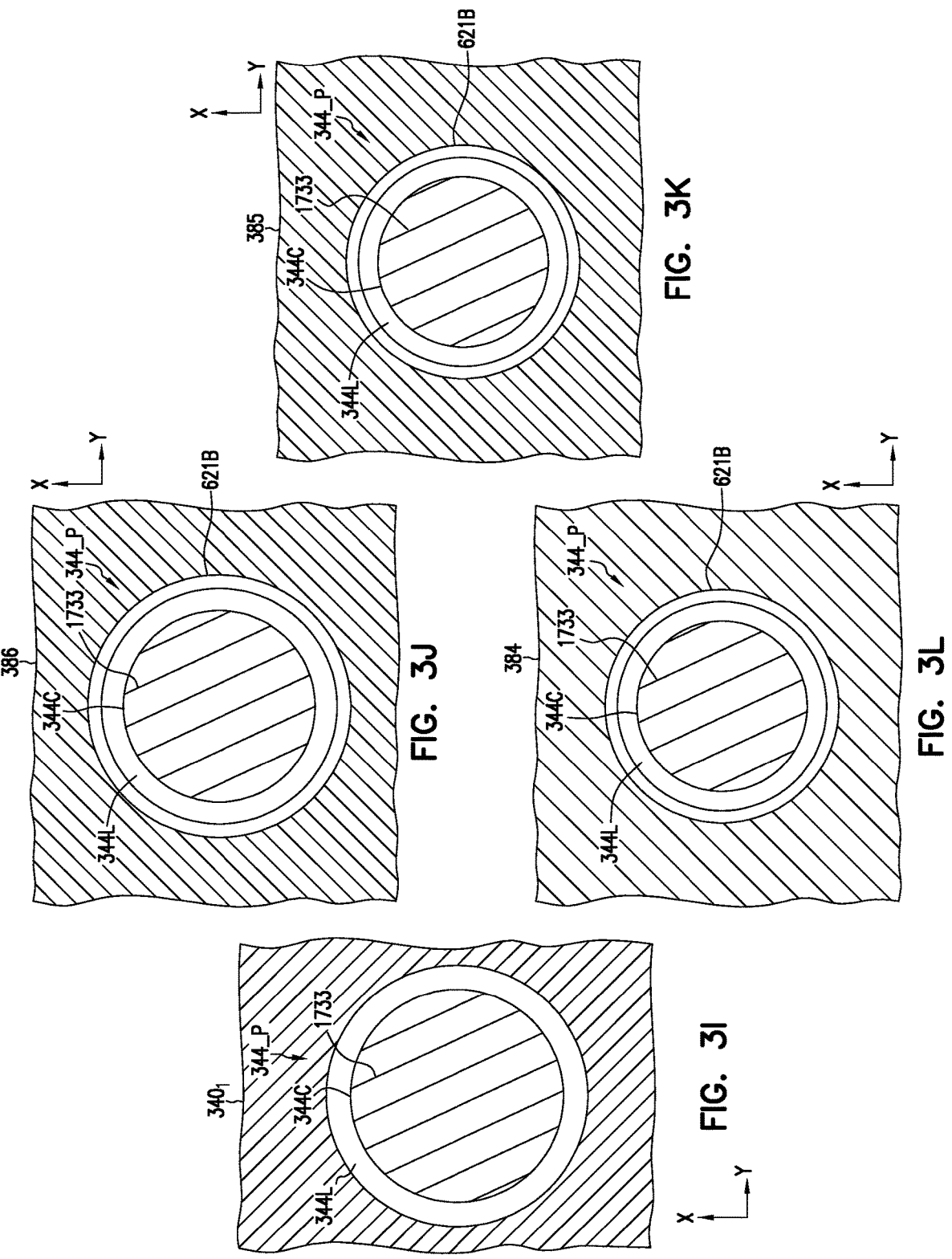
FIG. 3I, FIG. 3J, FIG. 3K, and FIG. 3L show top views of the memory device of FIG. 3D including portions of a pillar of a contact structure of FIG. 3D, according to some embodiments described herein.

Additional views (e.g., top views) of selected parts of memory device 200 along lines 3E, 3F, 3G, and 3H (at pillar 322) and lines 3I, 3J, 3K, and 3L (at pillar 344_P) of FIG. 3D are shown in shown in FIG. 3E, FIG. 3F, FIG. 3G, FIG. 3H, FIG. 3I, FIG. J, FIG. 3K, and FIG. 3L, respectively. As shown in FIG. 3E, pillar 322 can be surrounded by conductive material $340_1$ (e.g., associated with signal $WL_1$ shown in FIG. 3D) with respect to the top view (e.g., X-Y plan view, as shown in FIG. 3E). The materials of pillar 322 (including dielectric portion 331, charge storage portion 332, and a dielectric portion 333, conductive channel portion 325, and dielectric portion 334) can be adjacent (e.g., can contact) each other. The material of a portion (e.g., charge storage portion 332) of pillar 322 can be surrounded by the material of another portion (e.g., dielectric portion 331) of pillar 322 with respect to the top view (e.g., X-Y plan view, as shown in FIG. 3E).

As shown in FIG. 3F, dielectric liner 361A is between conductive material 386 and the materials (dielectric portion 331, charge storage portion 332, and a dielectric portion 333, conductive channel portion 325, and dielectric portion 334) of pillar 322. Similarly, as shown in FIG. 3H, dielectric liner 361A is also between conductive material 384 and the materials of pillar 322.

As shown in FIG. 3G, dielectric liner 361A is not between conductive material 385 and pillar 322. Conductive material 385 can contact conductive channel portion 325 at an outer sidewall (not labeled) of region 325C of conductive channel portion 325. This allows conductive channel portion 325 and conductive material 385 to be electrically coupled to each other, thereby allowing pillar 322 to be electrically coupled to source 298.

As shown in FIG. 3I, pillar 344_P can be surrounded by conductive material $340_1$ with respect to the top view (e.g., X-Y plan view, as shown in FIG. 3E). As shown in FIG. 3I, dielectric portion 344L of pillar 344_P can be adjacent (e.g., can contact) core portion 344C of pillar 344_P. Conductive material 1733 of core portion 344C can be surrounded by dielectric portion 344L with respect to the top view. Thus, core portion 344C of pillar 344_P can be electrically separated from conductive material $340_1$ by dielectric portion 344L of pillar 344_P. FIG. 3I shows an example where conductive material 1733 can be a single material (e.g., tungsten). However, conductive material 1733 can be a combination of different conductive materials (e.g., different layers of materials) formed one after another starting from an inner sidewall (not labeled) of dielectric portion 344L.

In FIG. 3J, FIG. 3K, and FIG. 3L, dielectric liner 621B is between pillar 344_P and each of conductive materials 383, 384, 385, and 386. Thus, core portion 344C of pillar 344_P can be electrically separated from each of conductive materials 383, 384, 385, and 386 by dielectric portion 344L of pillar 344_P and by dielectric liner 621B.

Figure 3M:
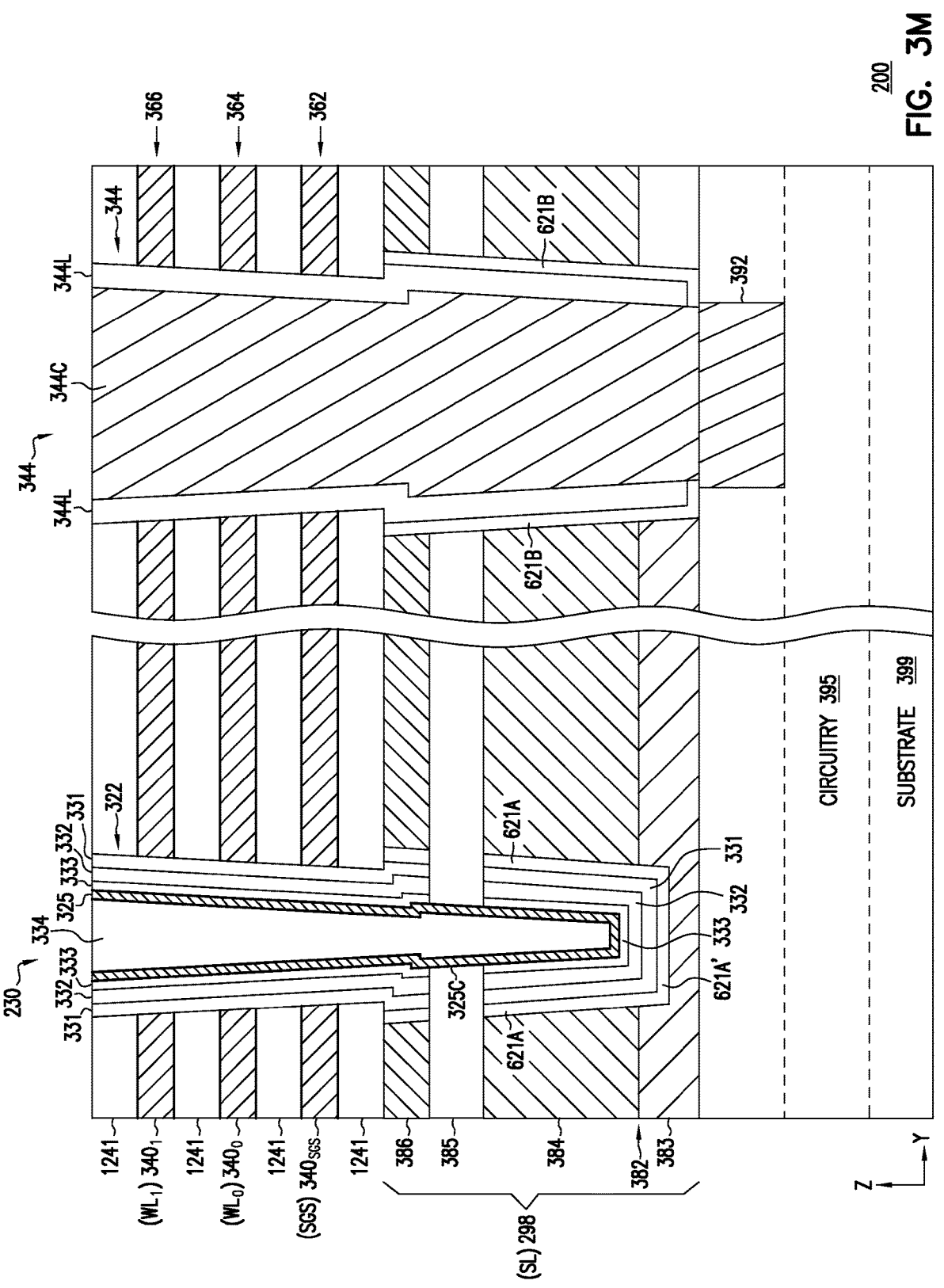
FIG. 3M and FIG. 3N show additional example structures of a memory cell pillar of the memory device of FIG. 3D, according to some embodiments described herein.

FIG. 3M shows an example of memory device 200 where pillar 322 can extend through conductive material 384 and into (e.g., partially into) conductive material 383. For example, dielectric portion 331 of pillar 322 can extend below a level (in the Z-direction) that corresponds to the level of interface 382. In the example of FIG. 3M, a bottom portion 621A' of dielectric liner 621A can also extend below a level (in the Z-direction) that corresponds to the level of interface 382. Thus, in the example of FIG. 3M, like FIG. 3D, bottom portion 621A' of dielectric liner 621A also contacts conductive material 383. However, in FIG. 3M, bottom portion 621A' of dielectric liner 621A contacts conductive material 383 at a level (in the Z-direction) that is below the level of interface 382.

Figure 3N:
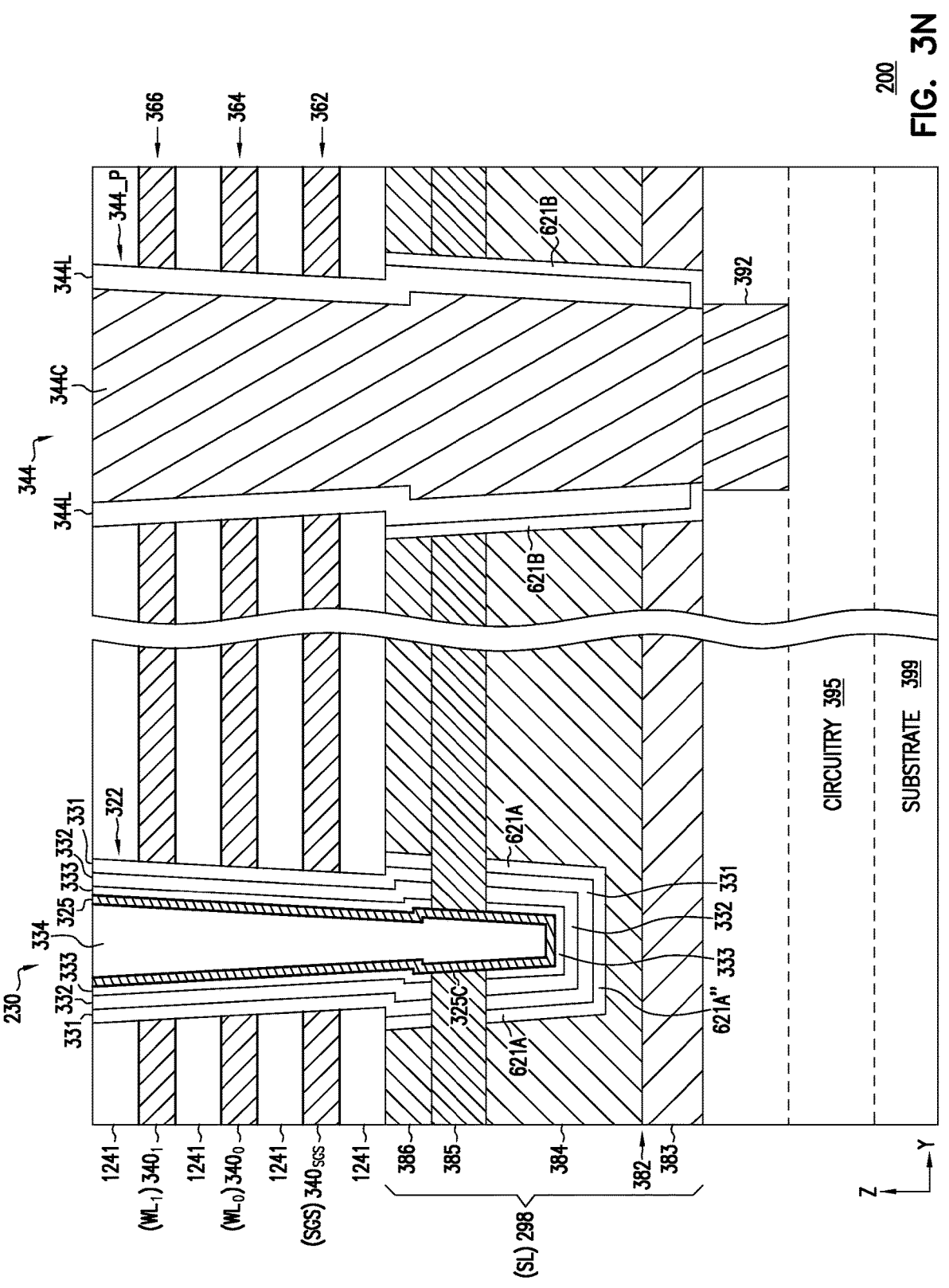

FIG. 3N shows an example of memory device 200 where pillar 322 may not extend through conductive material 384 but only partially into conductive material 384. For example, dielectric portion 331 of pillar 322 may partially extend into conductive material 384 above a level (in the Z-direction) that corresponds to the level of interface 382. In the example of FIG. 3N, bottom portion 621A" of dielectric liner 621A may not extend through conductive material 384 but only partially into conductive material 384 above a level (in the Z-direction) that corresponds to the level of interface 382. Thus, in the example of FIG. 3N, unlike like FIG. 3D and FIG. 3M, bottom portion 621A" of dielectric liner 621A does not contact conductive material 383. As shown in FIG. 3M, the bottom portion of pillar 322 does not extend below a level (in the Z-direction) that corresponds to the level of interface 382.

In comparison between the structure of pillar 322 in FIG. 3D, FIG. 3M, and FIG. 3N, a conductive connection between pillar 322 and source may have a different resistance, depending on the depth of pillar 322 in source 298. For example, the conductive connection between pillar 322 and source 298 in FIG. 3D may be less than that of the conductive connection between pillar 322 and source 298 in each of FIG. 3M and FIG. 2N. In another example, the conductive connection between pillar 322 and source 298 in FIG. 3M may be less than that of the conductive connection between pillar 322 and source 298 in FIG. 3N. By providing different structures of pillar 322 and source 298 (e.g., as shown in FIG. 3D, FIG. 3M, and FIG. 3N), different advantages and benefits relative to the resistance of source 298 may be obtained.

Figures 4A, 4B:
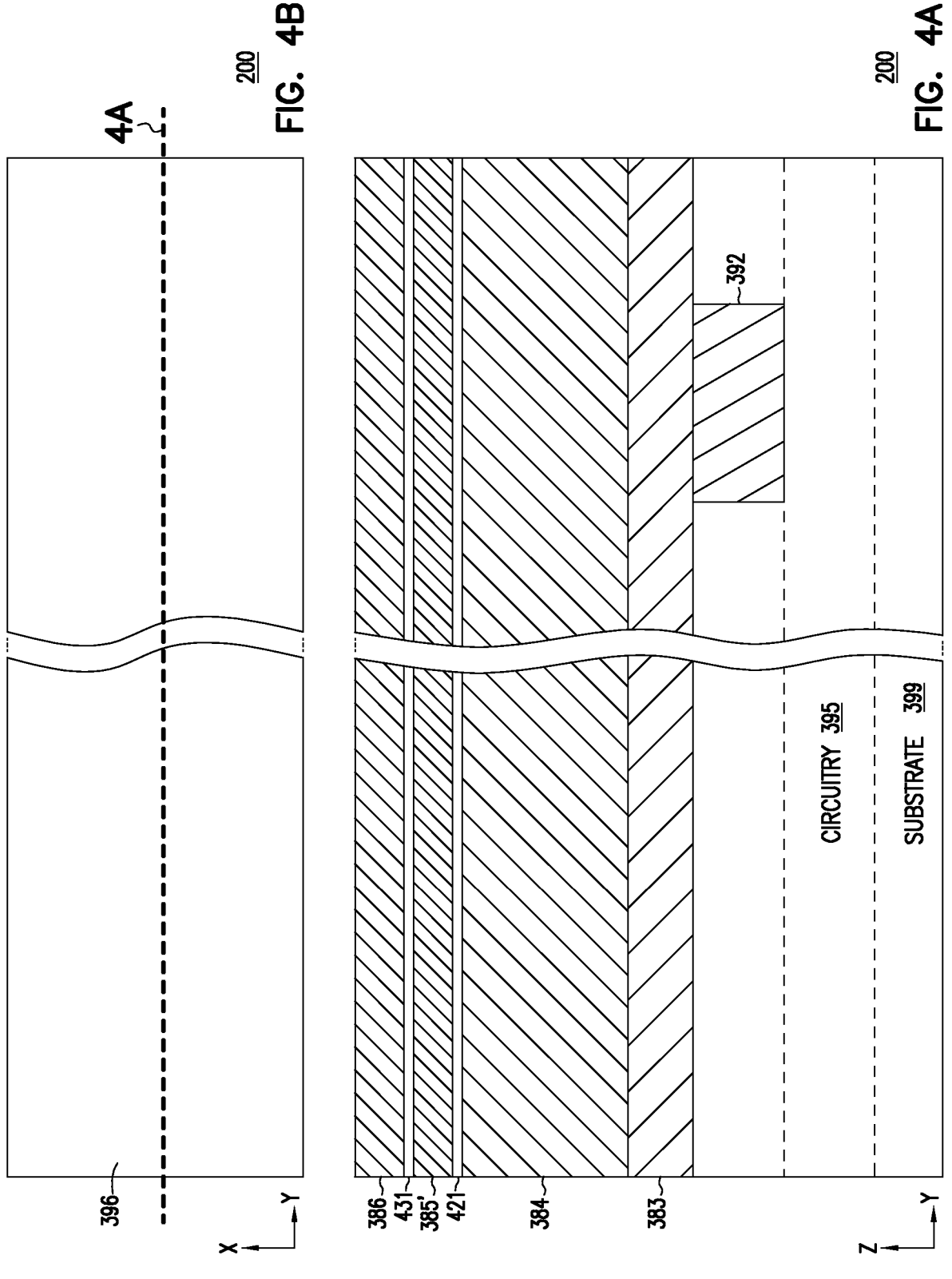

FIG. 4A through FIG. 28 show different views of structures during processes of forming memory device 200 of FIG. 2 through FIG. 3N, according to some embodiments described herein. FIG. 4A shows a side view (e.g., a cross-section) of memory device 200 taken along line 4A of FIG. 4B. FIG. 4B shows a top view of memory device 200.

FIG. 4A shows memory device 200 after levels of materials (e.g., layers of materials) are formed. The levels of materials include conductive materials 383, 384, 385', and 386, and dielectric materials (e.g., silicon dioxide) 421 and 431 are formed. These materials can be sequentially formed one material after another over substrate 399. For example, conductive material 383 can be formed first and conductive material 386 can be formed last.

FIG. 4A also shows memory device 200 after a conductive region 392 is formed. Conductive region 392 is symbolically shown as dashed lines in FIG. 3C and is electrically coupled to elements of circuitry 395 (as described above with reference to FIG. 3C). In FIG. 4A, conductive region 392 can be formed before conductive materials 383, 384, 385', and 386, and dielectric materials (e.g., silicon dioxide) 421 and 431 are formed. As described below, a contact structure 334 (which includes pillar 344_P (FIG. 3D)) can be subsequently formed over conductive region 392 and coupled to circuitry 395 through conductive region 392.

FIG. 5A and FIG. 5B show a side view and a top view, respectively, of memory device 200 after openings (e.g., holes) 520 and 545 are formed. FIG. 5A shows a side view taken along line 5A of FIG. 5B. Openings 520 and 545 can be concurrently (e.g., simultaneously) formed (e.g., formed in the same step) in conductive materials 383, 384, 385', and 386, and dielectric materials 421 and 431.

In the example of FIG. 5A, openings 520 and 545 can be concurrently formed in that the same process step can be used (e.g., performed) to remove (e.g., etch) a portion of the levels of materials (e.g., conductive materials 383, 384, 385', and 386, and dielectric materials 421 and 431). For example, the process step associated with FIG. 5A can concurrently remove a portion of each of conductive material 386, dielectric material 431, conductive material 385', dielectric material 421, and conductive material 384 at the locations of openings 520 and 545.

In an alternative process, openings 520 and 545 may not be concurrently formed. For example, opening 520 can be formed, then opening 545 can be formed after opening 520 is formed. In another example, opening 545 can be formed, then opening 520 can be formed after opening 545 is formed.

FIG. 5A and FIG. 5B show an example of formation of one opening 520 and one opening 545 for simplicity. However, the processes associated with FIG. 5A and FIG. 5B can form (e.g., concurrently form) many (multiple) openings like opening 520 and many (multiple) opening like opening 545. Opening 520 in FIG. 5A and many other openings (not shown) like opening 520 are locations of memory cell pillars (e.g., pillar 320 in FIG. 3B) that will be subsequently formed (as described below with reference to FIG. 6A through FIG. 22C). Opening 545 in FIG. 5A and many other openings (not shown) like opening 545 are locations of pillars of contact structures (contact structures 344 in FIG. 3B) that will be subsequently formed (as described below with reference to FIG. 6A through FIG. 22C).

As shown in FIG. 5A, openings 520 and 545 can have sidewalls 520W and 545W, respectively. Openings 520 and 545 can be formed to have different depths (e.g., in the Z-direction) Z1 and Z2, respectively. Depth Z1 can be less than depth Z2. Openings 520 and 545 different diameters (e.g., in the Y-direction (or in the X-direction)) D1 and D2, respectively. Diameter D1 can be less than diameter D2.

Opening 520 can have a bottom 520B at a surface 383S of conductive material 383. Surface 383S can be at a level (in the Z-direction) corresponding to the level of interface 382. Opening 545 can have a bottom 545B at a surface 392S of conductive region 392.

As shown in FIG. 5A, opening 520 can be formed by removing a portion of each of conductive materials 384, 385', and 386 and dielectric materials 421 and 431 at the location of opening 520. An etch process can be performed to remove a portion of each of conductive materials 384, 385', and 386 and dielectric materials 421 and 431 at the location of opening 520 and stop at conductive material 383.

Thus, a portion of material 383 (which is exposed at opening 520) at opening 520 may not be removed.

However, in an alternative process, a portion of material 383 at opening 520 may also be removed, such that opening 520 can have a bottom 520B' that extends (e.g., partially extends) into conductive material 383. As shown in FIG. 5A, bottom 520B' can be at a level below (in the Z-direction) the level (in the Z-direction) of interface 382. In this example, an etch process can partially etch a portion of conductive material 383 at the location of opening 520 in addition to etching a portion of each of conductive materials 384, 385', and 386 and dielectric materials 421 and 431.

In another alternative process, opening 520 can be formed such that it can have a bottom 520B" that only partially extends into conductive material 383. As shown in FIG. 5A, bottom 520B" can be at a level (in the Z-direction) above the level of interface 382. In this example, an etch process can partially etch a portion of conductive material 383 at the location of opening 520 in addition to etching a portion of each of conductive materials 385' and 386 and dielectric materials 421 and 431.

Opening 545 can be formed by removing (e.g., etching) a portion of conductive materials 383, 384, 385', and 386 and a portion of dielectric materials 421 and 431 at the location of opening 545. As shown in FIG. 5A, a portion of conductive material 383 at the location of opening 545 can be removed (e.g., completely removed), such that conductive region 392 (e.g., surface 392S) may be exposed at opening 545 after opening 545 is formed.

Figure 6:
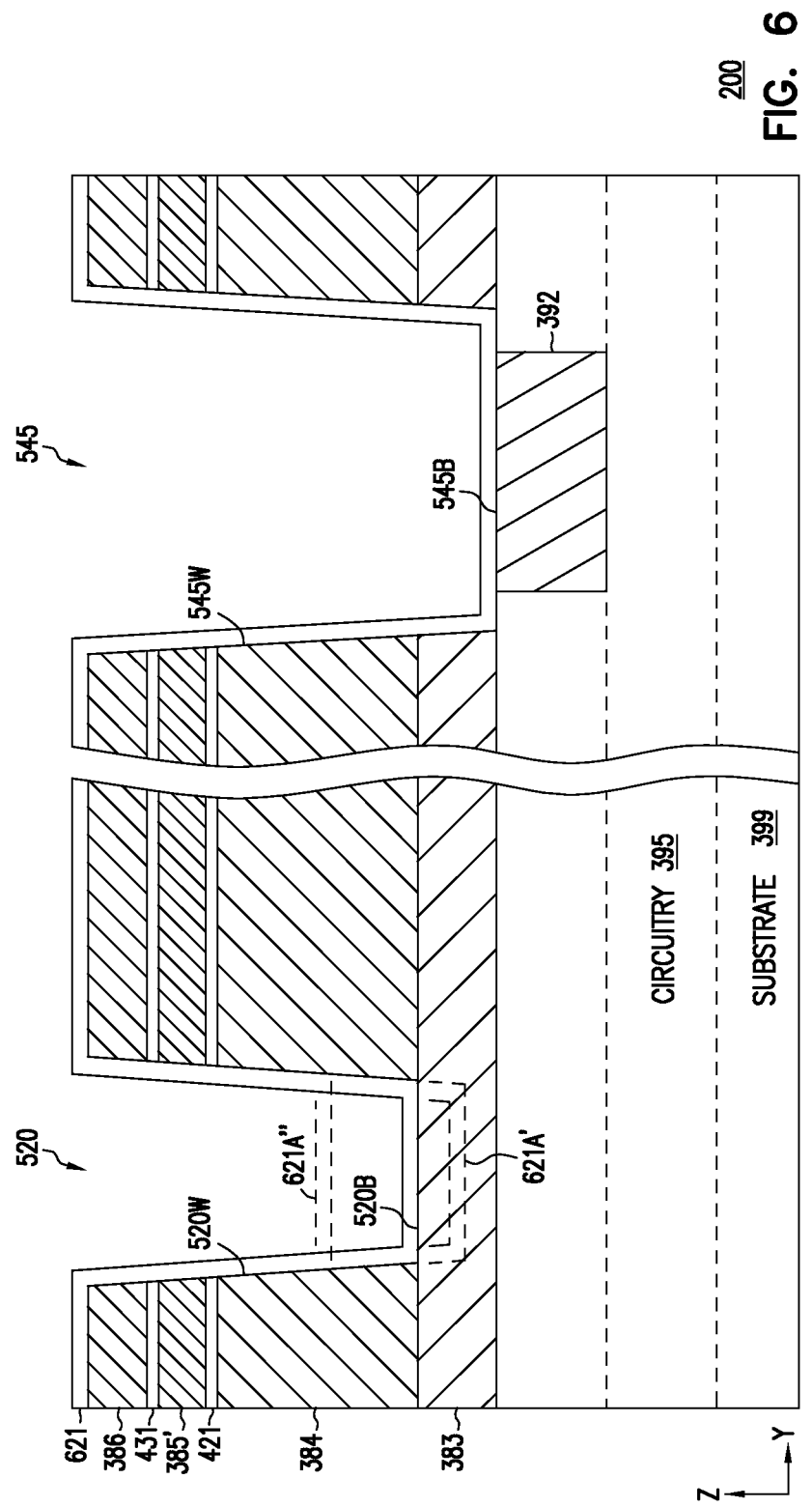

FIG. 6 shows memory device 200 after a dielectric liner 621 is formed. Dielectric liner 621 can include respective portions formed (e.g., concurrently formed) in each of openings 520 and 545. As described above with reference to FIG. 5A and FIG. 5B, openings 520 and 545 are formed concurrently (or alternatively formed one after another). Thus, the processes associated with FIG. 6 can include forming (e.g., concurrent forming) dielectric liner 621 in openings 520 and 545 after both openings 520 and 545 are formed.

In FIG. 6, forming dielectric liner 621 can include forming (e.g., depositing) a dielectric material (e.g., silicon dioxide) on sidewalls 520W and 545W of openings 520 and 545, respectively, and bottoms 520B and 545B of openings 520 and 545, respectively. The material of dielectric liner 621 can be a relatively thin layer and conformal to sidewalls 520W and 545W and bottoms 520B and 545B. As shown in FIG. 6, in each of openings 520 and 545, dielectric liner 621 can have a container shape (e.g., a cup shape). Dielectric liner 621 is subsequently processed (e.g., having a top portion removed) to form dielectric liners 621A and 621B (e.g., as shown in FIG. 3D) in openings 520 and 545, respectively.

FIG. 6 also shows alternative examples corresponding to the examples discussed above with reference to FIG. 5A where opening 520 can have different bottoms 520B' and 520B". For example, as shown in FIG. 6, dielectric liner 621 at opening 520 can alternatively have either bottom portion 621A' or bottom portion 621A". Bottom portion 621A' can be formed in association with opening 520 (FIG. 5A) having bottom 520B' (this means that bottom portion 621A' is formed if opening 520 is formed with bottom 520B'). Bottom portion 621A" (FIG. 6) can be formed in association with opening 520 (FIG. 5A) having bottom 520B" (e.g., bottom portion 621A" is formed if opening 520 is formed with bottom 520B").

Figure 7:
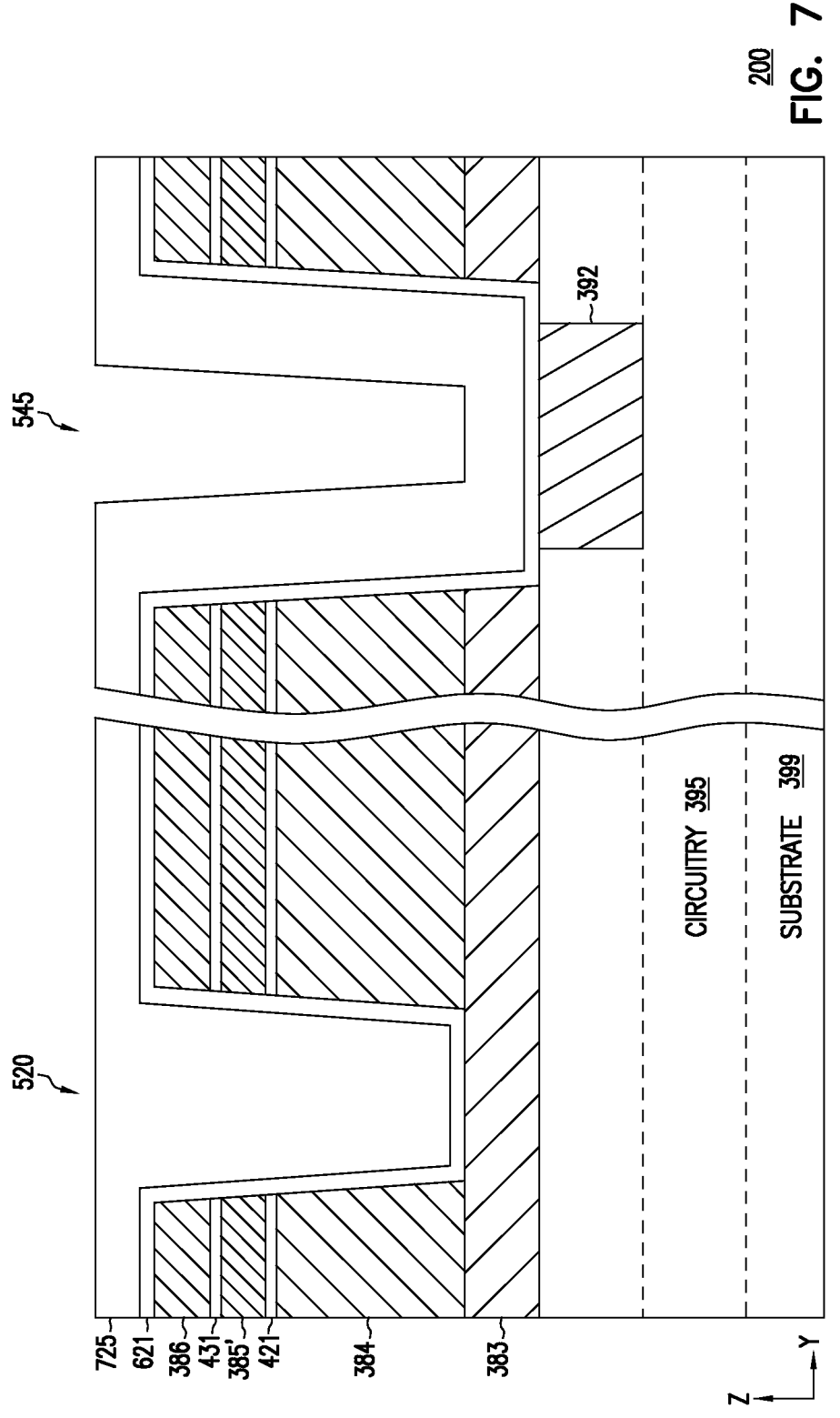

FIG. 7 shows memory device 200 after a material 725 is formed over the material of dielectric liner 621. Material 725 can include a dielectric material. Material 725 is different from the material of dielectric liner 621. Material 725 has selectivity to the material of dielectric liner 621. For example, material 725 and the material (e.g., silicon dioxide) of dielectric liner 621 can have different etch rates. Material 725 can have a dielectric constant different from (e.g., greater than) the dielectric constant of dielectric liner 621. For example, the material of dielectric liner 621 can include silicon dioxide and material 725 can include aluminum dioxide or other material having selectivity for silicon dioxide. Alternatively, material 725 can be metal. However, in some situations (e.g., when opening 520 has bottom 520B" as shown in FIG. 5A), using metal for material 725 may impact (e.g., degrade) the structure of pillar 322 (which has a portion formed in opening 520 in subsequent processes).

Figure 8:
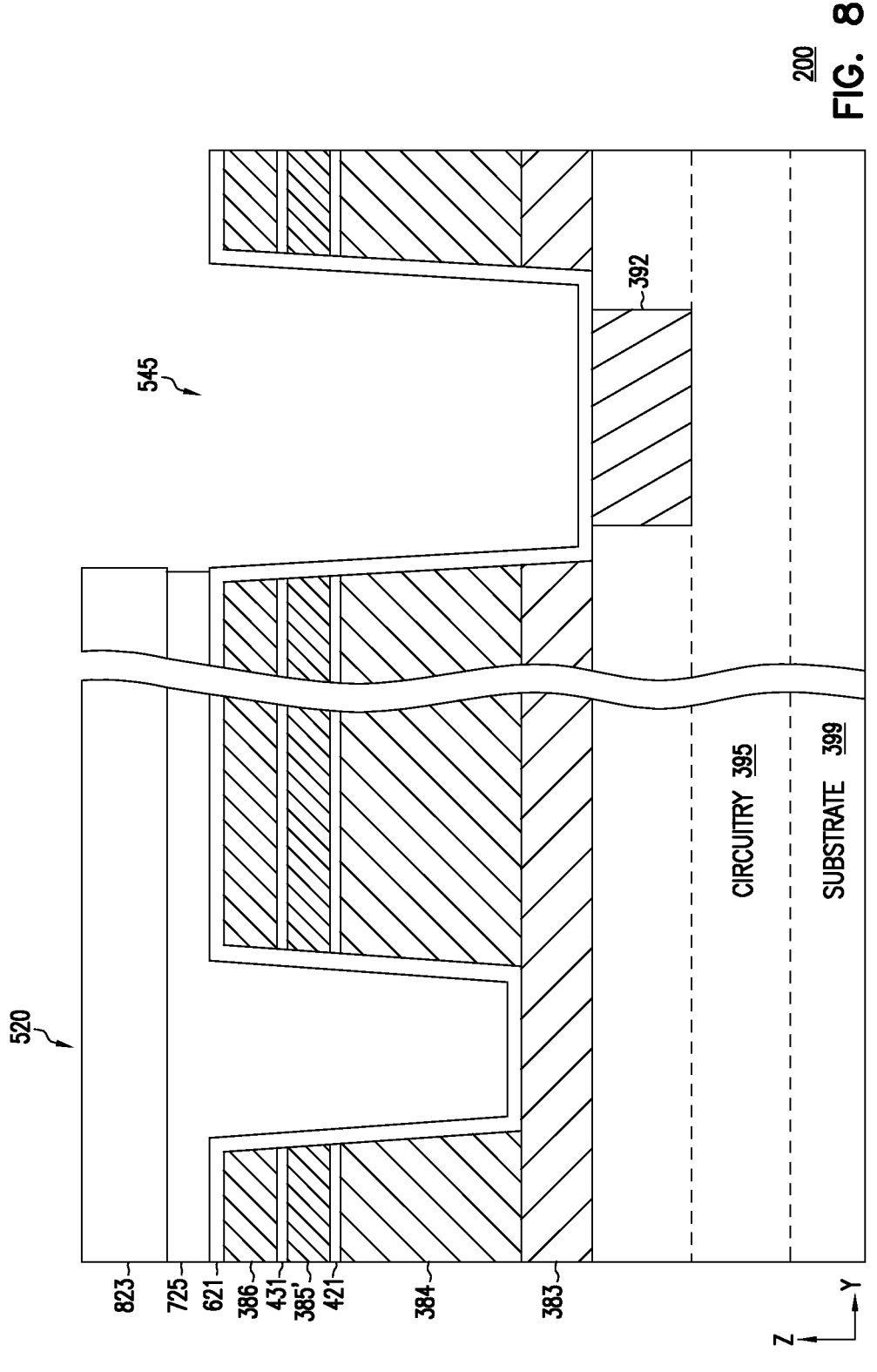

FIG. 8 shows memory device 200 after a portion of material 725 is removed from (recessed at) opening 545. A photoresist 823 can be used in the processes of FIG. 8. Photoresist 823 can have a pattern such that material 725 in opening 520 remains in opening 520 (not removed from opening 520) while a portion of material 725 is removed from opening 545.

Figure 9:
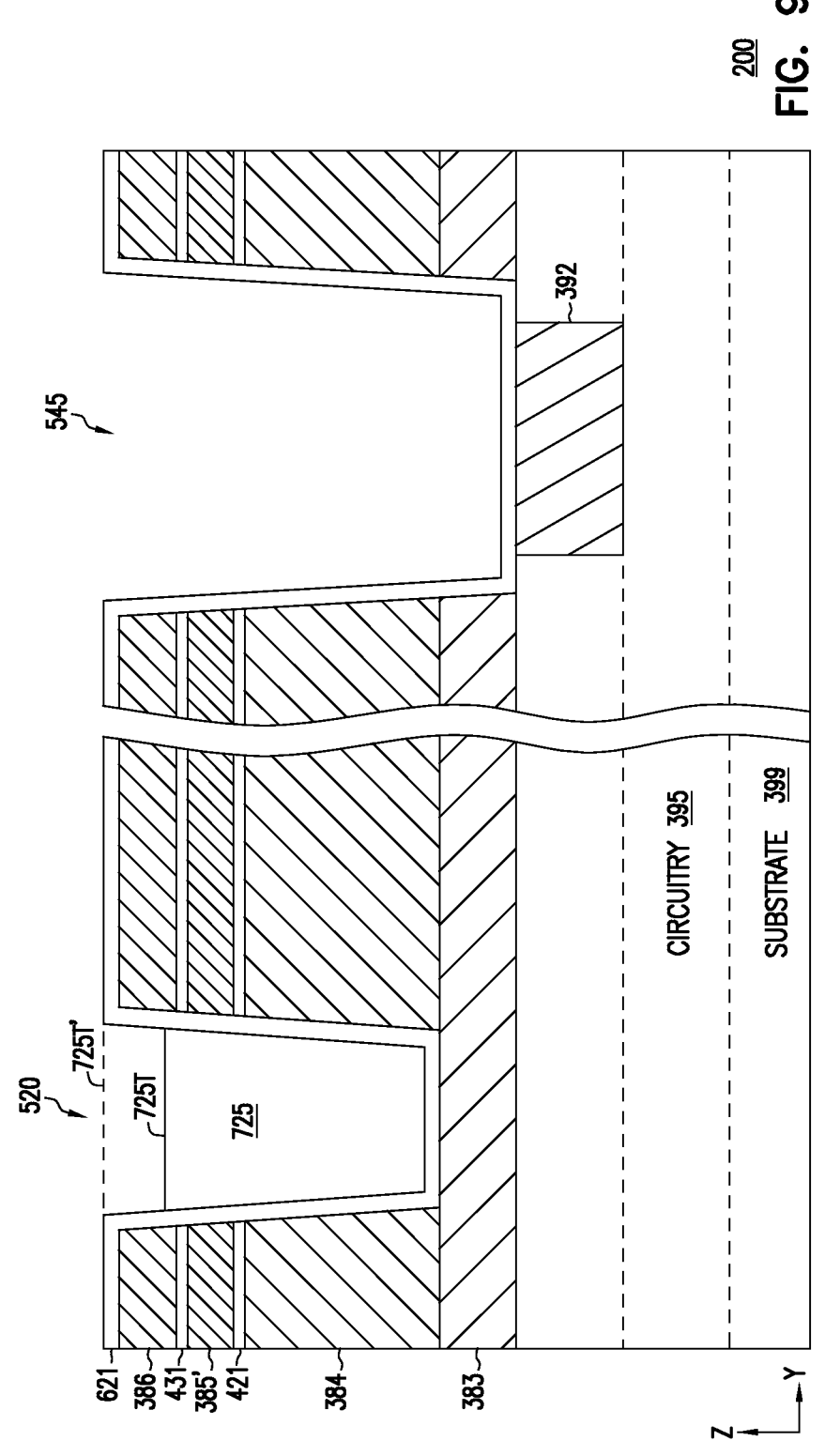

FIG. 9 shows memory device 200 after photoresist 823 (FIG. 8) is removed and after a portion of material 725 is removed from (recessed at) opening 520. A remaining portion of material 725 in opening 520 can have a surface (top surface) 725T below a top portion of dielectric liner 621. Alternatively, the remaining portion of material 725 in opening 520 can have a surface (top surface) 725T' at the same level of a top surface of dielectric liner 621.

Figure 10:
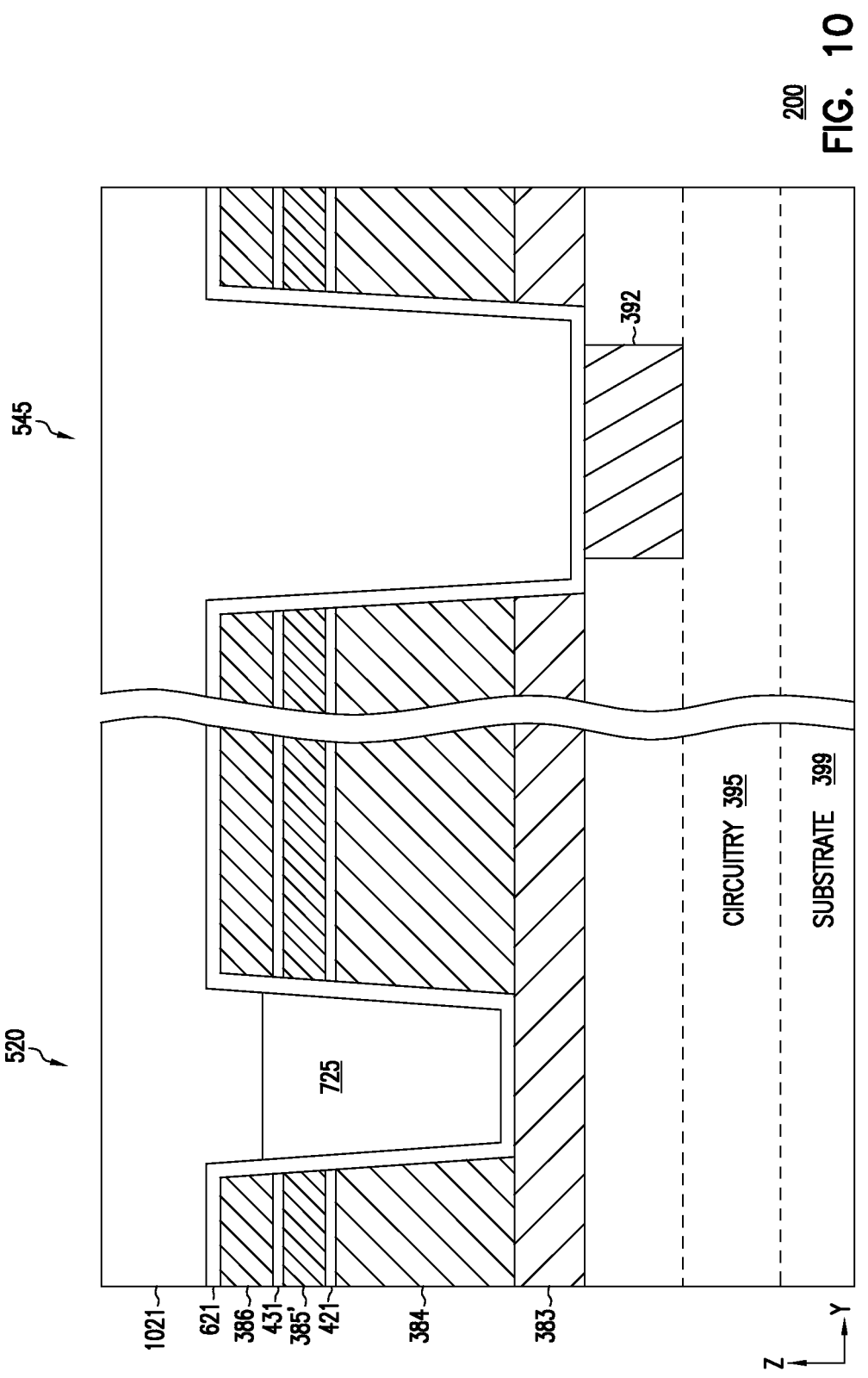

FIG. 10 shows memory device 200 after a material 1021 is formed in openings 520 and 545. At opening 520, material 1021 can be formed over (e.g., form on) material 725. Material 1021 can be different from material 725. For example, material 1021 can include silicon dioxide and material 725 can include aluminum dioxide.

Figure 11:
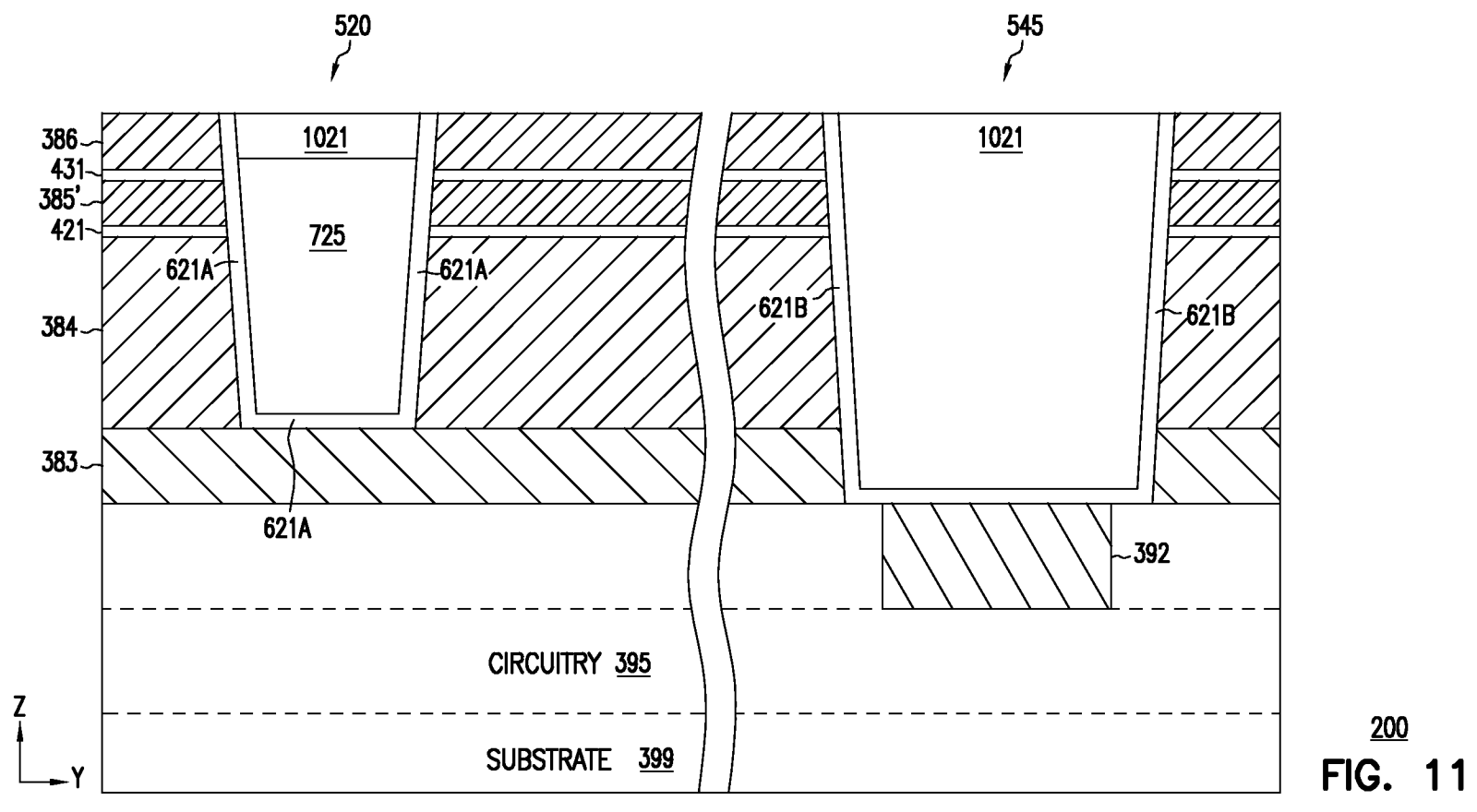

FIG. 11 shows memory device 200 after a portion (e.g., top portion) of material 1021 and a portion of dielectric liner 621 are removed. Dielectric liners 621A and 621B in openings 520 and 545, respectively, are remaining portions of dielectric liner 621 of FIG. 10. A chemical mechanical polishing or planarization (CMP) process can be used to remove the portion of material 1021 and the portion of dielectric liner 621. FIG. 11 shows a remaining portion of material 1021 in openings 520 and 545. In an alternative process where material 725 in opening 520 has a surface 725T' (FIG. 7) material 1021 (FIG. 11) may not remain over material 725 in opening 520. Thus, the processes described above with reference to FIG. 4A through FIG. 11 include forming at least one material (e.g., the material of dielectric liner 621 and one or both of materials 725 and 1021) in each of openings 520 and 545.

Figure 12:
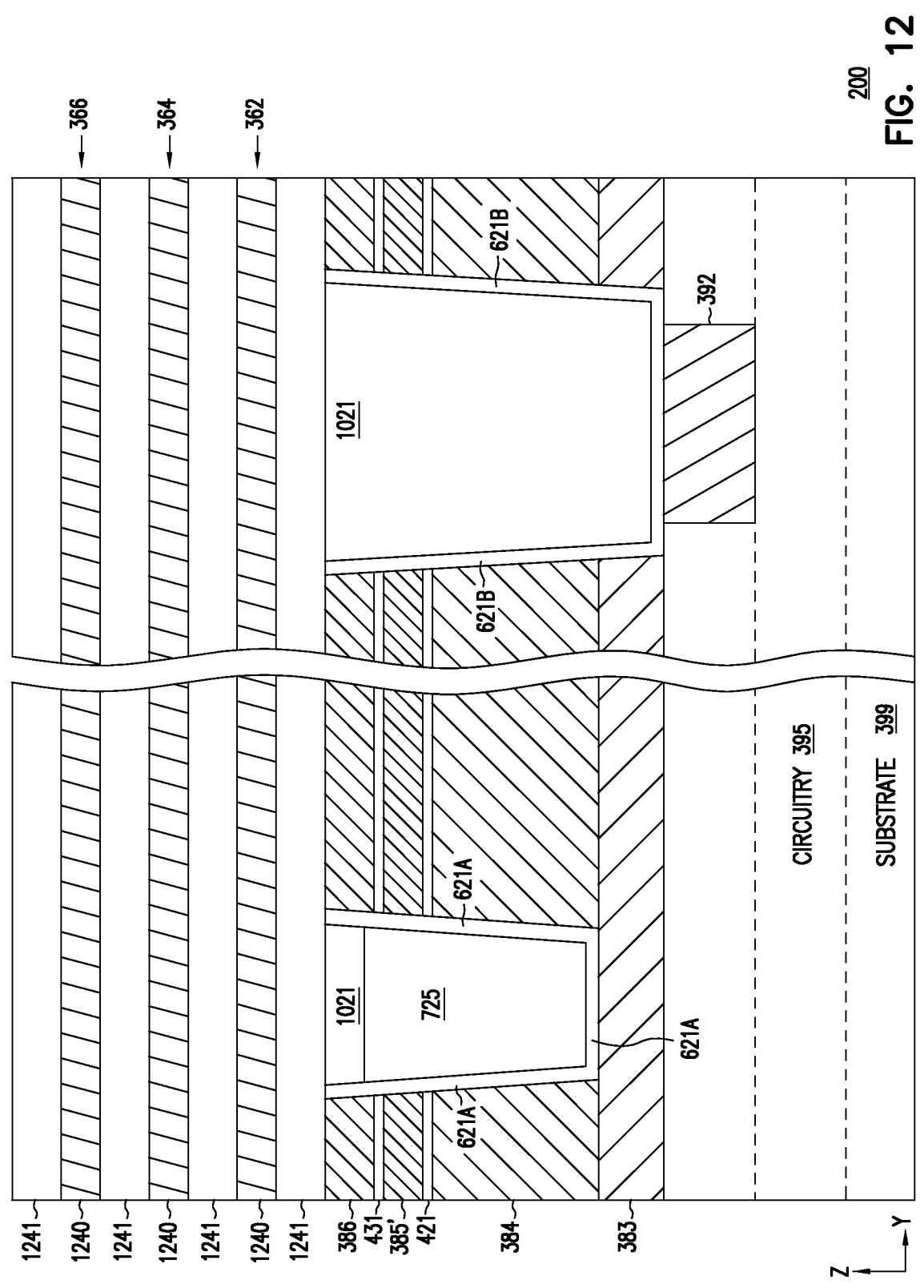

FIG. 12 shows memory device 200 after tiers of materials 1240 and 1241 are formed over the levels of conductive materials 383, 384, 385', 386 and dielectric materials 421 and 431 and over the materials (e.g., materials 725 and 1021) in openings 520 and 545 and the material 1021 in opening 545. Materials 1240 and 1241 can be sequentially formed one material after another over the underlying materials, such that materials 1240 and 1241 can be interleaved with each other in different levels of memory device 200 as shown in FIG. 12. Levels 362, 364, and 366 in FIG. 12 are the same as those shown in FIG. 3C and FIG. 3D.

Materials 1240 can include respective levels of silicon nitride. Materials 1241 can include respective levels of silicon dioxide that are interleaved with the levels of silicon nitride of materials 1240. In subsequent processes, the levels of silicon nitride of materials 1240 can be removed (e.g., exhumed) and then replaced with respective levels of conductive material (e.g., tungsten or tungsten-based material) to form respective control gates (e.g., the control gates associated with signals $WL_0$ and $WL_1$ in FIG. 20) of memory device 200. Materials 1241 in FIG. 12 can be formed to provide separation between control gates (e.g., the control gates associated with signals $WL_0$ and $WL_1$ in FIG. 20) of memory device 200 that are subsequently formed. Materials 1241 in FIG. 12 can correspond to materials 314 of memory device 200 (e.g., FIG. 3C and FIG. 3D).

Figure 13:
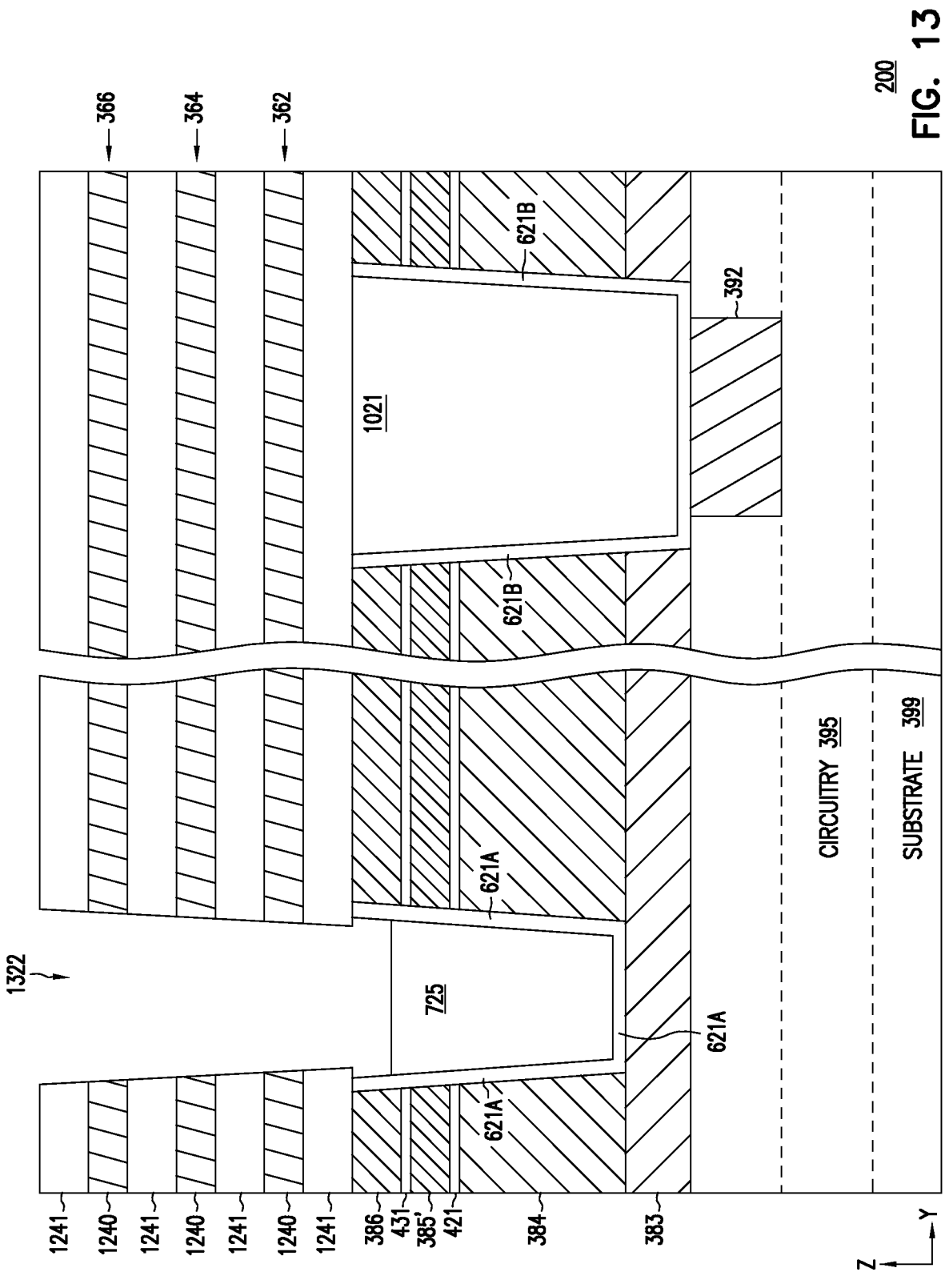

FIG. 13 shows memory device 200 after an opening (e.g., hole) 1322 is formed in the tiers of materials 1240 and 1241 and over (e.g., aligned with) opening 520. As shown in FIG. 13, opening 1322 can be formed such that material 725 in opening 520 can be exposed at opening 1322. Opening 1322 can be formed by removing (e.g., dry etching) a portion of the tiers of materials 1240 and 1241 and material 1021 (FIG. 12) at the location of opening 1322.

Figure 14:
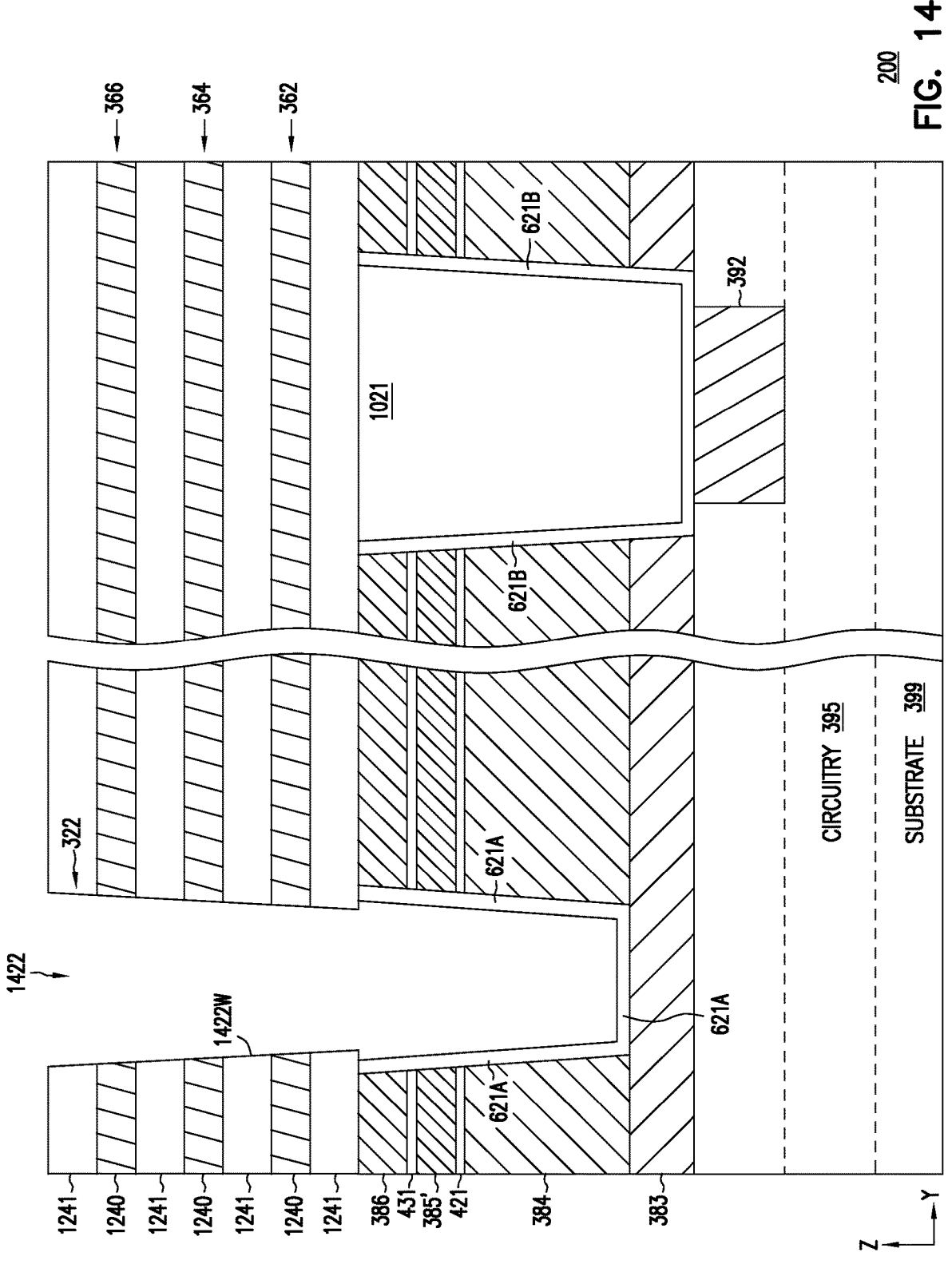

FIG. 14 shows memory device 200 after material 725 is removed from opening 520. The processes associated with FIG. 14 form an opening 1422 at the locations of opening 520 and 1322. Thus, the location of opening 1422 can be a combination of the location of opening 520 (formed in FIG. 5A) and the location of opening 1322 (formed in FIG. 13). As shown in FIG. 14, opening 1422 can include a sidewall 1422W formed by part of the tiers of materials 1240 and 1241 and part of dielectric liner 621A.

Figure 15:
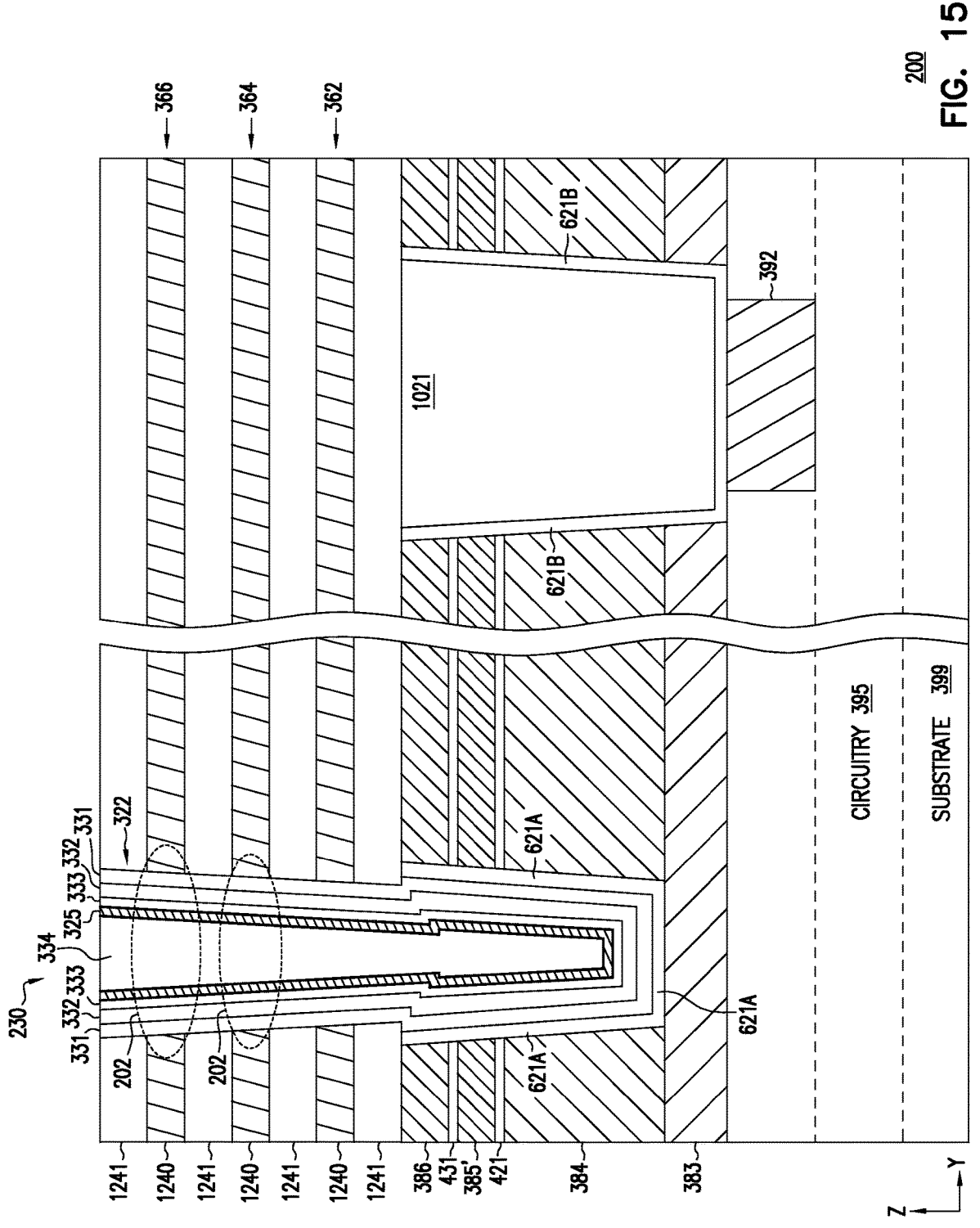

FIG. 15 shows memory device 200 after pillar 322 of memory cell string 230 is formed in opening 1422 (labeled in FIG. 14). As shown in FIG. 15, pillar 322 can extend through the tiers of materials 1240 and 1241 and memory cells are included in respective portions of pillar 322. Pillar 322 can also extend at least partially through a location of opening 520 (labeled in FIG. 11) into the levels of conductive materials 384, 385', and 386 and dielectric materials 421 and 431 in opening 520 (labeled in FIG. 5A).

As shown in FIG. 15, the materials (dielectric portion 331, charge storage portion 332, dielectric portion 333, conductive channel portion 325, and dielectric portion 334) of pillar 322 are the same as those of FIG. 3D through FIG. 3H. The materials of pillar 322 can be formed (e.g., sequentially formed) one at a time. For example, a material (or materials) for dielectric portion 331 can be formed (e.g., deposited) on sidewall 1422W (labeled in FIG. 14) of opening 1422, then materials for other portions can be formed following the order of charge storage portion 332, dielectric portion 333, conductive channel portion 325, and dielectric portion 334. FIG. 15 shows an example structure of pillar 322 of memory cell string 230. However, pillar 322 can have a different structure.

Figure 16:
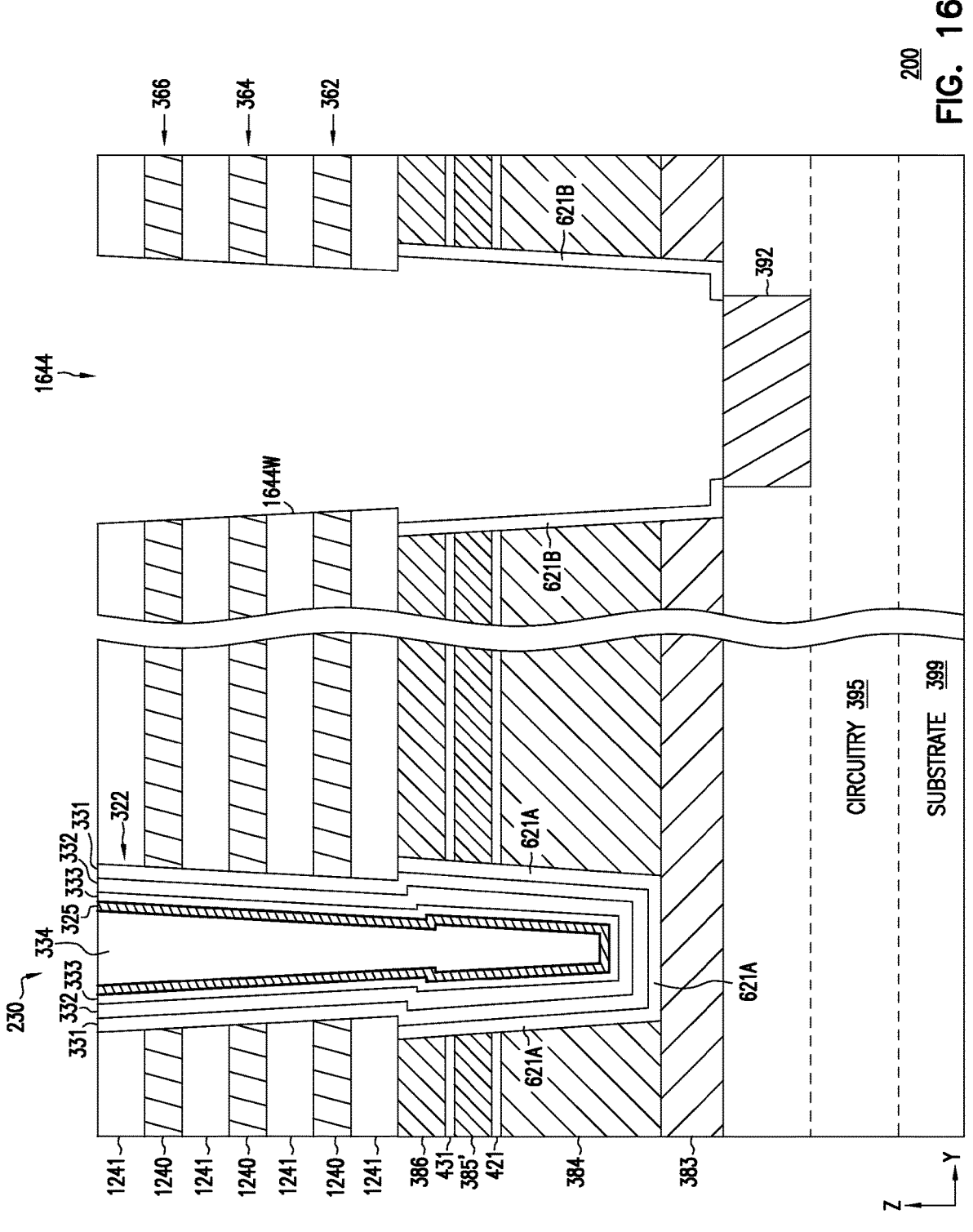

FIG. 16 shows memory device 200 an opening (e.g., hole) 1640 is formed in the tiers of materials 1240 and 1241 and in the location of opening 545 (labeled in FIG. 5A). The processes associated with FIG. 16 can include removing a portion of the tiers of materials 1240 and 1241 at the location of opening 1644 and removing material 1021 (FIG. 15) that was formed in opening 545. A portion (e.g., bottom portion) of dielectric liner 621B can also be removed to expose conductive region 392 at opening 1644. As shown in FIG. 16, opening 1644 can include a sidewall 1644W formed by part of the tiers of materials 1240 and 1241 and part of dielectric liner 621B.

Figure 17:
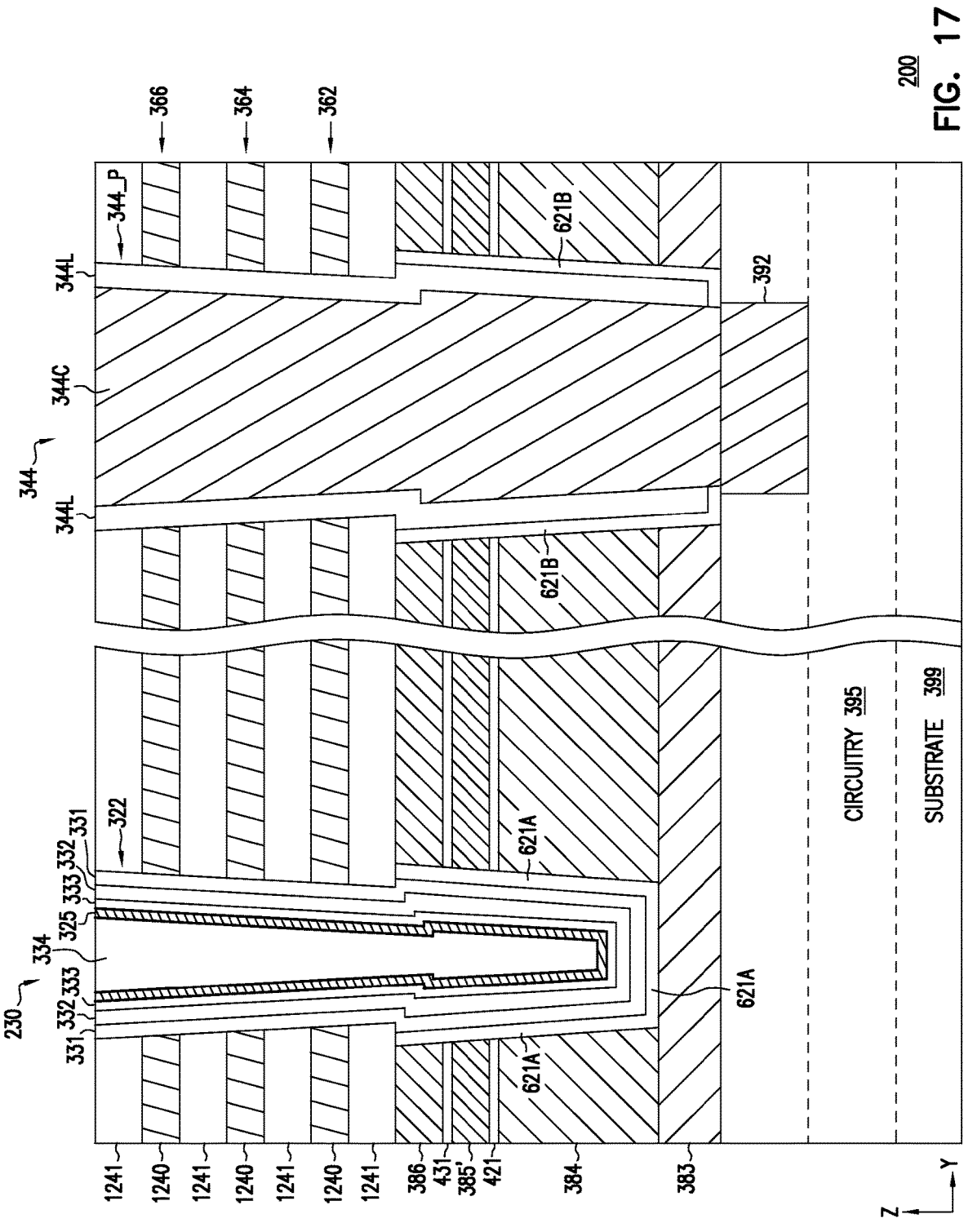

FIG. 17 shows memory device 200 after pillar 344_P of contact structure 344 is formed in opening 1644 (labeled in FIG. 16). As shown in FIG. 17, pillar 344_P can extend through the tiers of materials 1240 and 1241. Pillar 334_P can also extend through a location of opening 545 (labeled in FIG. 11) into the levels of conductive materials 384, 385', and 386 and dielectric materials 421 and 431 and contact conductive region 392. As shown in FIG. 17, pillar 344_P can include dielectric portion 344L and core portion 344C. Conductive material 1733 of core portion 344C contacts (e.g., in electrical contact with) conductive region 392. Pillar 344_P including dielectric portion 344L and core portion 344C are described in detailed above with reference to FIG. 3D and FIG. 3I through FIG. 3L. The materials of pillar 344_P can be formed (e.g., sequentially formed) one at time. For example, a material (or materials) for dielectric portion 344L can be formed (e.g., deposited) on sidewall 1644W (labeled in FIG. 16) of opening 1640, then a material (or different layers of materials) for core portion 344C can be sequentially formed. FIG. 17 shows an example structure of pillar 344_P of contact structure 344. However, pillar 344_P can have a different structure.

Figure 18:
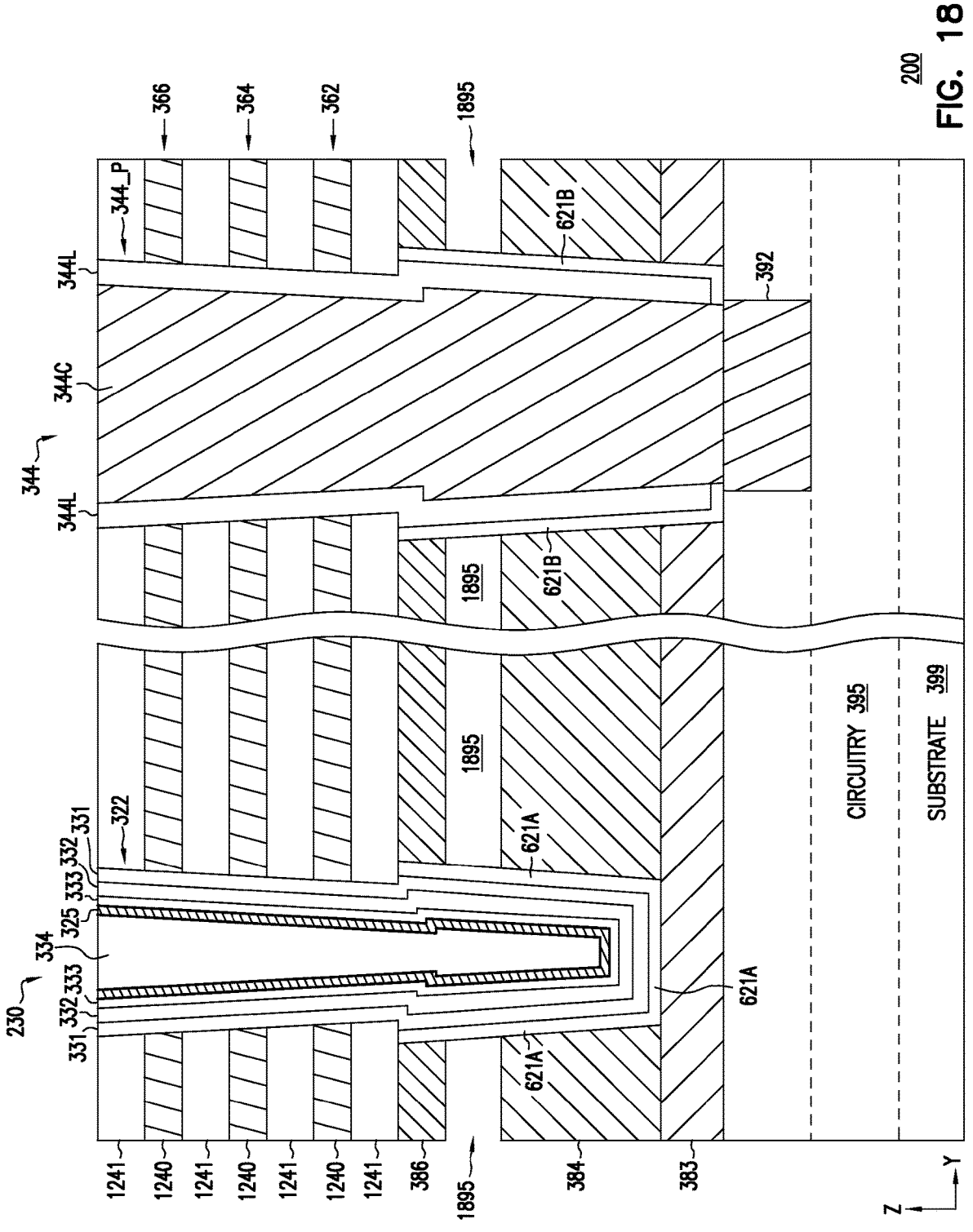

FIG. 18 shows memory device 200 after conductive material 385' and dielectric materials 421 and 431 are removed (e.g., exhumed) from locations 1895. As shown in FIG. 18, locations 1895 are voids (e.g., empty spaces) that were occupied by conductive material 385' and dielectric materials 421 and 431 (FIG. 17).

Figure 19:
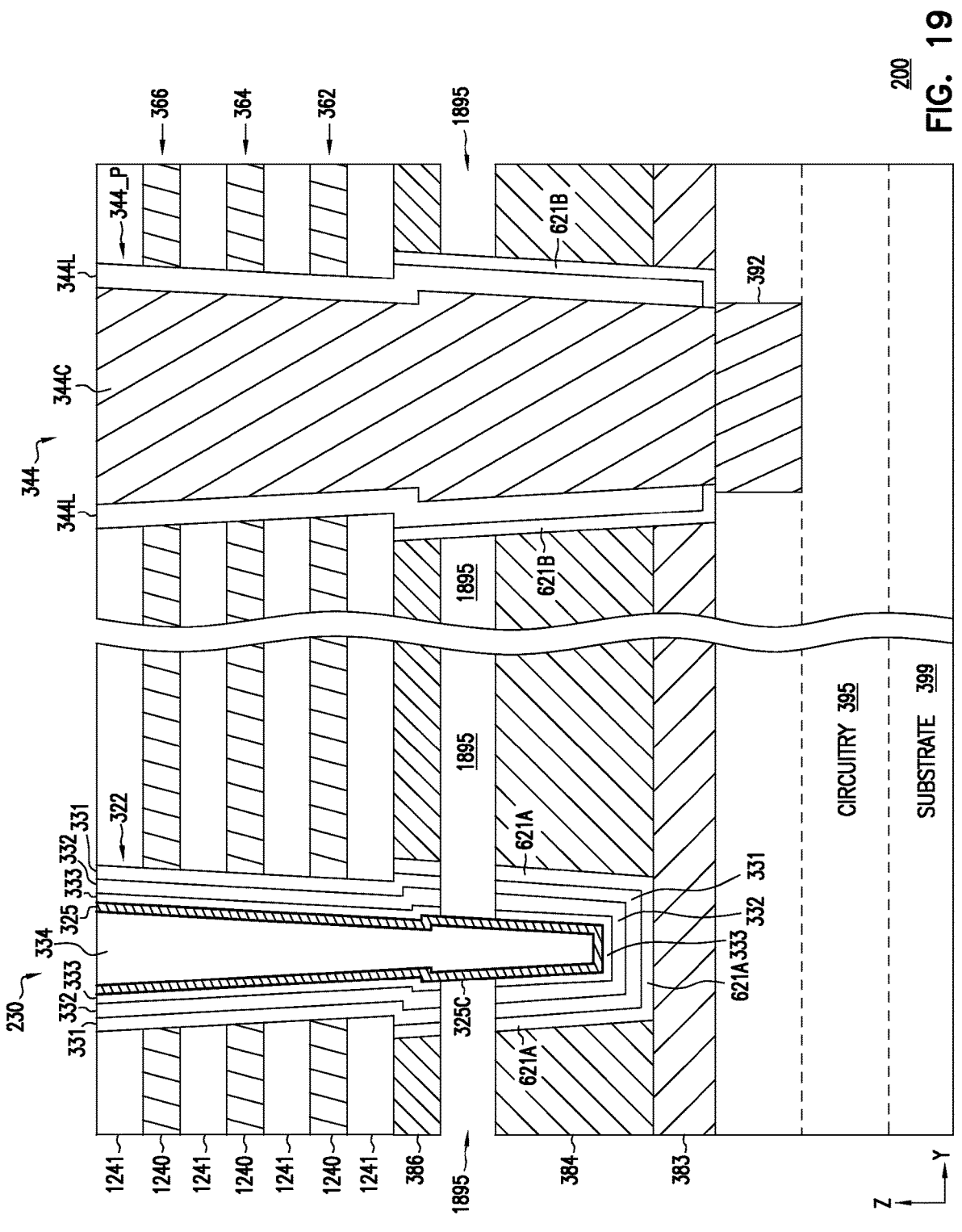

FIG. 19 shows memory device 200 after a portion of pillar 322 at a location 1895 are removed (e.g., cut). As shown in FIG. 19, part of dielectric portion 331, part of charge storage portion 332, and part of dielectric portion 333 (at a location 1895 adjacent pillar 322) were removed to expose a region 325C of conductive channel portion 325 at a locations 1895 adjacent pillar 322.

Figure 20:
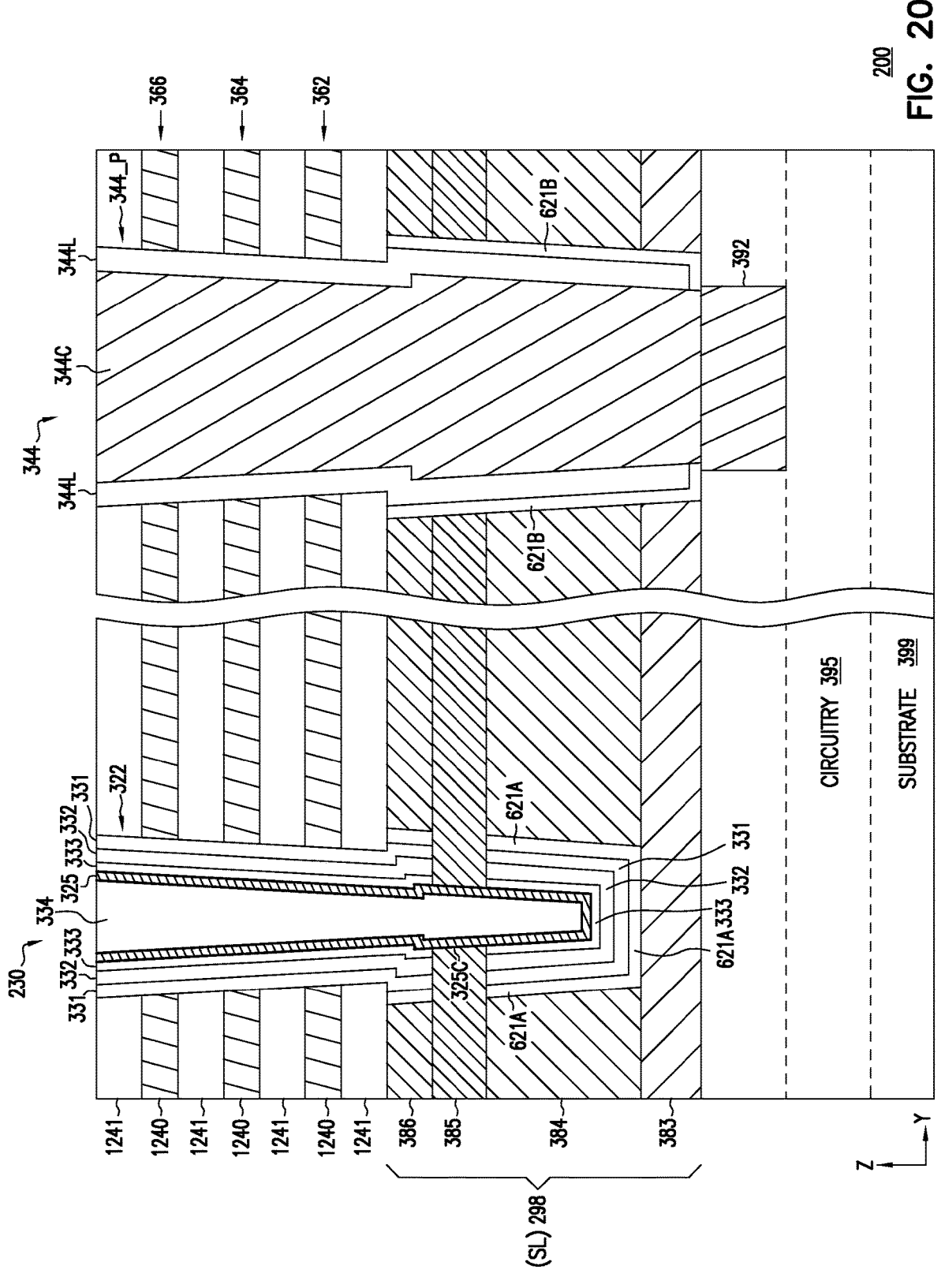

FIG. 20 shows memory device 200 after conductive material (e.g., conductively doped polysilicon) 385 is formed in locations 1895 (FIG. 19). As shown in FIG. 20, conductive material 385 can contact (in electrical contact with) conductive channel portion 325 at region 325C of conductive channel portion 325 and be in electrical contact with conductive materials 384 and 386. Conductive material 385 does not contact (is separated from and not in electrical contact with) core portion 344C of pillar 344_P. Conductive material 385 is part of source 298, which is a conductive structure including multiple levels (e.g., layers) of conductive materials 383, 384, 385, and 386, as described in detail above with reference to FIG. 2 through FIG. 3N.

Figure 21:
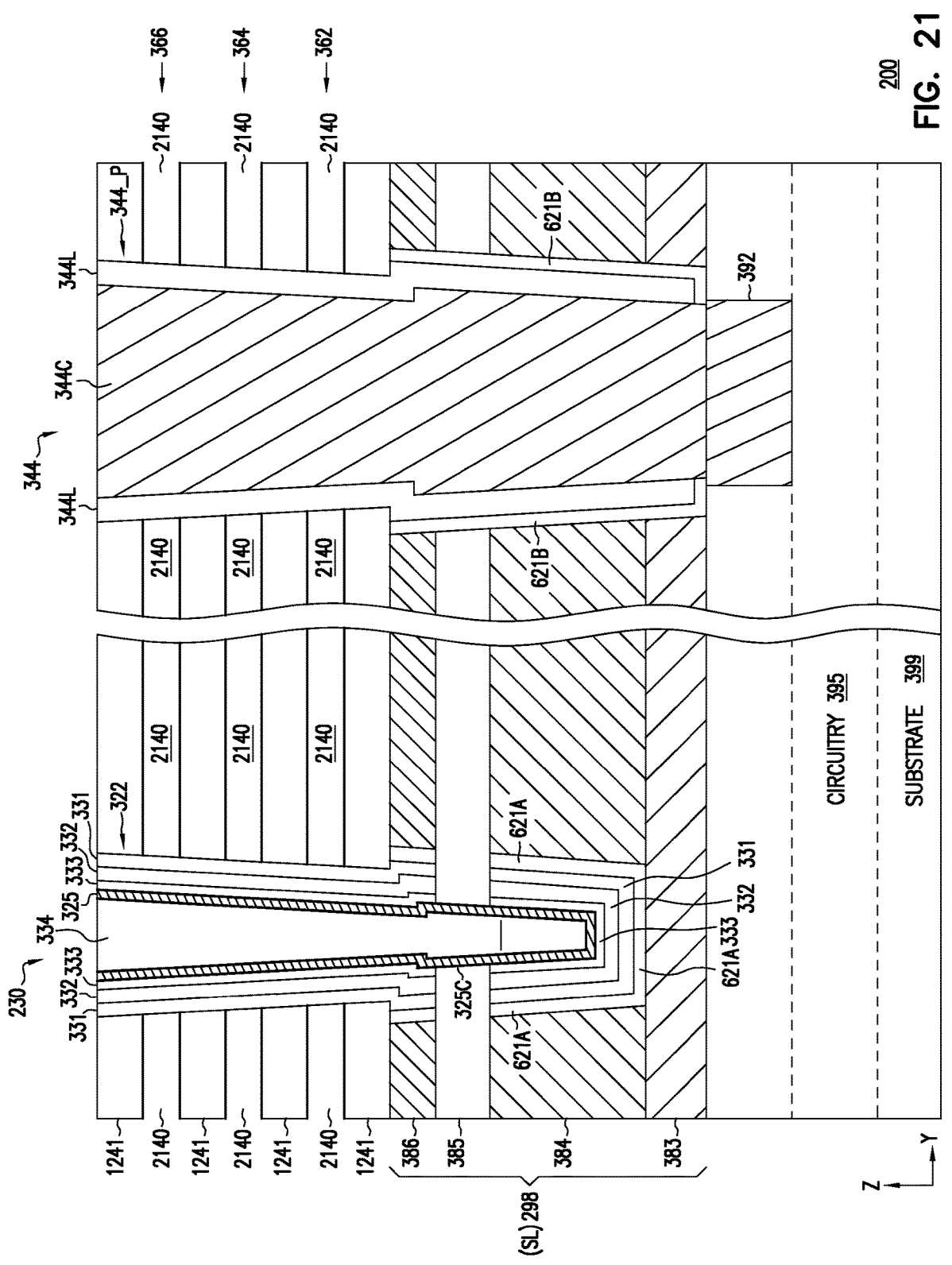

FIG. 21 shows memory device 200 after material (e.g., silicon nitride) 1240 are removed (e.g., exhumed) from locations 2140. Locations 2140 are voids (e.g., empty spaces) that were occupied by materials 1240 (FIG. 20).

Figure 22A:
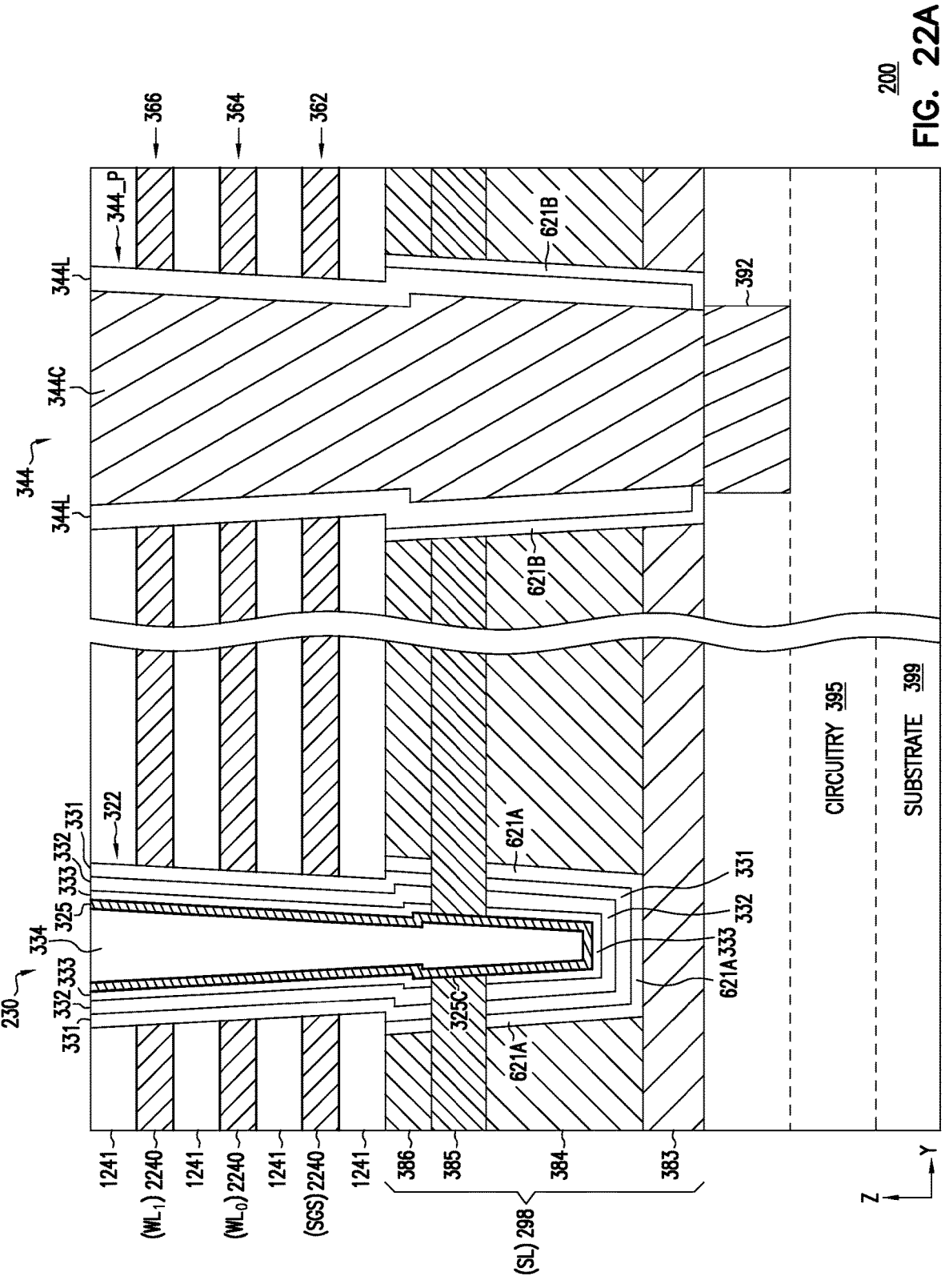

FIG. 22A shows memory device 200 after material (or materials) 2240 is formed in locations 2140 (labeled in FIG. 21). Forming material 2240 can include depositing a single conductive material (e.g., tungsten or other metal) in locations 2140. Alternatively, the processes associated with FIG. 22A can include forming (e.g., depositing) multiple materials (one at a time) in locations 2140. For example, the processes in FIG. 22A can include depositing aluminum oxide on sidewalls of locations 2140, depositing titanium nitride conformal to the aluminum oxide, and then depositing tungsten (or other suitable conductive material) conformal to the titanium nitride. Thus, material 2240 can include a combination of (multiple layers of) aluminum oxide, titanium nitride, and titanium.

Material 2240 at respective tiers (e.g., at levels 362, 364, and 366) of memory device 200 can correspond to respective conductive materials on levels (e.g., tiers) 362, 364, 366 of FIG. 3C and FIG. 3D. For example, material 2240 on levels 362, 364, and 366 of FIG. 22A can correspond to conductive materials 340$_{SGS}$, 340$_0$, and 340$_1$, respectively, of FIG. 3C and FIG. 3D. Thus, as shown in FIG. 22A, control gates (associated with signals $WL_0$ and $WL_1$) and a select gate (e.g., source select gate associated with signal SGS) are formed from material 2240 on respective levels of memory device 200.

Figure 22B:
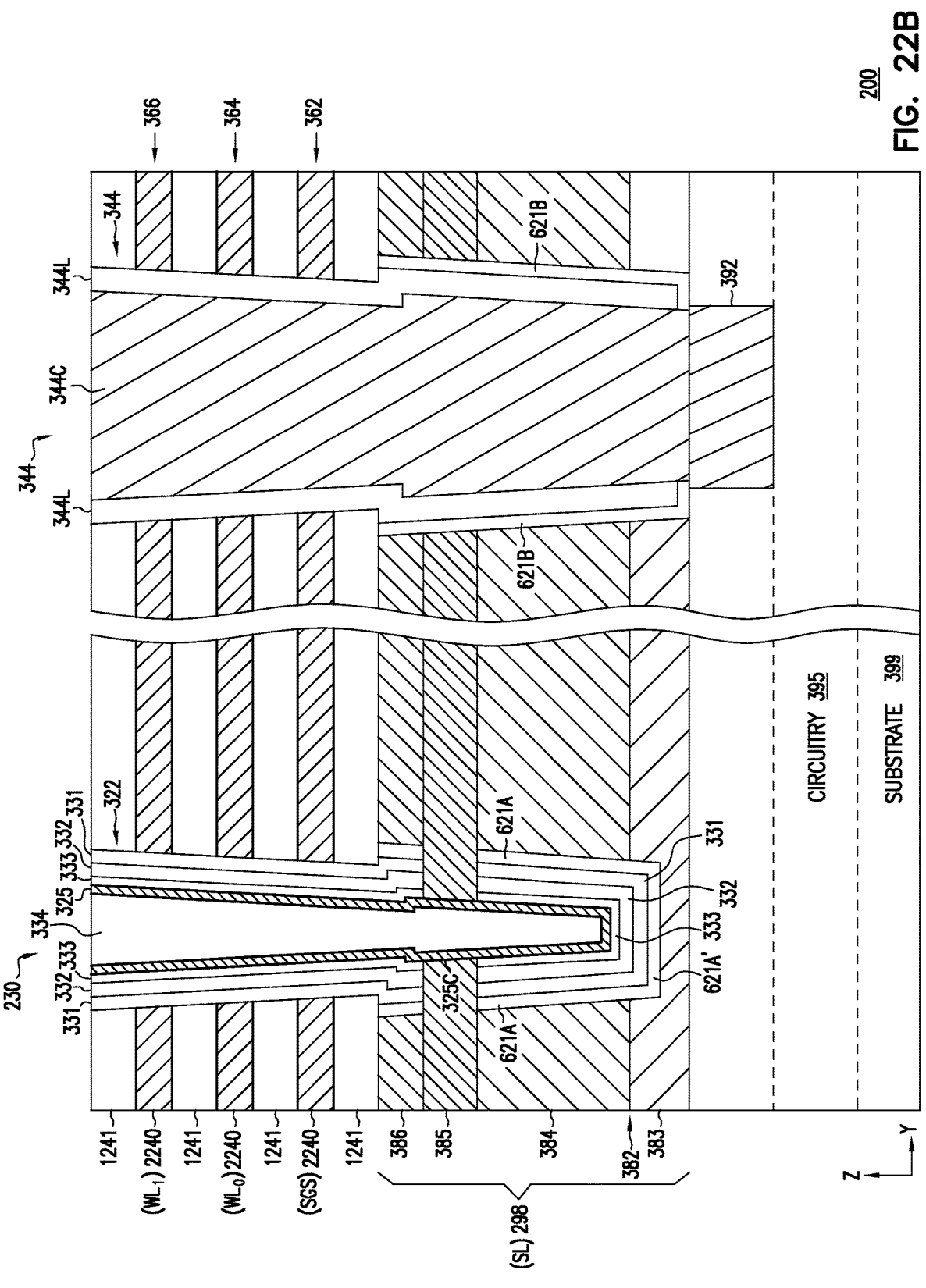

FIG. 22B shows memory device 200 that can be a variation of memory device 200 of FIG. 22A where opening 520 formed in FIG. 5A has bottom 520B' below a level (in the Z-direction) that corresponds to the level of interface 382. Thus, as shown in FIG. 22B (also the same view is shown in FIG. 3M), bottom portion 621A' of dielectric liner 621A can be below the level that corresponds to the level of interface 382.

Figure 22C:
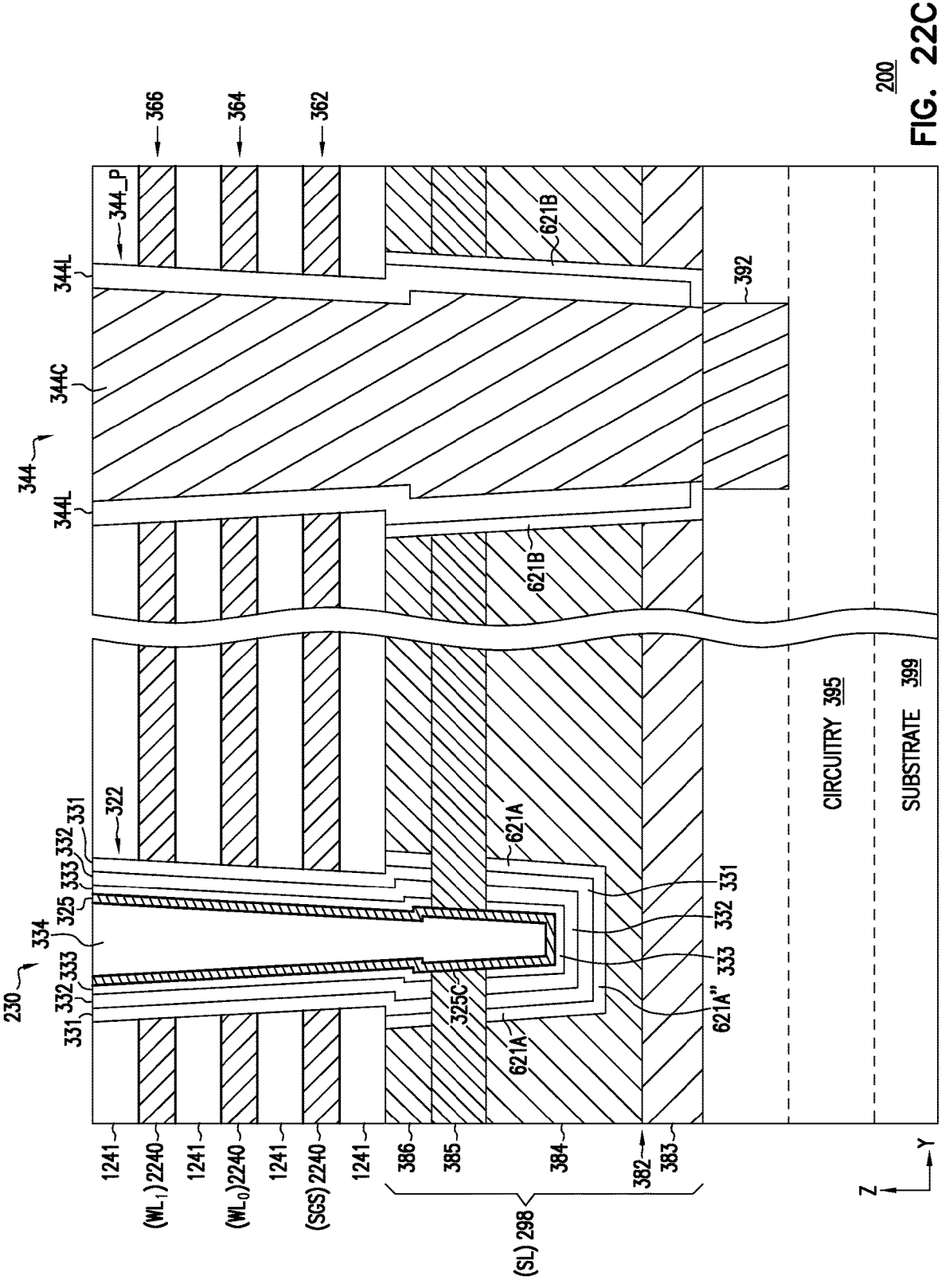

FIG. 22C shows memory device 200 that can be a variation of memory device 200 of FIG. 22A where opening 520 formed in FIG. 5A has bottom 520B" above a level (in the Z-direction) that corresponds to the level of interface 382. Thus, as shown in FIG. 22C (also the same view is shown in FIG. 3N), bottom portion 621A" of dielectric liner 621A can be above the level that corresponds to the level of interface 382.

The processes of forming memory device 200 as described above with reference to FIG. 4A through FIG. 22C can include additional processes after the processes associated with FIG. 20A (or FIG. 20B or FIG. 22C) are performed. For example, additional processes can include forming drain select gates and data lines and other elements and interconnections to complete the processes of forming memory device 200. Some of the processes described above with reference to FIG. 4A through FIG. 22C may be performed in an order different from the order described above.

The processes described above with reference to FIG. 4A through FIG. 22C provide improvements and benefits in memory device 200 in comparison to some conventional processes. For example, some conventional processes may use different process steps (at different times) to form part of memory cell pillars and contact pillars. Such conventional processes may require formation of a sacrificial metal plug in an opening at which part of a memory cell pillar is subsequently formed. The metal sacrificial plug is used prevent damage to the underlying materials at the location of the opening during part of forming a memory cell pillar. The sacrificial metal plug is subsequently removed when the memory cell pillar is formed. However, the process of removing such a metal plug can impact the profile (e.g., etch profile) of the structure of the memory cell pillar. Further, such conventional processes may increase manufacturing cost.

In the processes described above with reference to FIG. 4A through FIG. 22C, some of the process steps can be merged (e.g., combined) to improve the structure of part of the memory device (e.g., memory device 200 or 200'). For example, the described processes (e.g., FIG. 4A through FIG. 11) can concurrently form openings 520 and 545 (FIG. 5A) in the conductive structure of source 298 and concurrently form some structures at the locations of openings 520 and 545. As described above, the locations of openings 520 and 545 are where pillar (memory cell pillar) 322 and pillar (contact pillar) 344_P, respectively, are subsequently formed. Forming the memory device using the described processes can improve part of the structure of the memory device including the etch profile and the structure of pillar 322. Further, described processes can reduce manufacturing cost.

Figure 23:
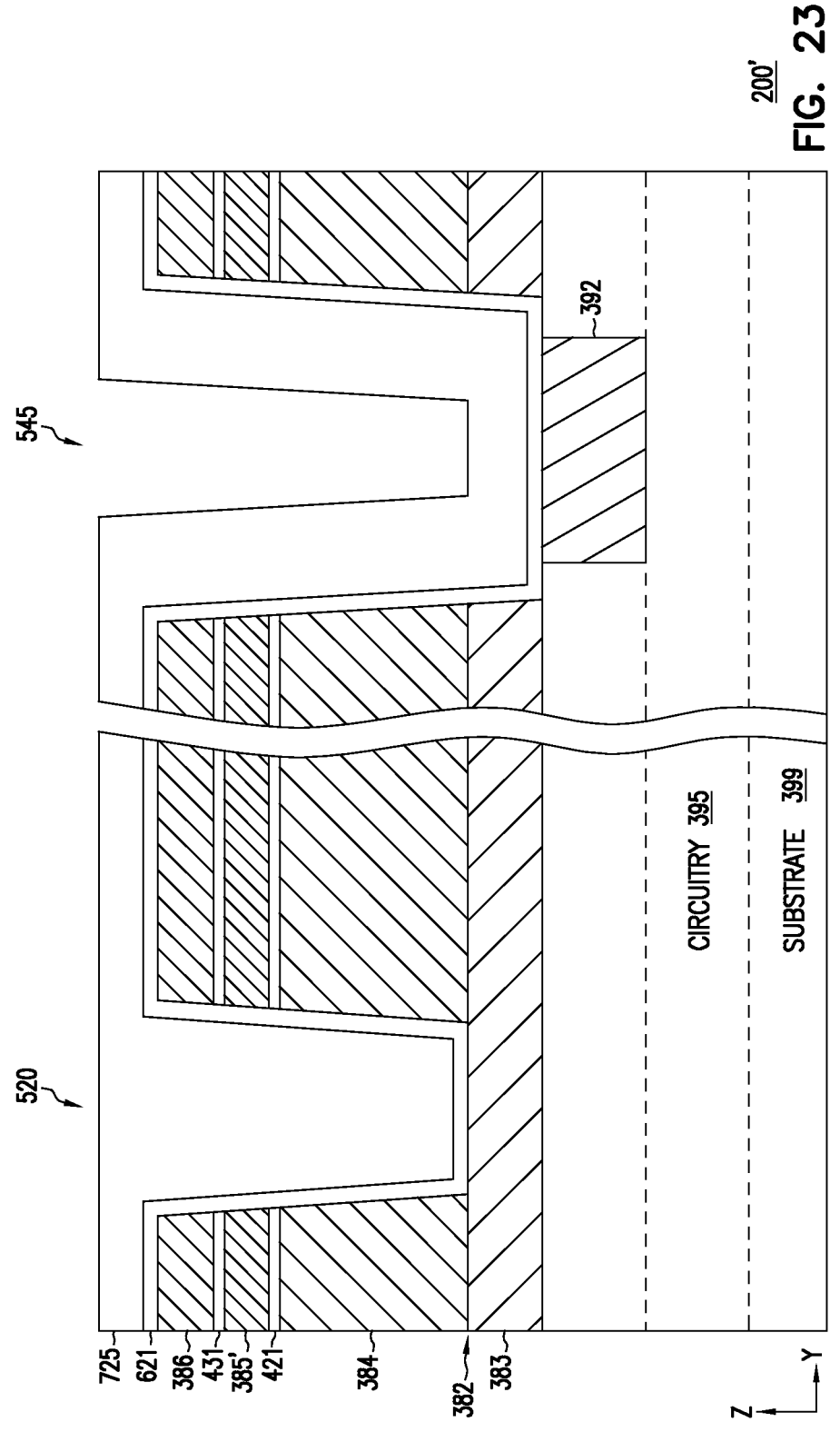
FIG. 23 through FIG. 30 show different views of structures during some alternative processes of forming another memory device of FIG. 2 through FIG. 3I, according to some embodiments described herein.

FIG. 23 shows different views of elements during processes of forming a memory device 200', according to some embodiments described herein. FIG. 23 shows memory device 200' after some elements of memory device 200' are formed. These elements can be the same as the elements of memory device 200 shown in FIG. 7. Thus, the processes of forming memory device 200 from FIG. 4A through FIG. 7 can be used to form the elements of memory device 200' shown in FIG. 23. For simplicity, such processes and elements are not repeated. For example, FIG. 23 shows memory device 200' after material 725 is formed in openings 520 and 545. FIG. 23 shows dielectric liner 621 having a bottom portion at the level of interface 382 (e.g., at an interface between conductive materials 383 and 384). However, as shown in FIG. 6, dielectric liner 621 can have a bottom portion (e.g., bottom portion 621A' or 621A") above or below the level of interface 382.

Figure 24:
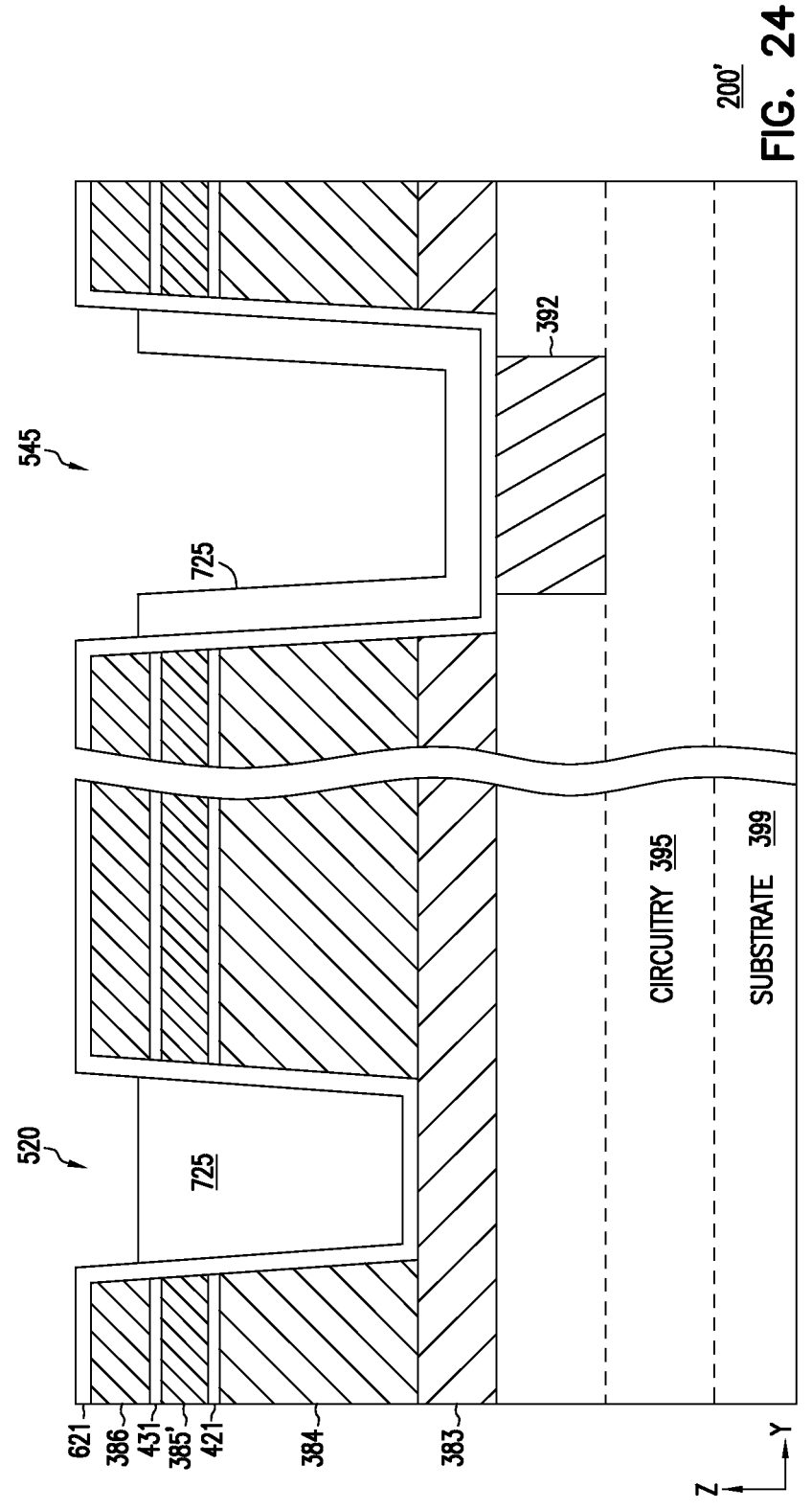

FIG. 24 shows memory device 200' after a portion (e.g., top portion) of material 725 is removed from (recessed at) openings 520 and 545.

Figure 25:
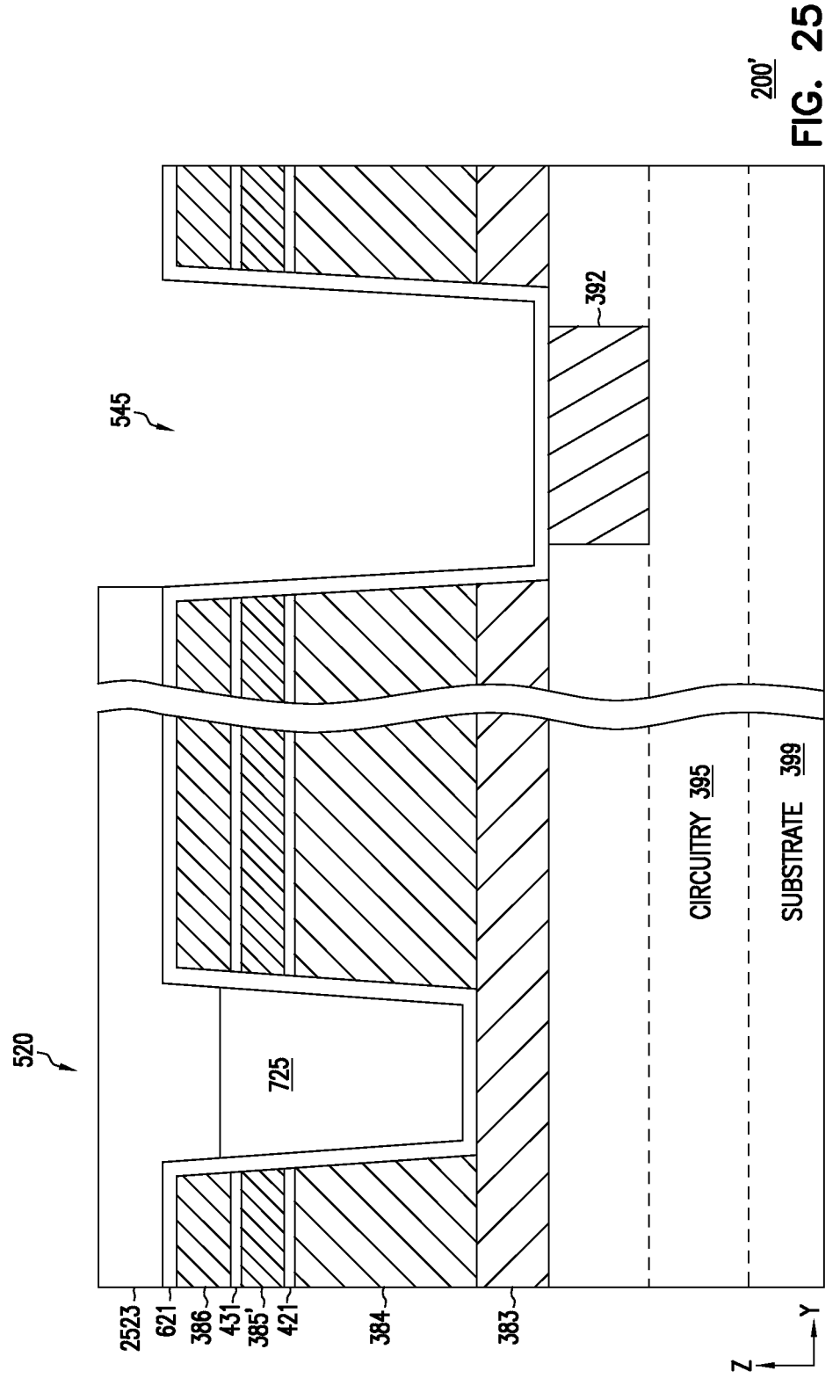

FIG. 25 shows memory device 200' after a portion of material 725 is removed from (recessed at) opening 545. A photoresist 2523 can be used in the processes of FIG. 25. Photoresist 2523 can have a pattern such that material 725 in opening 520 remains in opening 520 (not removed from opening 520) while a portion of material 725 removed from opening 545.

Figure 26:
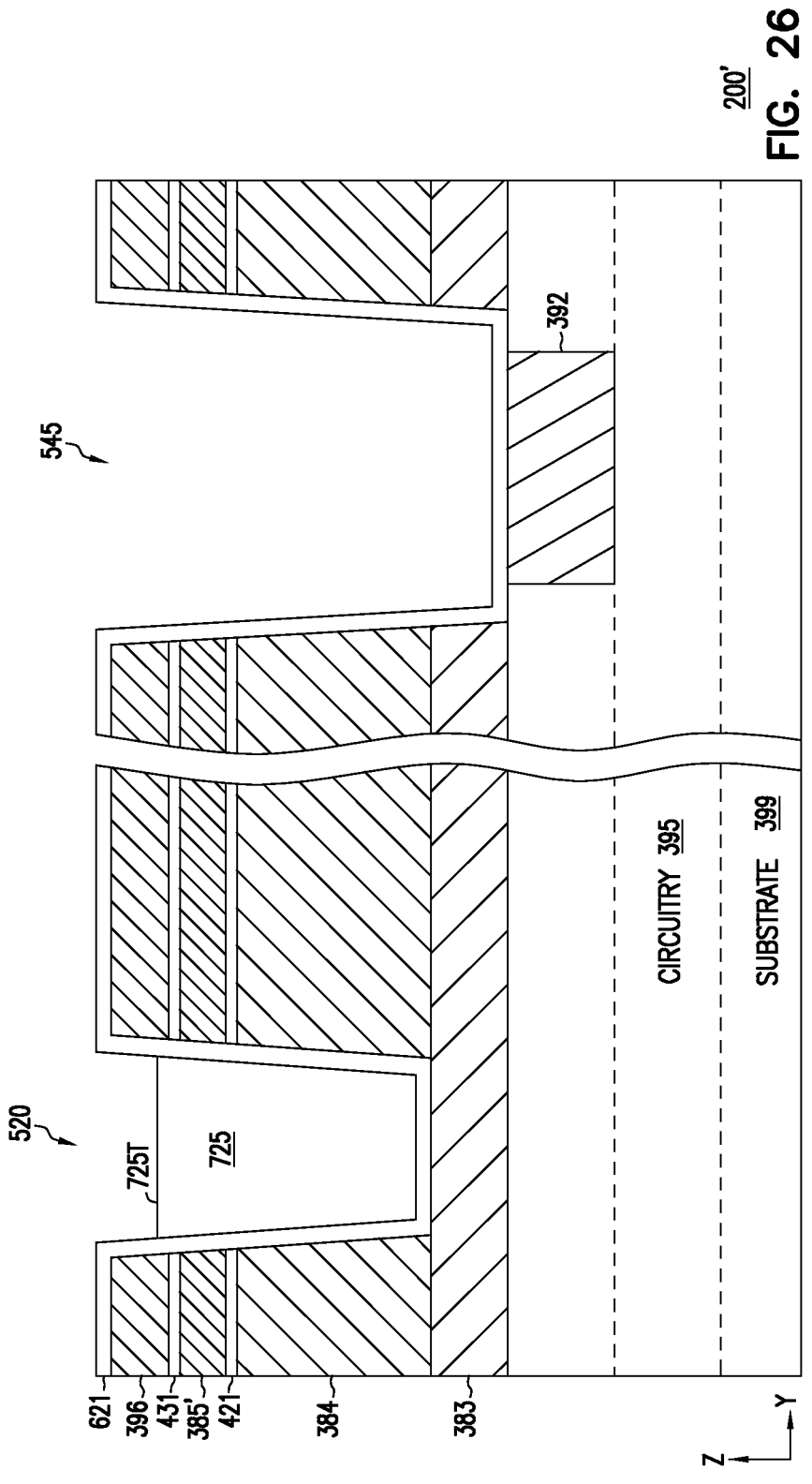

FIG. 26 shows memory device 200' after photoresist 2523 (FIG. 25) is removed and after a portion of material 725 is removed from (recessed at) opening 520. FIG. 26 shows a remaining portion of material 725 in opening 520 that has surface 725T below a top portion of dielectric liner 621. Alternatively, a remaining portion of material 725 can have a surface like surface 725T' of material 725 in FIG. 9.

Figure 27:
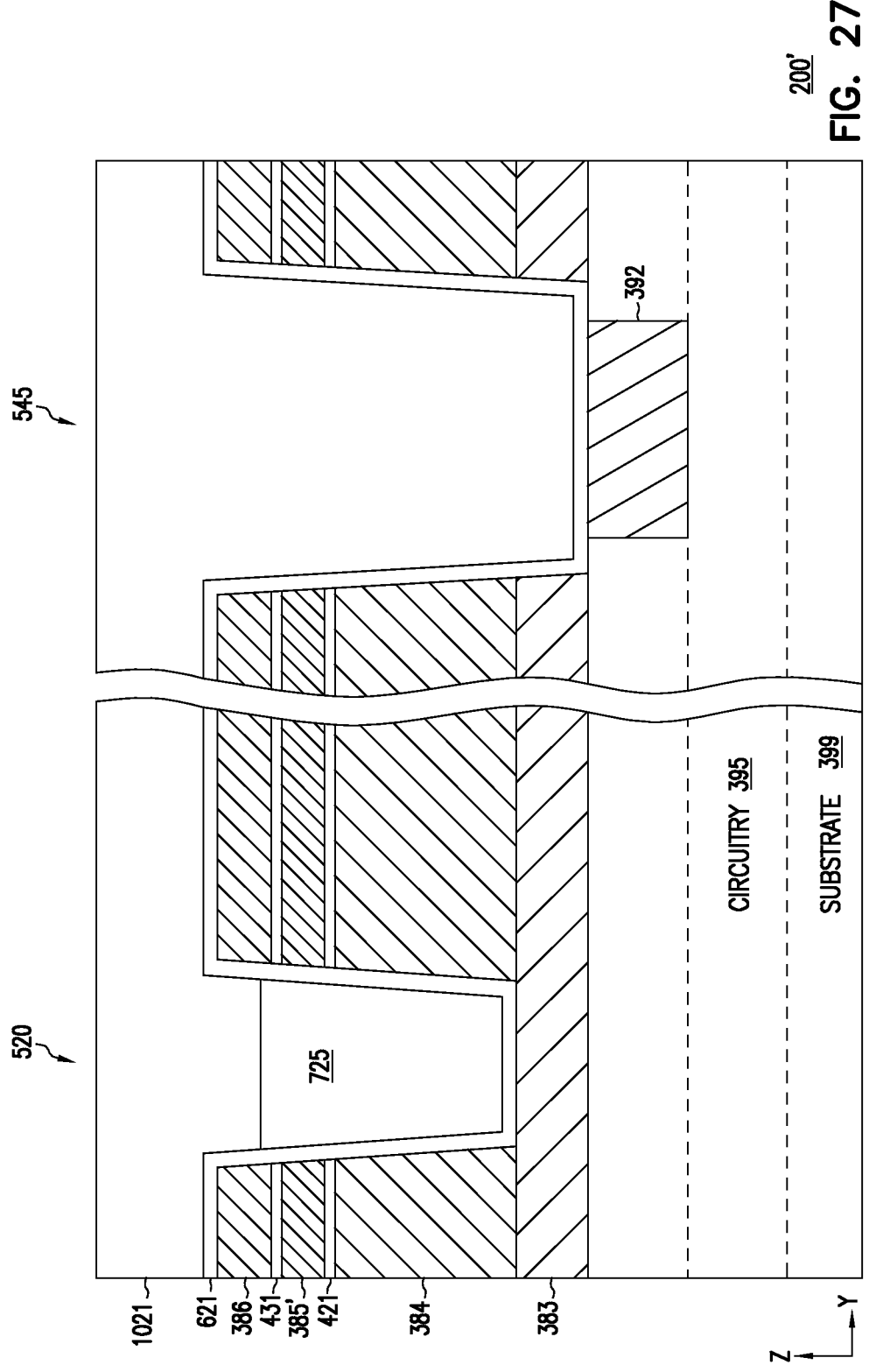

FIG. 27 shows memory device 200' after material 1021 is formed in openings 520 and 545. The processes in FIG. 27 can be similar to the processes in FIG. 10.

Figure 28:
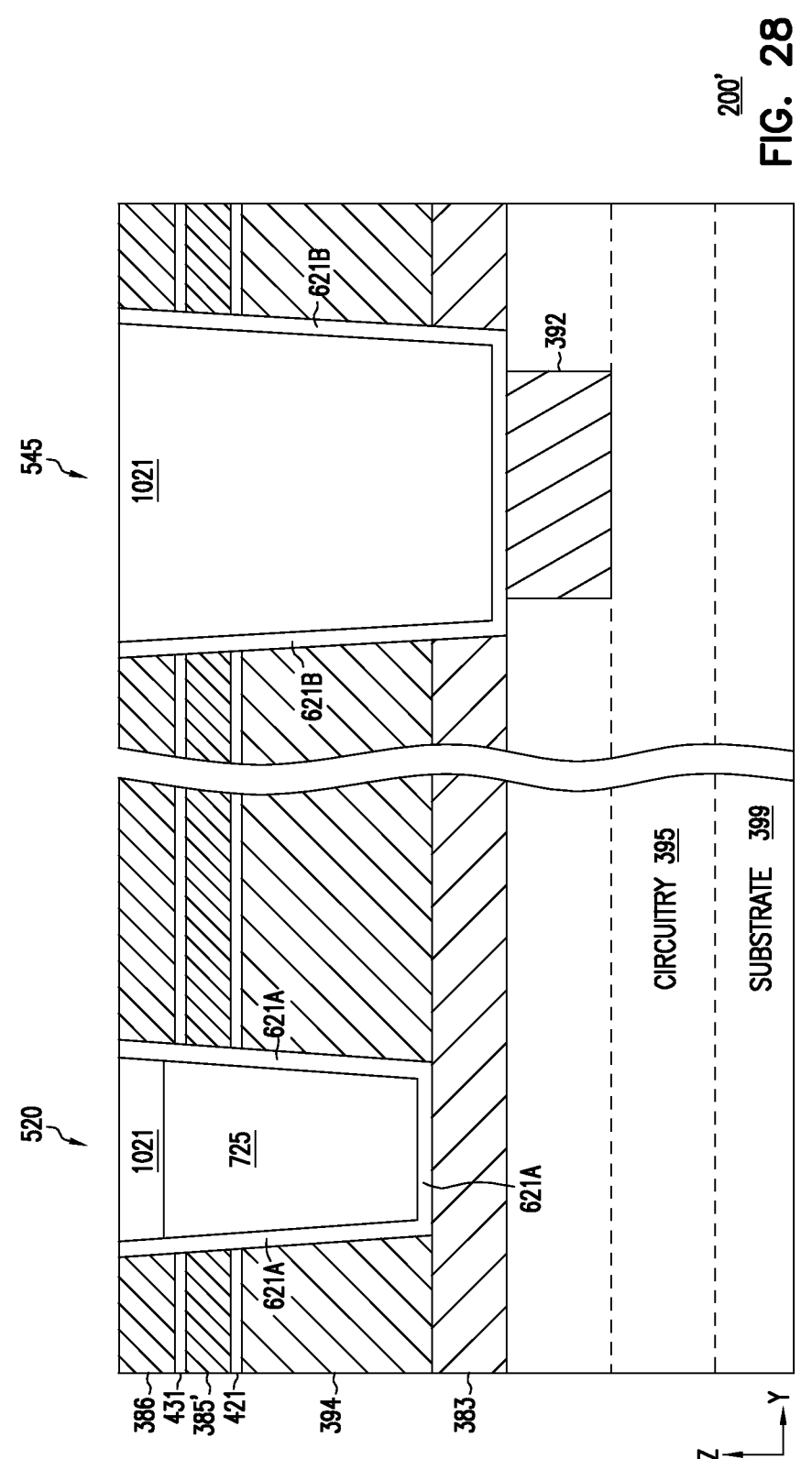

FIG. 28 shows memory device 200' after a portion (e.g., top portion) of material 1021 and a portion of dielectric liner 621 are removed. Dielectric liners 621A and 621B in openings 520 and 545, respectively, are remaining portions of dielectric liner 621 of FIG. 27. The processes in FIG. 28 can be similar to the processes in FIG. 11.

Figure 29:
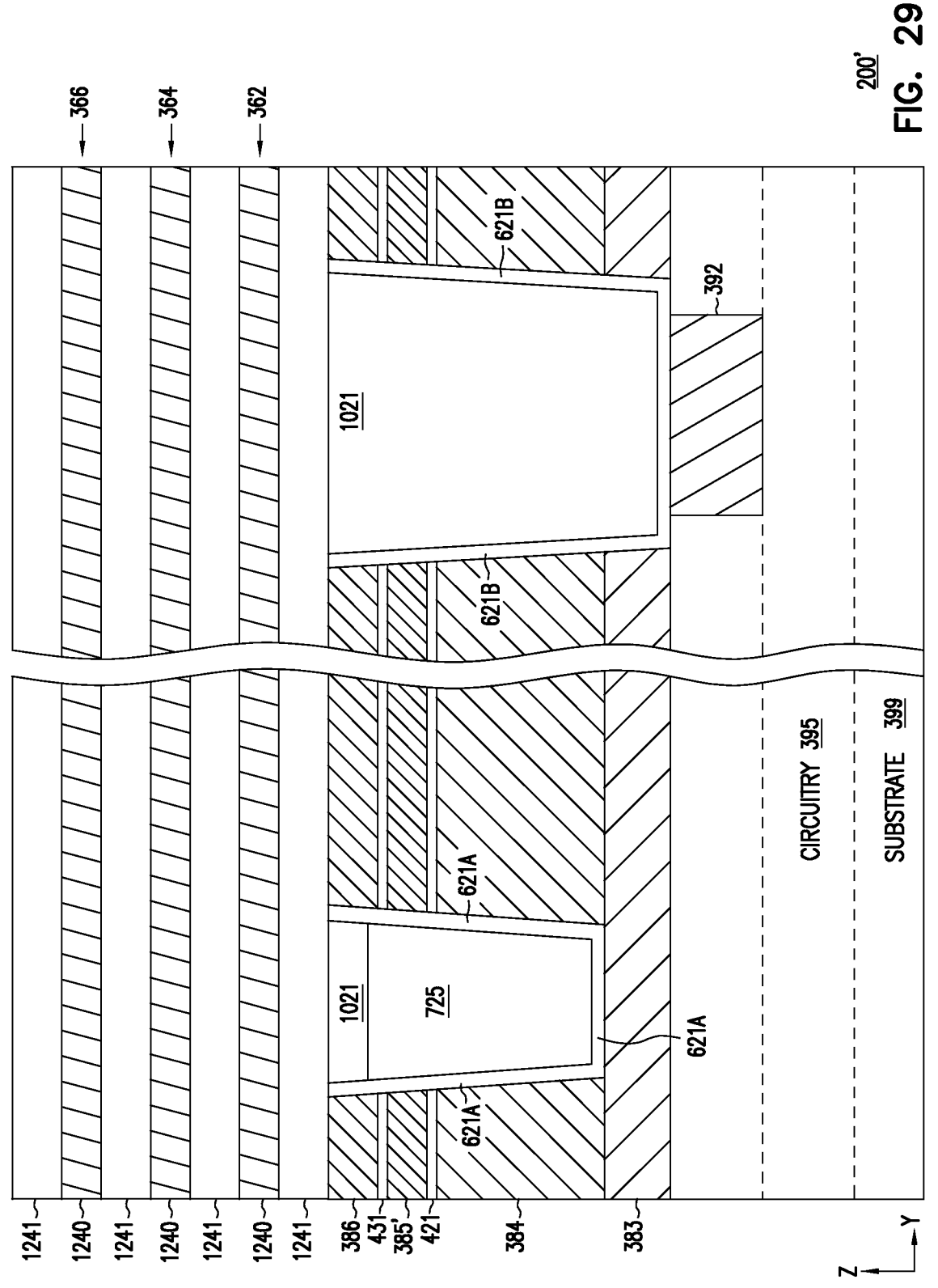

FIG. 29 shows memory device 200 after tiers of materials 1240 and 1241 are formed. The processes in FIG. 29 can be similar to the processes in FIG. 12.

Figure 30:
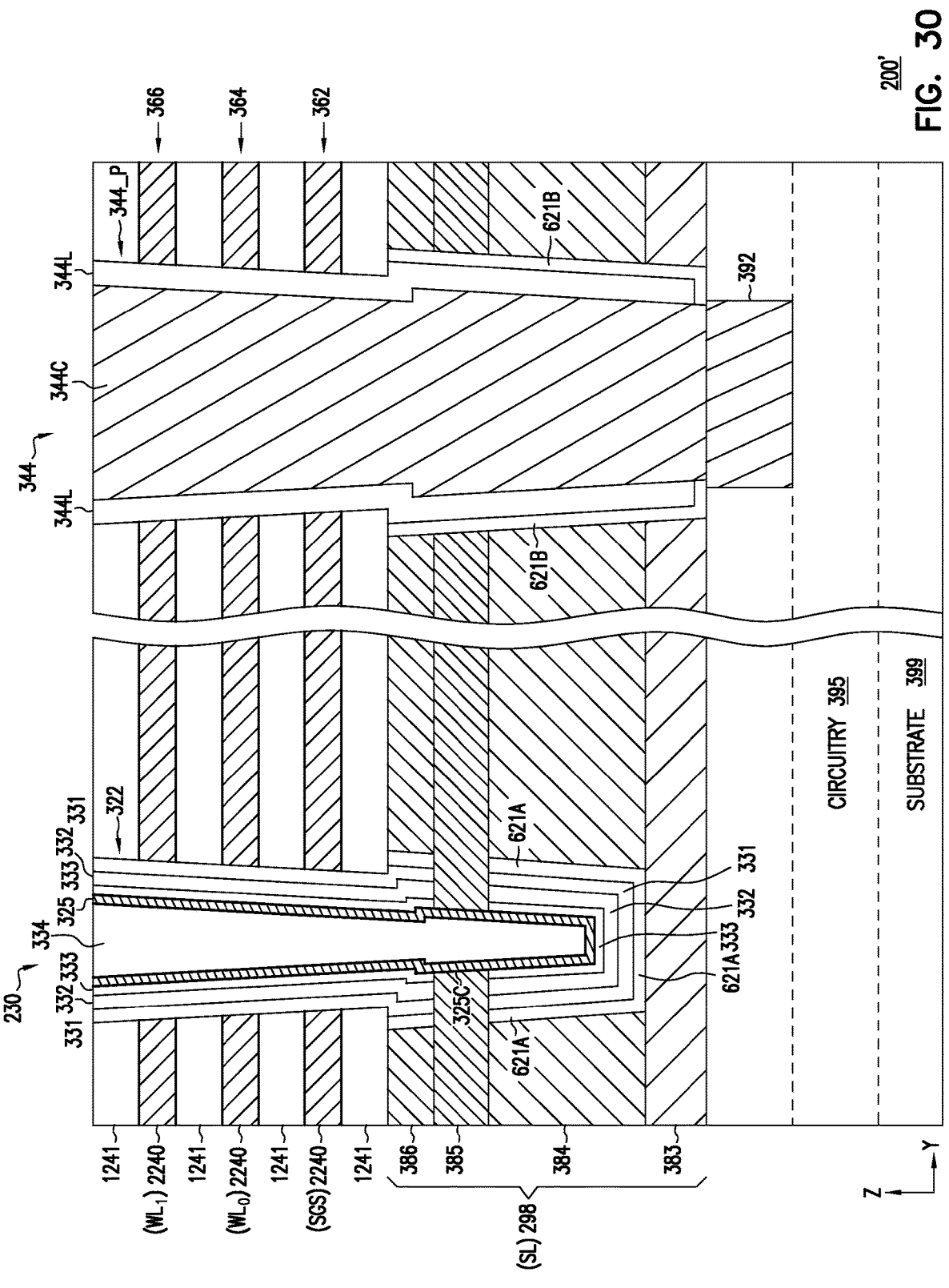

FIG. 30 shows memory device 200' after pillar 322 of memory cell string 230, pillar 344_P of contact structure 344, source 298, and levels of conductive materials 2240 are formed, using processes similar to the processes described above with reference to FIG. 13 through FIG. 22C. The processes of forming memory device 200' as described above with reference to FIG. 23 through FIG. 30 can include additional processes to complete memory device 200' after the processes associated with FIG. 30 are performed.

The illustrations of apparatuses (e.g., memory devices 100, 200, and 200') and methods (e.g., methods of forming memory devices 200 and 200') are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, and 200') or a system (e.g., an electronic item that can include any of memory devices 100, 200, and 200').

Any of the components described above with reference to FIG. 1 through FIG. 28 can be implemented in a number of ways, including simulation via software. Thus, apparatuses (e.g., memory devices 100, 200, and 200'), or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, and 200') described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 30 include apparatuses and methods of forming the apparatuses. One of the methods include forming levels of materials one over another; forming a first opening and a second opening in the levels of materials; forming at least one dielectric material in the first and second openings; forming tiers of materials over the levels of materials and over the dielectric material in the first and second openings; forming a first pillar of a memory cell string, the first pillar extending through the tiers of materials and extending partially into a location of the first opening; and forming a second pillar of a contact structure, the second pillar extending through the tiers of materials and through a location of the second opening. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B, and C" means A only; B only; or C only. Item A can include a single element or multiple elements. Item B can include a single element or multiple elements. Item C can include a single element or multiple elements.

In the detailed description and the claims, the terms "first," "second," and "third," etc. are used merely as labels, and are not intended to impose numerical requirements on their objects.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A method comprising:
forming levels of materials one over another;
concurrently forming a first opening and a second opening in the levels of materials;
forming a dielectric liner in each of the first and second openings;
forming at least one material over the dielectric liner in each of the first and second openings;
forming tiers of materials over the levels of materials and over the at least one material in the first and second openings;
forming an additional opening in the tiers of materials and over the first opening such that a portion of the at least one material in the first opening is exposed at the additional opening;
removing at least a portion of the at least one material from the first opening;
forming a first pillar of a memory cell string, the first pillar extending through the tiers of materials and extending partially into a location of the first opening; and
forming a second pillar of a contact structure, the second pillar extending through the tiers of materials and through a location of the second opening.

2. The method of claim 1, wherein at least one material over the dielectric liner includes a dielectric material contacting the dielectric liner.

3. The method of claim 1, wherein the first and second openings have different depths in the level of materials.

4. The method of claim 1, wherein the levels of materials include:
a level of conductive material;
a first level of polysilicon over the level of conductive material;
a second level of polysilicon over the first level of polysilicon;
a third level of polysilicon over the second level of polysilicon, wherein the first opening is formed such that a portion of the level of conductive material is exposed at the first opening.

5. The method of claim 4, wherein forming the first opening includes removing a portion of the level of conductive material.

6. The method of claim 1, further comprising:
removing a portion of the levels of materials, such that a portion of the dielectric liner in the first opening is exposed at a void where the portion of the levels of materials is removed;
removing the portion of the dielectric liner exposed at the void, such that part of a conductive channel portion of the pillar is exposed at the void; and
forming a conductive material in the void such that the conductive material is in electrical contact with the conductive channel portion of the pillar and in electrical contact with a remaining portion of the levels of materials.

7. The method of claim 6, wherein the material formed in the void includes polysilicon.

8. The method of claim 1, wherein the tiers of materials include levels of silicon dioxide to provide separation between control gates for respective memory cells of the memory cell string.

9. The method of claim 8, wherein the tiers of materials include levels of silicon nitride interleaved with the levels of silicon dioxide, and the method further comprises:
removing the levels of silicon nitride to form voids at respective locations of the levels of silicon nitride that were removed; and
forming control gates in the voids for memory cells of the memory cell string.

10. A method comprising:
forming levels of materials one over another;
forming a first opening and a second opening in the levels of materials;
forming a dielectric liner in each of the first and second openings;
forming a first material in the first and second openings after forming the dielectric liner;
removing the first material in the second opening while keeping the first material in the first opening;
forming a second material in the second opening;
forming tiers of materials over the levels of materials and over materials in the first and second openings;
forming an additional opening in the tiers of materials to expose the first material in the first opening through the additional opening;
removing the first material from the first opening;
forming a pillar of a memory cell string, the pillar extending through the tiers of material at the additional opening and extending into the first opening;
removing a portion of the levels of materials such that a portion of the dielectric liner in the first opening is exposed at a void where the portion of the levels of materials was removed;
removing the portion of the dielectric liner exposed at the void, such that part of a conductive channel portion of the pillar is exposed at the void; and
forming a conductive material in the void such that the conductive material is in electrical contact with the conductive channel portion of the pillar and in electrical contact with a remaining portion of the levels of materials.

11. The method of claim 10, wherein the dielectric liner and the first material have different etch rates.

12. The method of claim 10, further comprising:

removing a portion of the first material in the first opening after removing the first material in the second opening and before forming the second material in the second opening, wherein forming the second material in the second opening also forms the second material in the first opening over a remaining portion of the first material in the first opening.

13. The method of claim 10, wherein the dielectric liner includes silicon dioxide and the first material is different from silicon dioxide.

14. The method of claim 10, wherein the levels of materials include:

a level of conductive material;

a first level of polysilicon over the level of conductive material;

a second level of polysilicon over the first level of polysilicon; and a third level of polysilicon over the second level of polysilicon, wherein removing the portion of the levels of materials includes removing the second level of polysilicon to expose a portion of the first level of polysilicon and a portion of the third level of polysilicon at the void, wherein the material formed in the void is in electrical contact with the portion of the first level of polysilicon and the portion of the third level of polysilicon.

15. The method of claim 10, further comprising:

forming a conductive pillar extending through the tiers of materials and the second opening.

* * * * *